(12) United States Patent
Kawasaki

(10) Patent No.: US 9,608,683 B2
(45) Date of Patent: Mar. 28, 2017

(54) MILLIMETER WAVE TRANSMISSION DEVICE, MILLIMETER WAVE TRANSMISSION METHOD, AND MILLIMETER WAVE TRANSMISSION SYSTEM

(71) Applicant: Sony Corporation, Tokyo (JP)

(72) Inventor: Kenichi Kawasaki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 267 days.

(21) Appl. No.: 14/309,336

(22) Filed: Jun. 19, 2014

(65) Prior Publication Data

US 2016/0197630 A1    Jul. 7, 2016

Related U.S. Application Data

(63) Continuation of application No. 13/062,091, filed as application No. PCT/JP2009/066511 on Sep. 24, 2009, now abandoned.

(30) Foreign Application Priority Data

Sep. 25, 2008 (JP) ................. 2008-246509
Sep. 16, 2009 (JP) ................. 2009-214046

(51) Int. Cl.
*H01P 3/12* (2006.01)
*H04B 1/38* (2015.01)
*H04B 3/52* (2006.01)

(52) U.S. Cl.
CPC .............. *H04B 1/38* (2013.01); *H01P 3/121* (2013.01); *H04B 3/52* (2013.01); *H01L 2224/16227* (2013.01)

(58) Field of Classification Search
CPC ................. H01P 3/121; H04B 3/52
(Continued)

(56) References Cited

U.S. PATENT DOCUMENTS 6,380,825 B1   4/2002   Takenoshita et al.
6,868,258 B2   3/2005   Hayata et al.
(Continued)

FOREIGN PATENT DOCUMENTS

JP    10-150380    6/1998
JP    10-190320    7/1998
(Continued)

OTHER PUBLICATIONS

Japanese Office Action issued in connection with related Japanese Patent Application No. 2009-214046 dated Dec. 3, 2013.
(Continued)

*Primary Examiner* — David Bilodeau
(74) *Attorney, Agent, or Firm* — Dentons US LLP

(57) ABSTRACT

The device includes: a signal generating unit generating a millimeter wave signal by signal processing of an input signal; a coupling circuit transmitting an electromagnetic wave from the millimeter wave signal generated by the signal generating unit to one end of a circuit board; a coupling circuit receiving the electromagnetic wave from the millimeter wave signal from the other end of the circuit board; and a signal generating unit that generates an output signal by signal processing of the millimeter wave signal from the electromagnetic wave received by the coupling circuit. Preferably, the circuit board is constituted by a dielectric material whose the dielectric loss tangent is relatively large, and a transmission line functioning as a millimeter wave transmission path is constituted within this circuit board. With this construction, extremely high-speed signals can be transmitted through a circuit board having a prescribed dielectric constant representing a large loss.

19 Claims, 32 Drawing Sheets

(58) Field of Classification Search
USPC ............................... 455/73, 81, 178.1, 552.1
See application file for complete search history.

(56) References Cited

U.S. PATENT DOCUMENTS

| | | |
|---|---|---|
| 6,973,328 B1 | 12/2005 | Suematsu |
| 7,002,511 B1 | 2/2006 | Ammar et al. |
| 7,630,588 B2 | 12/2009 | Ouchi |
| 7,697,574 B2 | 4/2010 | Suematsu et al. |
| 2002/0140532 A1* | 10/2002 | Koriyama ............... H01P 1/042 |
| | | 333/239 |
| 2003/0027530 A1 | 2/2003 | Levitt et al. |
| 2006/0164188 A1 | 7/2006 | Yamada |
| 2009/0137317 A1 | 5/2009 | Rofougaran |
| 2011/0018657 A1 | 1/2011 | Cheng et al. |
| 2011/0038282 A1 | 2/2011 | Mihota et al. |
| 2011/0158344 A1 | 6/2011 | Kawamura et al. |

FOREIGN PATENT DOCUMENTS

| | | |
|---|---|---|
| JP | HEI 10-215104 | 8/1998 |
| JP | 11-097913 | 4/1999 |
| JP | HEI 11-340370 | 12/1999 |
| JP | 2000-077912 | 3/2000 |
| JP | 2000-101301 | 4/2000 |
| JP | 2000-147087 | 5/2000 |
| JP | 2001-099911 | 4/2001 |
| JP | 2001-127732 | 5/2001 |
| JP | 2002-330040 | 11/2002 |
| JP | 2004-104816 | 4/2004 |
| JP | 2005-020415 | 1/2005 |
| JP | 2005-051331 | 2/2005 |
| JP | 2005-130406 | 5/2005 |
| JP | 2005-244362 | 9/2005 |
| JP | 2006-287713 | 10/2006 |
| JP | 2006-340317 | 12/2006 |

OTHER PUBLICATIONS

Japanese Office Action issued in connection with related Japanese Patent Application No. 2009-214046 dated Aug. 20, 2013.
Supplementary European Search Report dated Aug. 2, 2012 issued in connection with counterpart EP Application No. 09816155.
International Search Report dated Jan. 19, 2010.
Korean Office Examination Report issued in connection with related Korean Patent Application No. KR 10-2011-7005671 dated Oct. 15, 2015 with English translation.
Japanese Office Examination Report issued in connection with related Japanese Patent Application No. JP 2014-037882 dated Jan. 20, 2015.
Korean Patent Office Action corresponding to Korean Serial No. 10-2011-7005671 dated Apr. 19, 2016.

* cited by examiner

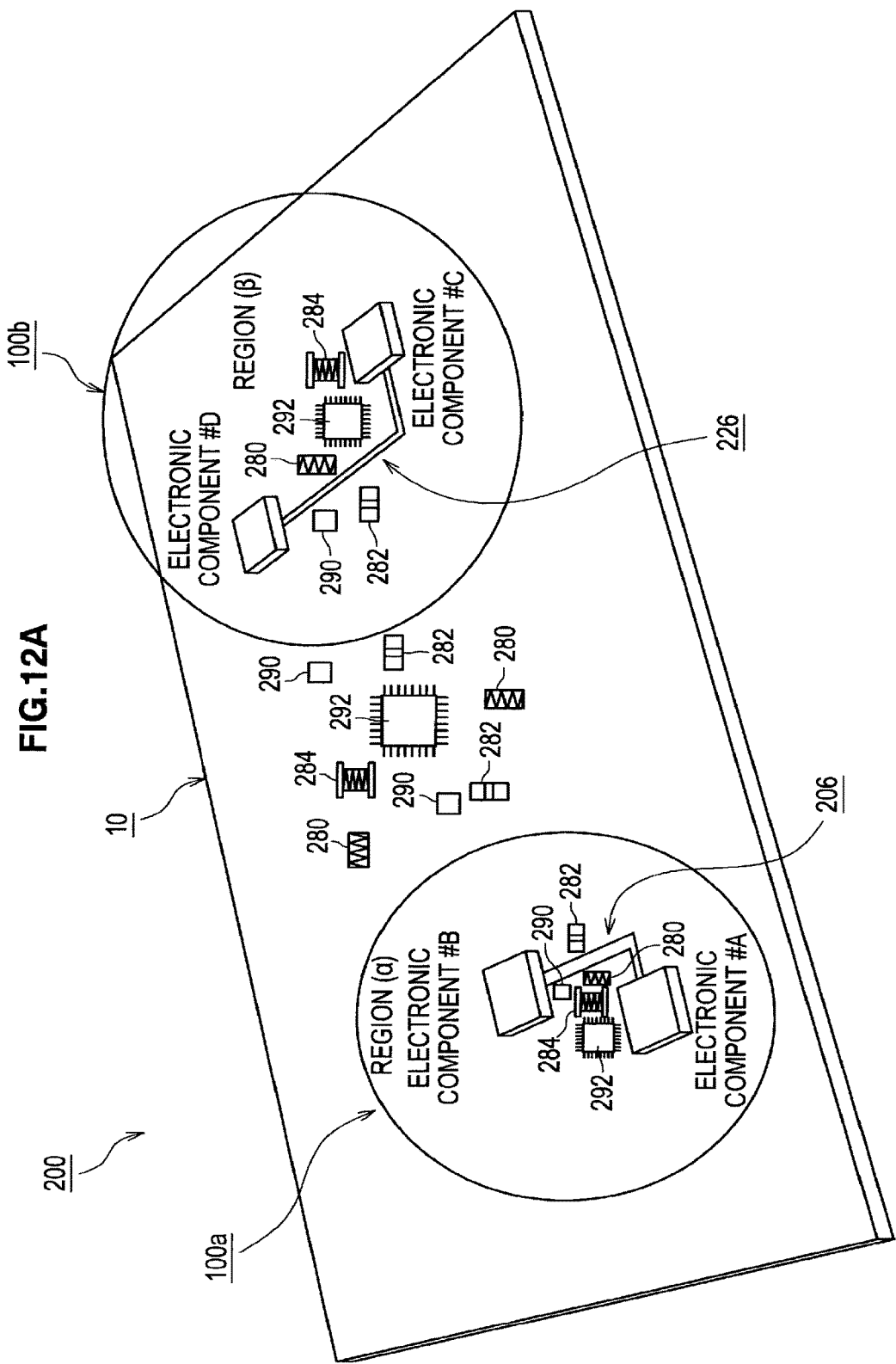

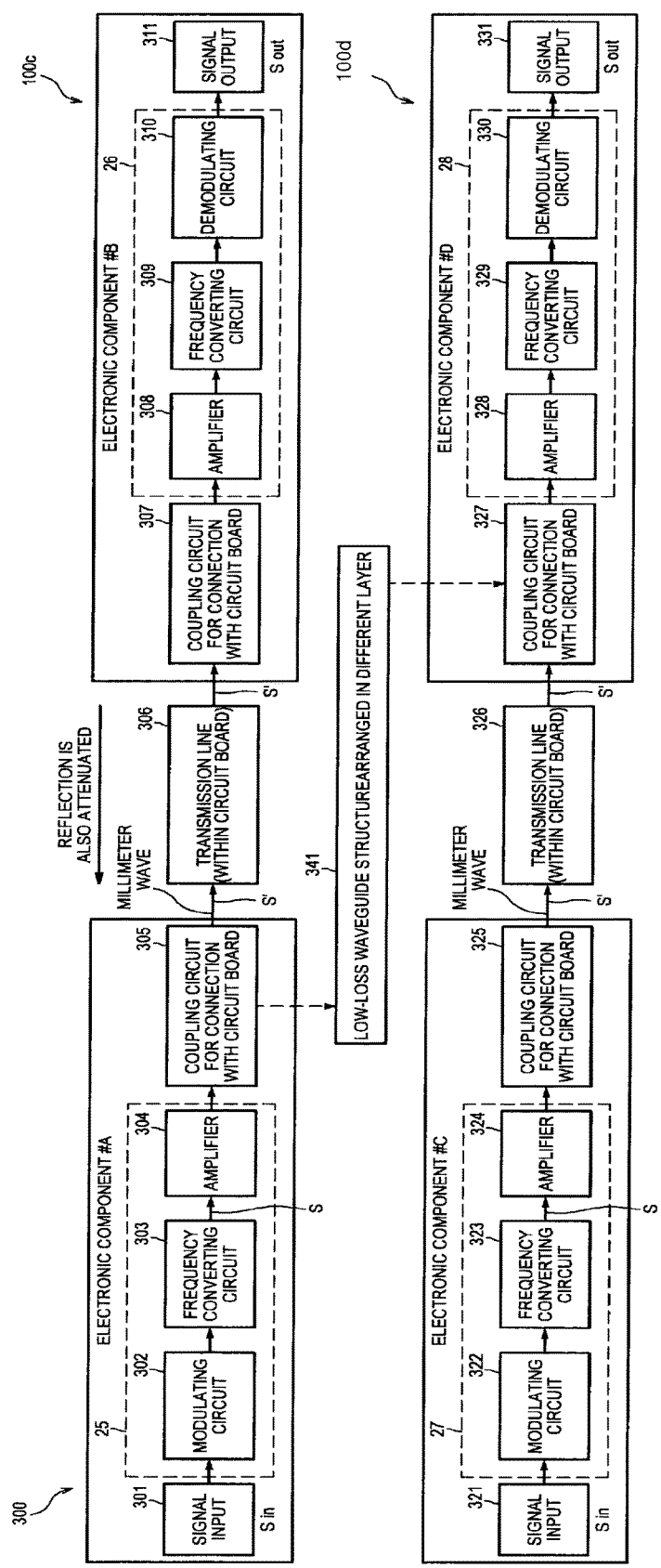

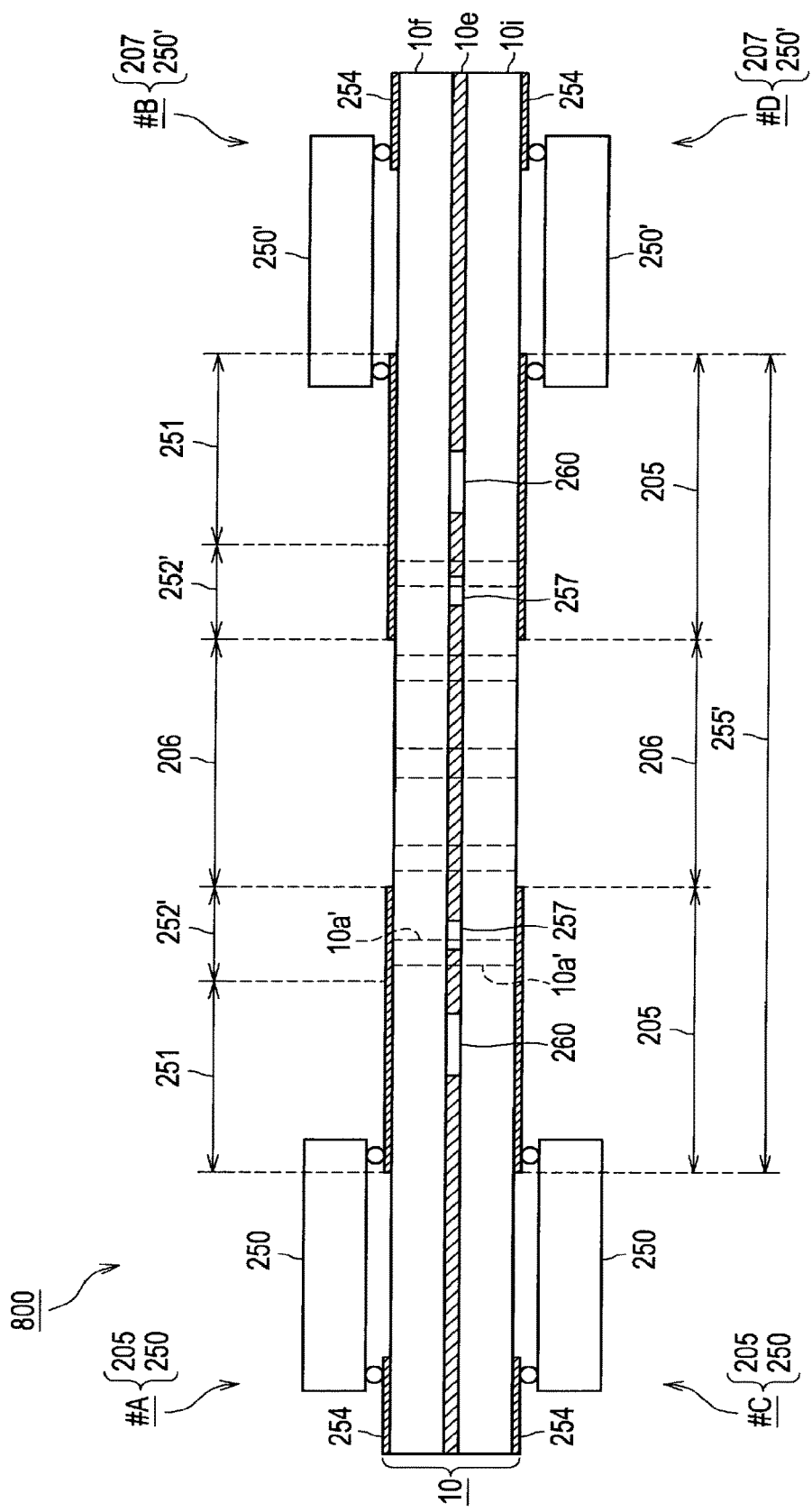

ical Field

The present invention relates to a millimeter wave transmission device, a millimeter wave transmission method, and a millimeter wave transmission system.

BACKGROUND ART

Regarding a technique for transmitting/receiving a millimeter wave signal, Patent Literature 1 discloses a dielectric waveguide line. This dielectric waveguide line includes a pair of main conductor layers, two lines of via hole groups, and sub-conductor layers, wherein the main conductor layers are formed in parallel with a dielectric interposed between them. The via hole groups are formed at an interval equal to or shorter than a cutoff wavelength in the direction of signal transmission to electrically connect the main conductor layers. The sub-conductor layer is connected to the via hole groups and formed in parallel with the main conductor layers.

When an electric signal is transmitted by a waveguide region enclosed by the main conductor layers, the via hole groups, and the sub-conductor layers in the dielectric waveguide line, at least one of the main conductor layers is formed with slot holes for electromagnetically coupling with a high frequency transmission line. The high frequency transmission line is constituted by a microstrip line, and is formed at a position opposite to the slot holes. When the dielectric waveguide line is made as described above, it is easy to electromagnetically couple with another high frequency transmission line, and a signal can be transmitted. In addition, a waveguide line having stable characteristics from a microwave to a millimeter wave can be provided.

Regarding a technique for transmitting/receiving a millimeter wave signal, Patent Literature 2 discloses a wireless-type millimeter wave communication system. The millimeter wave communication system includes millimeter wave transmission means, millimeter wave reception means, and reflection means, wherein the millimeter wave transmission means includes a transmission antenna having a predetermined directivity and light emission means. The millimeter wave transmission means transmits a signal in a millimeter wave band. The millimeter wave reception means receives the millimeter wave signal from the millimeter wave transmission means. The reflection means is arranged to reflect the signal wave radiated from the millimeter wave transmission means and reflect a light, so that the reflected signal wave is incident to the millimeter wave reception means. With the above conditions, the millimeter wave transmission means is arranged with the light emission means almost in parallel with an output axis of the transmission antenna, so that the light emission means emits a light ray in the same direction as the signal wave.

In order to adjust an initial position of the reflection means, the angle of the transmission antenna is adjusted by means of visual check so that the light ray emitted in parallel with the output axis of the transmission antenna is incident upon the reflection means. Accordingly, the angle of the reflection means can be adjusted so that the light ray reflected by the reflection means is incident upon the reception antenna. When the millimeter wave communication system is configured as described above, the initial direction of the reflection means can be adjusted easily by only one person.

CITATION LIST

Patent Literature

Patent Literature 1: JP 2004-104816 (A) (page 4, FIG. 1)
Patent Literature 2: JP 2005-244362 (A) (page 5, FIG. 1)

SUMMARY OF INVENTION

Technical Problem

A purpose of the present invention is to provide a mechanism for transmitting a signal in a millimeter wave band without inconvenience while reducing interference in an electronic apparatus.

Solution to Problem

A millimeter wave transmission device according to the present invention includes a first signal generation unit for generating a millimeter wave signal upon performing frequency conversion on an input signal to be transmitted and a second signal generation unit for demodulating the received millimeter wave signal and generating an output signal corresponding to the input signal to be transmitted.

A circuit board is constituted by a dielectric material and includes the first signal generation unit and the second signal generation unit. Further, the circuit board is used as a millimeter wave transmission path between the first signal generation unit and the second signal generation unit In short, in the millimeter wave transmission device according to the present invention, members at the transmission side and the reception side relating to the millimeter wave transmission are mounted on the same circuit board, and the circuit board is configured to be also used as the millimeter wave transmission path.

For example, the millimeter wave transmission path for transmitting the electromagnetic wave based on the millimeter wave signal is configured such that a transmission region is defined on the circuit board, and the millimeter wave signal is transmitted in such a manner that the millimeter wave signal is shielded in this defined transmission region of the circuit board.

The millimeter wave transmission device includes a first signal coupling unit for transmitting the millimeter wave signal generated by the first signal generation unit to one end of the circuit board and a second signal coupling unit for receiving the millimeter wave signal from the other end of the circuit board. Each of the first signal coupling unit and the second signal coupling unit is constituted by an antenna member having a predetermined length based on the millimeter wave signal wavelength.

The first signal generation unit and the first signal coupling unit are preferably arranged in the first electronic component. The second signal coupling unit and the second signal generation unit are preferably arranged in the second electronic component. The first electronic component and the second electronic component are preferably mounted on the same circuit board.

An electronic component used for signal processing in baseband region of the input signal and the output signal may be mounted on the circuit board between the first region of the circuit board including the first signal generation unit and the first signal coupling unit and the second region of the circuit board including the second signal generation unit and the second signal coupling unit.

For example, the first signal generation unit includes the modulating circuit, and the modulating circuit modulates the input signal. The first signal generation unit performs frequency modulation on the signal modulated by the modulating circuit, and generates the millimeter wave signal. The first signal coupling unit transmits the millimeter wave signal generated by the first signal generation unit to one end of the tangible object.

The second signal coupling unit receives the millimeter wave signal from the other end of the tangible object. The signal is transmitted within the tangible object from the antenna member constituting the first signal coupling unit and having a predetermined length based on the millimeter wave signal wavelength, and the electromagnetic wave based on the signal is received by the antenna member constituting the second signal coupling unit and having the same length.

For example, the second signal generation unit has the demodulating circuit, and performs frequency conversion on the millimeter wave signal. Thereafter, the second signal generation unit generates the output signal corresponding to the input signal demodulated by the demodulating circuit.

The circuit board is preferably constituted by at least one of a glass epoxy resin, an acrylic resin, and a polyethylene resin. These resins have relatively large dielectric loss tangents.

In the tangible object having a large loss, the transmission loss increases but the reflected wave is attenuated as the carrier frequency increases. Therefore, an extremely high-speed signal can be transmitted via the tangible object having a large loss.

A millimeter wave transmission method according to the present invention includes the steps of generating a millimeter wave signal upon performing frequency conversion on an input signal to be transmitted, transmitting the millimeter wave signal to one end of the tangible object, and transmitting an electromagnetic wave based on the millimeter wave signal within the tangible object, receiving a millimeter wave signal based on the electromagnetic wave obtained from the other end of the tangible object, and demodulating the received millimeter wave signal and generating an output signal corresponding to the input signal to be transmitted.

In the millimeter wave transmission method according to the present invention, the tangible object transmitting the electromagnetic wave based on the millimeter wave signal is formed with the same dielectric material as the circuit board in the circuit board constituted by the dielectric material having a circuit member for treating the millimeter wave signal.

A millimeter wave transmission system according to the present invention includes a first millimeter wave transmission body including a first signal generation unit for generating a millimeter wave signal by performing frequency conversion on a first input signal to be transmitted, a second signal generation unit for demodulating the received millimeter wave signal and generating a first output signal corresponding to the first input signal to be transmitted, and a first circuit board constituted by a dielectric material and including the first signal generation unit and the second signal generation unit, wherein the first circuit board is used as a millimeter wave transmission path between the first signal generation unit and the second signal generation unit, a second millimeter wave transmission body including a third signal generation unit for generating a millimeter wave signal by performing frequency conversion on a second input signal to be transmitted, a fourth signal generation unit for demodulating the received millimeter wave signal and generating a second output signal corresponding to the second input signal to be transmitted, and a second circuit board constituted by a dielectric material and including the third signal generation unit and the fourth signal generation unit, wherein the second circuit board is used as a millimeter wave transmission path between the third signal generation unit and the fourth signal generation unit, and a coupling medium for connecting the first millimeter wave transmission body and the second millimeter wave transmission body and propagating an electromagnetic wave based on the millimeter wave signal.

In short, the millimeter wave transmission system according to the present invention includes a plurality of millimeter wave transmission devices according to the present invention and a coupling medium for combining them and transmitting an electromagnetic wave based on the millimeter wave signals.

Advantageous Effects of Invention

According to the present invention, a signal in a millimeter wave band can be transmitted within an electronic apparatus with a lower degree of interference and without any inconvenience. A circuit board having members at the transmission side and the reception side relating to the millimeter wave transmission is also used as a tangible object functioning as a millimeter wave transmission path, because an electromagnetic wave between transmission and reception based on a millimeter wave signal is transmitted while being shielded within the circuit board.

BRIEF DESCRIPTION OF DRAWINGS

FIG. 3 is a circuit diagram illustrating an exemplary internal configuration of an amplifier 204 and the like.

FIG. 12A is a perspective view illustrating an exemplary implementation of transmission lines 206, 226 and the electronic components #A, #B, #C, #D in the millimeter wave transmission system 200.

FIG. 13 is a block diagram illustrating an exemplary configuration of a millimeter wave transmission system 300 according to a third embodiment.

FIG. 26 is a cross sectional view taken along arrow line X4-X4 for illustrating an exemplary configuration (part III) of the millimeter wave transmission device 800.

DESCRIPTION OF EMBODIMENTS

Hereinafter, preferred embodiments of the present invention will be described in detail with reference to the appended drawings. Note that, in this specification and the drawings, elements that have substantially the same function and structure are denoted with the same reference signs, and repeated explanation is omitted.

The following explanation will be made in the order listed below.

Figure 1:
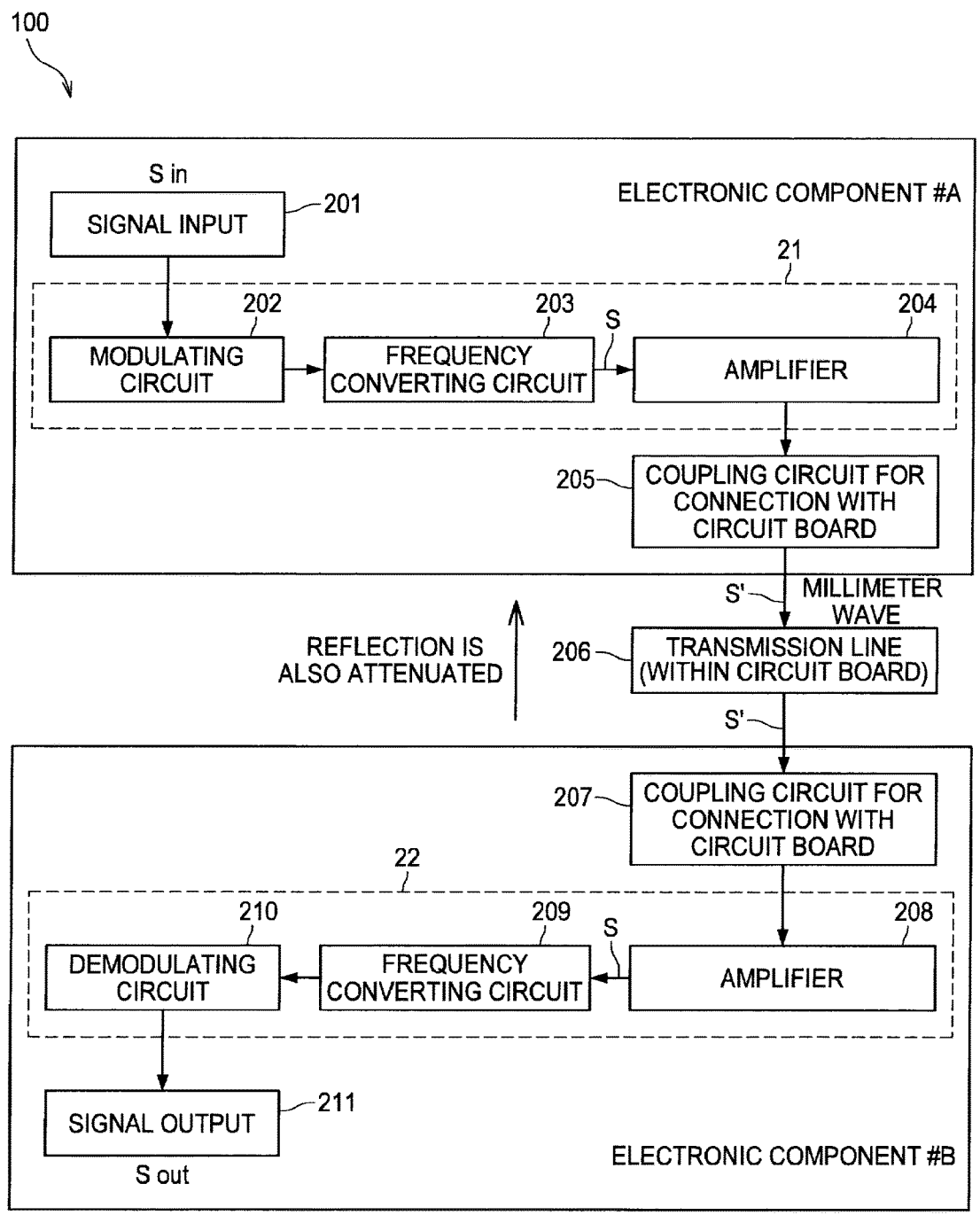
FIG. 1 is a block diagram illustrating an exemplary configuration of a millimeter wave transmission device 100 as a first embodiment.

1. First embodiment: basic
2. Second embodiment: multiple transmission paths
3. Third embodiment: coupling with coupling medium
4. Fourth embodiment: adder circuit (frequency multiplexing)
5. Fifth embodiment: with feedback path
6. Sixth embodiment: microstrip line and waveguide structure
7. Seventh embodiment: upper ground layer and antenna structure
8. Eighth embodiment: coupling circuit has multiple-layer structure First Embodiment FIG. 1 is a block diagram illustrating an exemplary configuration of a millimeter wave transmission device 100 as a first embodiment. The millimeter wave transmission device 100 shown in FIG. 1 can be applied to an image processing apparatus for transmitting a millimeter wave signal having a carrier frequency of 30 GHz to 300 GHz at a high speed.

Figure 2A:
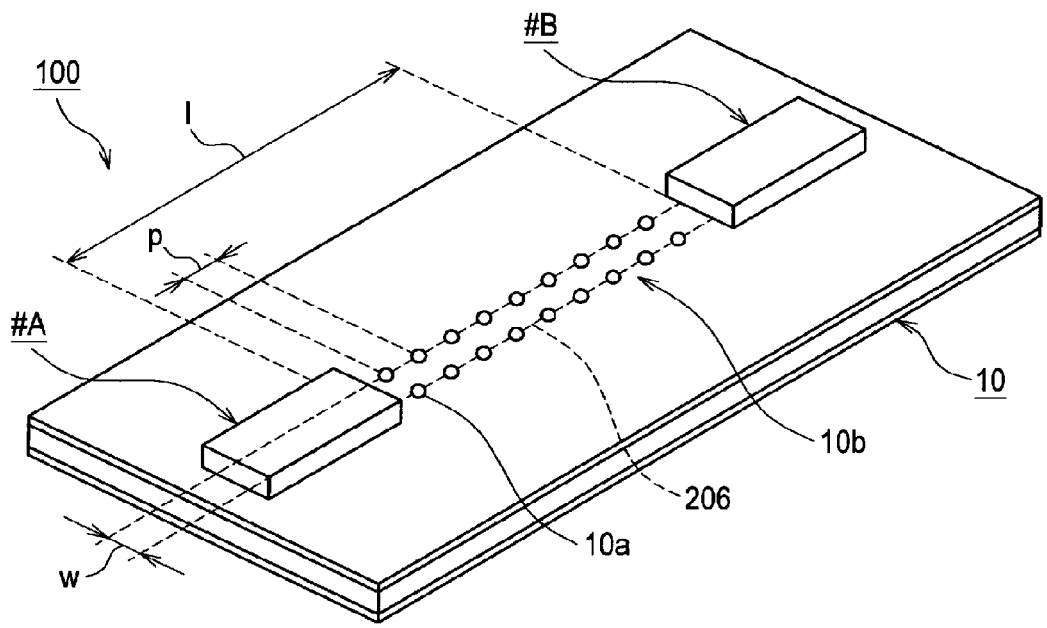
FIG. 2A is an explanatory diagram illustrating an exemplary configuration of the millimeter wave transmission device 100 on a circuit board 10.
Figure 2B:
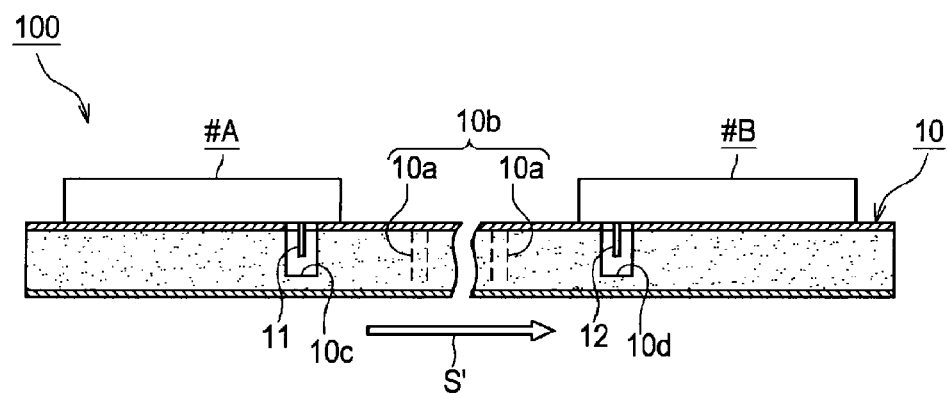
FIG. 2B is a cross sectional view illustrating an exemplary configuration of the millimeter wave transmission device 100 on the circuit board 10.

The millimeter wave transmission device 100 includes a first signal generation unit 21, a second signal generation unit 22, a signal input terminal 201, a coupling circuit 205 for coupling with a circuit board 10 as shown in FIG. 2B, a transmission line 206 using a tangible object (such as a circuit board) made of a dielectric material, a coupling circuit 207 for coupling with the circuit board 10, and a signal output terminal 211. The signal generation unit 21 and the signal generation unit 22 are constituted by CMOS-IC devices, i.e., examples of semiconductor integrated circuits. These members are arranged in an electronic apparatus.

The first signal generation unit 21 connected to the signal input terminal 201 includes, for example, a modulating circuit 202, a frequency converting circuit 203, and an amplifier 204, in order to generate a millimeter wave signal S by processing an input signal Sin. The signal input terminal 201 is connected to the modulating circuit 202, so that the input signal Sin is modulated. The modulating circuit 202 uses, for example, a phase modulating circuit. Alternatively, the modulating circuit 202 as well as the frequency converting circuit 203 may use a so-called direct conversion method.

The modulating circuit 202 is connected to the frequency converting circuit 203. Accordingly, the input signal Sin modulated by the modulating circuit 202 is subjected to frequency conversion, so that the millimeter wave signal S is generated. In this case, the millimeter wave signal S is a signal having a frequency of 30 GHz to 300 GHz. The frequency converting circuit 203 is connected to the amplifier 204. Accordingly, after the millimeter wave signal S is subjected to frequency conversion, the signal S is amplified.

The amplifier 204 is connected to the coupling circuit 205 constituting an example of a first signal coupling unit. The amplifier 204 transmits the millimeter wave signal generated by the signal generation unit 21 to an end of a tangible object (tangible object made of a dielectric material) having a predetermined dielectric constant $\in$. The coupling circuit 205 is constituted by an antenna member having a predetermined length based on a wavelength $\lambda$ of the millimeter wave signal S, i.e., about 600 μm, and is coupled to the tangible object having the dielectric constant $\in$. When the coupling circuit 205 has a fractional bandwidth (=signal band/operation center frequency) of about 10% to 20%, the coupling circuit 205 can also be easily realized using a resonance structure. In this embodiment, a region of the circuit board 10 having the dielectric constant $\in$ is used for the tangible object. The region of the circuit board 10 having the dielectric constant $\in$ constitutes the transmission line 206. Accordingly, a millimeter wave electromagnetic wave S' propagates in the transmission line 206. When a dielectric loss tangent δ is large, the transmission line 206 has a relatively large loss, which also reduces the reflection. Therefore, a large dielectric loss tangent δ is preferable to a small dielectric loss tangent δ.

In this specification, the magnitude of the dielectric loss tangent δ in a used frequency band is distinguished as follows. The dielectric material having a small dielectric loss tangent δ corresponds to a material having a tan δ equal to or less than about 0.001, for example, Teflon (registered trademark) resin and silicone resin. On the other hand, the dielectric material having a large dielectric loss tangent δ corresponds to a material having a tan δ equal to or more than about 0.01, for example, glass epoxy resin (tan δ≈0.02 to 0.03), acrylic resin, and polyethylene resin.

The transmission line 206 is connected to the coupling circuit 207 constituting an example of a second signal coupling unit. The transmission line 206 receives an electromagnetic wave S' based on the millimeter wave signal S from the other end of the transmission line 206. The coupling circuit 207 is constituted by an antenna member having a predetermined length based on the wavelength $\lambda$ of the millimeter wave signal S, i.e., about 600 μm. The antenna member is, for example, a probe antenna (dipole), a loop antenna, and a small aperture-coupled device (such as slot antenna).

The coupling circuit 207 is connected to the second signal generation unit 22. The second signal generation unit 22 processes the millimeter wave signal received by the coupling circuit 207. More particularly, the second signal generation unit 22 demodulates the millimeter wave signal. Thereby, the second signal generation unit 22 generates an output signal Sout corresponding to the input signal Sin to be transmitted. The signal generation unit 22 includes, for example, an amplifier 208, a frequency converting circuit 209, and a demodulating circuit 210. Alternatively, the frequency converting circuit 209 as well as the demodulating circuit 210 may use a so-called direct conversion method. The coupling circuit 207 is connected to the amplifier 208, so that the amplifier 208 can amplify the received millimeter wave signal.

The amplifier 208 is connected to the frequency converting circuit 209. The frequency converting circuit 209 converts the frequency of the amplified millimeter wave signal S. The frequency converting circuit 209 is connected to the demodulating circuit 210. The demodulating circuit 210 demodulates the output signal having been subjected to the frequency conversion.

In this millimeter wave transmission device 100, the signal input terminal 201, the signal generation unit 21, and the coupling circuit 205 shown in FIG. 1 constitute a signal-transmission first electronic component #A. On the other hand, the coupling circuit 207, the signal generation unit 22, and the signal output terminal 211 constitute a signal-reception second electronic component #B.

The signal generation unit 21 and the signal generation unit 22 are respectively provided as the millimeter wave communication electronic components #A, #B constituted by CMOS-IC devices, i.e., examples of semiconductor integrated circuits. The electronic component #A and the electronic component #B are mounted on the circuit board 10 having the dielectric constant $\in$. The electronic components #A, #B may not be necessarily arranged on the same surface of the same circuit board 10. Alternatively, the electronic components #A, #B may be arranged on surfaces different from each other (i.e., on the front surface and the back surface, respectively).

Although not shown in the figure, the circuit board 10 may be arranged with not only the millimeter wave communication electronic components #A, #B but also passive elements such as resistor devices, capacitor devices, and transformers, and active elements such as transistors and semiconductor integrated circuits, which are used for signal processing in a baseband region.

In this case, in this mechanism of the first embodiment, the circuit board 10 is arranged with the transmission line 206 between the first region of the circuit board 10 including the electronic component #A having the coupling circuit 205 constituting an example of the first signal coupling unit and the first signal generation unit 21 and the second region of the circuit board 10 including the electronic component #B having the coupling circuit 207 constituting an example of the second signal coupling unit and the second signal generation unit 22. Accordingly, in this mechanism of the first embodiment, it is not necessary to consider a millimeter wave transmission therebetween on the circuit board 10. Therefore, for example, electronic components (passive elements and active elements) used for signal processing in a baseband region can be mounted in a space between the electronic components #A, #B on the circuit board 10 regardless of the sizes of the components (see FIG. 12A explained below).

The above-explained method for transmitting data upon converting the frequency of the input signal Sin is generally used for broadcast and wireless communication. For this purpose, relatively complicated transmitters and receivers are used to cope with issues, for example, (1) to what extent communication can be performed (issue of S/N ratio with respect to thermal noise), (2) how reflection and multi-pass can be treated, and (3) how interference with other channels can be suppressed. The signal generation unit 21 and the signal generation unit 22 used in the present embodiment are used in a millimeter wave band, which is in a frequency band higher than the frequency used by the complicated transmitters and receivers generally used for broadcast and wireless communication. The signal generation unit 21 and the signal generation unit 22 use the millimeter wave having a short wavelength $\lambda$. Therefore, the frequency can be easily reused, and the used frequency is suitable for a case where many devices arranged in proximity communicate with each other.

FIGS. 2A and 2B are explanatory diagrams each illustrating an exemplary configuration of the millimeter wave transmission device 100 on the circuit board 10. In this embodiment, a glass epoxy resin circuit board having a large loss, which is not usually used in the millimeter wave band, is used in order to increase the margin of the S/N ratio with respect to thermal noise. Therefore, reflection, multi-pass, and interferences are reduced.

In the millimeter wave transmission device 100 shown in FIG. 2, the signal is transmitted from the electronic component #A to the electronic component #B. This millimeter wave transmission device 100 has the circuit board 10 having the dielectric constant $\in$, which includes the signal-transmission first electronic component #A including the signal generation unit 21, the coupling circuit 205, and the signal input terminal 201, and the signal-reception second electronic component #B including the coupling circuit 207, the signal generation unit 22, and the signal output terminal 211 as shown in FIG. 1. The circuit board 10 has a both-side copper foil circuit board in which a glass epoxy resin is used as an insulating base. The dielectric constant $\in$ of the glass epoxy resin is about 4.0 to 5.0 (1 MHz).

The transmission line 206 is constituted by a transmission region I defined on the glass epoxy resin circuit board including the electronic component #A and the electronic component #B mounted thereon. The transmission line 206 uses the circuit board 10 having a large loss, such as a glass epoxy circuit board usually used for an ordinary print circuit board, wherein the circuit board 10 has a dielectric loss tangent $\delta$ of 0.01 or more, and the circuit board 10 has a large transmission loss in the millimeter wave band and is not considered to be suitable for millimeter wave transmission in the past.

The transmission region I of this example is defined by a plurality of opening portions (hereinafter referred to as through holes 10a) in a cylindrical hollow form penetrating the circuit board 10 as shown in FIG. 2A. For example, the plurality of through holes 10a are formed in a linear manner in two rows in a direction of propagation of the electromagnetic wave S' based on the millimeter wave signal S between the electronic component #A and the electronic component #B on the circuit board 10 (directionality). An arrangement pitch p between one of the through holes 10a and an adjacent through hole 10a is set at $\lambda/2$ or less, for example. When the width between one of the through holes 10a and an opposing through hole 10a is defined as a width w of the transmission region I, the width w is set at $\lambda/2$ or more. The through hole 10a is not limited to a cylindrical hollow member, and may be a column-shaped member having a conducting property. When a column-shaped member having a conducting property is grounded, a phase can be adjusted as a dielectric waveguide path.

As described above, the transmission region I is defined by opening portions arranged in two rows (hereinafter referred to as through hole fence portions 10b). It is to be understood that a fence member such as a repeater may be arranged on the circuit board 10, so that the transmission range of the electromagnetic wave S' based on the millimeter wave signal S may be controlled. It is to be understood that, when the electronic component #B or a plurality of other electronic components #B arranged around the electronic component #A are configured to receive the electromagnetic wave S' based on the millimeter wave signal S at a time, the through hole fence portions 10b may be omitted so that the transmission direction of the electromagnetic wave S' becomes omnidirectional.

In the millimeter wave transmission device 100, the electromagnetic wave S' based on the signal transmitted within the circuit board 10 from the antenna member 11 shown in FIG. 2B, constituting the coupling circuit 205, is received by the antenna member 12 as shown in FIG. 2B, constituting the coupling circuit 207. The antenna member 11 is connected to the amplifier 204 of the electronic component #A as shown in FIG. 1, and is arranged on the circuit board 10 or in the circuit board 10. The antenna member 11 is configured to emit the electromagnetic wave S' within the circuit board 10. For example, the antenna member 11 is arranged in a hole portion 10c formed in the circuit board 10. The antenna member 11 uses an antenna body having a wavelength $\lambda$ of about $\frac{1}{2}$ or more. When an antenna body having a wavelength $\lambda$ of about $\frac{1}{2}$ or more can be mounted, a waveguide structure such as a waveguide and a dielectric line can be easily realized. When the waveguide structure is used, the issues (1), (2), and (3) associated with broadcast and wireless communication apparatuses can be significantly alleviated.

The antenna member 12 is connected to the amplifier 208 of the electronic component #B, and is arranged on the circuit board 10 or in the circuit board 10. The antenna member 12 is configured to receive the electromagnetic wave S' from within the circuit board 10. The antenna member 12 is also arranged in a hole portion 10d formed in the circuit board 10. Therefore, the electromagnetic wave S' transmitted from the electronic component #A can be shielded within the transmission region I defined by the through hole fence portions 10b. Moreover, the antenna member 12 of the electronic component #B can receive the electromagnetic wave S' shielded within the transmission region I.

Figure 3:
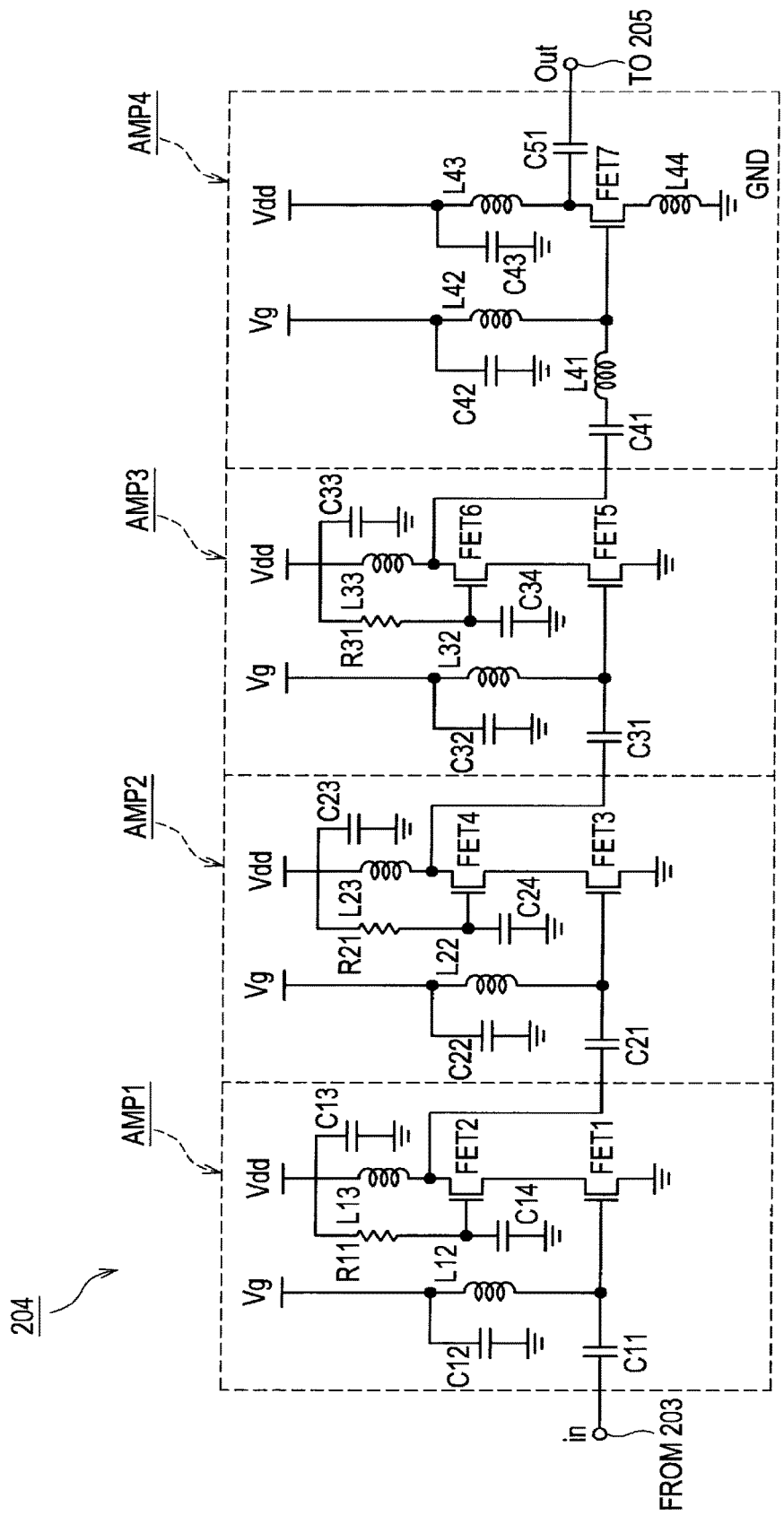

Subsequently, exemplary internal configurations of the amplifier 204 of the signal generation unit 21 and the amplifier 208 of the signal generation unit 22 will be explained. FIG. 3 is a circuit diagram illustrating the exemplary internal configuration of the amplifier 204 and the like. In this embodiment, the amplifier 204 shown in FIG. 3 is an amplification circuit which can be applied to the signal generation units 21, 22 shown in FIG. 1, and includes three driver amplifiers AMP1 to AMP3 and a final amplifier AMP4, which are connected in series.

The amplifier AMP1 includes two n-channel field effect transistors (hereinafter referred to as transistors FET1, FET2), a resistor R11, a coupling capacitor (hereinafter simply referred to as capacitor C11), two electrolytic capacitors (hereinafter simply referred to as capacitors C12, C13), a gate discharge capacitor (hereinafter simply referred to as capacitor C14), an input (load) inductance L12, and an output (load) inductance L13.

One end of the capacitor C11 is connected to the frequency converting circuit 203. The millimeter wave signal S having been subjected to the frequency conversion is provided to the one end of the capacitor C11. The other end of the capacitor C11 is connected to a gate of the transistor FET1 and is also connected to one end of the inductance L12. The other end of the inductance L12 is connected to a gate voltage supply source Vg and is also connected to one end of the capacitor C12. The other end of the capacitor C12 and the source of the transistor FET1 are grounded.

The drain of the transistor FET1 and the source of the transistor FET2 are connected. The drain of the transistor FET2 is connected to one end of the inductance L13. The other end of the inductance L13 is connected to Vdd power supply and one end of the capacitor C13, so that the drain voltage is provided to the drain of the transistor FET2. The other end of the capacitor C13 is grounded, so that the capacitor C13 accumulates charge.

The resistor R11 is connected between the gate of the transistor FET2 and the Vdd power supply. The gate voltage divided by the resistor R11 is provided to the transistor FET2. The capacitor C14 is connected between the gate of the transistor FET2 and the ground, so that the capacitor C14 charges and discharges the gate voltage. The drain of the transistor FET2 is connected to one end of a coupling capacitor (hereinafter simply referred to as capacitor C21).

The other end of the capacitor C21 is connected to the amplifier AMP2 of the subsequent stage. Likewise, the amplifier AMP2 includes two n-channel field effect transistors (hereinafter simply referred to as transistors FET3, FET4), a resistor R21, a capacitor C21, two electrolytic capacitors (hereinafter simply referred to as capacitors C22, C23), a gate discharge capacitor (hereinafter simply referred to as capacitor C24), an input (load) inductance L22, and an output (load) inductance L23.

The other end of the capacitor C21 connected to the drain of the transistor FET2 in the previous stage is connected to the gate of the transistor FET3, and is also connected to one end of the inductance L22. The other end of the inductance L22 is connected to the gate voltage supply source Vg, and is also connected to one end of the capacitor C22. The other end of the capacitor C22 and the source of the transistor FET3 are grounded.

The drain of the transistor FET3 is connected to the source of the transistor FET4. The drain of the transistor FET4 is connected to one end of the inductance L33. The other end of the inductance L33 is connected to the Vdd power supply and one end of the capacitor C33, so that the drain voltage is provided to the drain of the transistor FET4. The other end of the capacitor C23 is grounded, so that the capacitor C23 accumulates charge.

The resistor R21 is connected between the gate of the transistor FET2 and the Vdd power supply. The gate voltage divided by the resistor R21 is provided to the transistor FET4. The capacitor C24 is connected between the gate of the transistor FET4 and the ground, so that the capacitor C24 charges and discharges the gate voltage. The drain of the transistor FET2 is connected to one end of a coupling capacitor (hereinafter simply referred to as capacitor C31).

The other end of the capacitor C31 is connected to the amplifier AMP3 of the subsequent stage. Likewise, the amplifier AMP3 includes two n-channel field effect transistors (hereinafter simply referred to as transistors FET5, FET6), a resistor R31, a capacitor C31, two electrolytic capacitors (hereinafter simply referred to as capacitors C32, C33), a gate discharge capacitor (hereinafter simply referred to as capacitor C34), an input (load) inductance L32, and an output (load) inductance L33.

The other end of the capacitor C31 connected to the drain of the transistor FET4 in the previous stage is connected to the gate of the transistor FET5, and is also connected to one end of the inductance L32. The other end of the inductance L32 is connected to the gate voltage supply source Vg, and is also connected to one end of the capacitor C32. The other end of the capacitor C32 and the source of the transistor FET5 are grounded.

The drain of the transistor FET5 is connected to the source of the transistor FET6. The drain of the transistor FET6 is connected to one end of the inductance L33. The other end of the inductance L33 is connected to the Vdd power supply and one end of the capacitor C33, so that the drain voltage is provided to the drain of the transistor FET6. The other end of the capacitor C33 is grounded, so that the capacitor C33 accumulates charge.

The resistor R31 is connected between the gate of the transistor FET6 and the Vdd power supply. The gate voltage divided by the resistor R31 is provided to the transistor FET6. The capacitor C34 is connected between the gate of the transistor FET6 and the ground, so that the capacitor C34 charges and discharges the gate voltage. The drain of the transistor FET6 is connected to one end of a coupling capacitor (hereinafter simply referred to as capacitor C41).

The other end of the capacitor C41 is connected to the amplifier AMP4 of the final stage. The amplifier AMP4 includes an n-channel field effect transistor (hereinafter simply referred to as transistor FET7), capacitors 41, C51, two electrolytic capacitors (hereinafter simply referred to as capacitors C42, C43), input (load) inductances L41, L42, an output (load) inductance L33, and a bias voltage generation inductance L44.

The other end of the capacitor C41 connected to the drain of the transistor FET6 in the previous stage is connected to the inductance L41. The other end of the inductance L41 is connected to the gate of the transistor FET7, and is also connected to one end of the inductance L42. The other end of the inductance L42 is connected to the gate voltage supply source Vg, and is also connected to one end of the capacitor C42. The source of the transistor FET7 is connected to one end of the inductance L44. The other end of the inductance L44 and the other end of the capacitor C42 are grounded.

The drain of the transistor FET7 is connected to one end of the inductance L43. The other end of the inductance L43 is connected to the Vdd power supply and one end of the capacitor C43, so that the drain voltage is provided to the drain of the transistor FET7. The other end of the capacitor C43 is grounded, so that the capacitor C43 accumulates charge. The drain of the transistor FET7 is connected to one end of the capacitor C51. The other end of the capacitor C51 is connected to the antenna member 11 and the like of the coupling circuit 206 (see FIG. 2B).

The amplifier 204 is constituted by the above elements. The amplifier 204 uses the amplifiers AMP1 to AMP3 to successively amplify the millimeter wave signal S having been subjected to the frequency conversion, and is configured to transmit the amplified millimeter wave signal S from the final amplifier AMP4 to the antenna member 11 and the like of the coupling circuit 205. Accordingly, the amplified millimeter wave signal can be transmitted via the antenna member 11 and the like to one end of the tangible object (tangible object made of a dielectric material) having the predetermined dielectric constant ∈.

Figure 4:
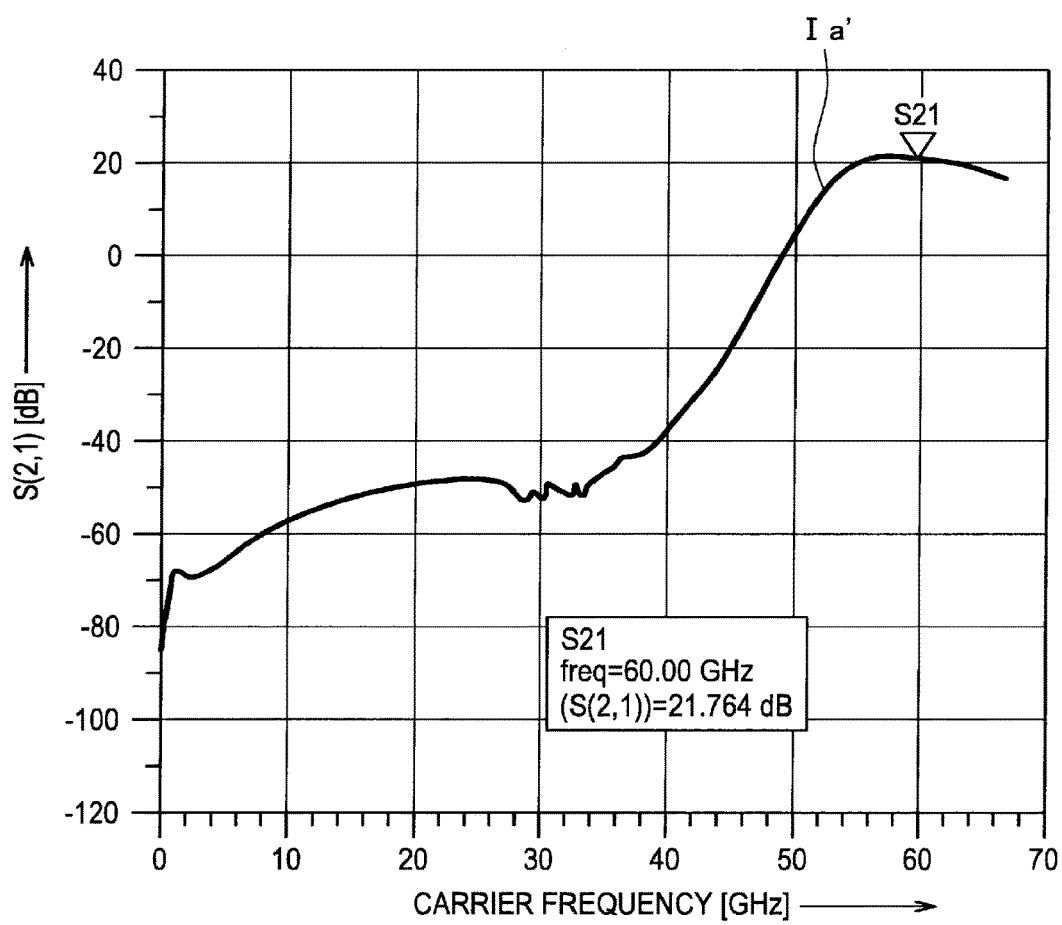
FIG. 4 is a frequency characteristic diagram illustrating example of bandpass characteristic Ia' of the amplifier 204.

FIG. 4 is a frequency characteristic diagram illustrating example of bandpass characteristic Ia' of the amplifier 204. In FIG. 4, the vertical axis represents bandpass characteristic dB (S(2,1)) of the amplifier 204, and the horizontal axis represents a carrier frequency (freq, GHz). The unit of the scale is 10 GHz.

The example of bandpass characteristic Ia' of the amplifier 204 shown in FIG. 4 represents bandpass characteristic dB (S(2,1)) of the millimeter wave signal successively amplified by the three-stage driver amplifiers AMP1 to AMP3 and the final amplifier AMP4 of the amplifier 204 shown in FIG. 3. When the carrier frequency is increased from 1 GHz to 100 GHz by 1 GHz, the bandpass characteristic dB (S(2,1)) of the amplifier 204 indicates that the bandpass gain increases. According to an actual measurement result, the bandpass gain (gain) of the bandpass characteristic dB (S(2,1)) at a carrier frequency of 60 GHz is 21.764 dB as shown by S21 in the figure.

Figure 5:
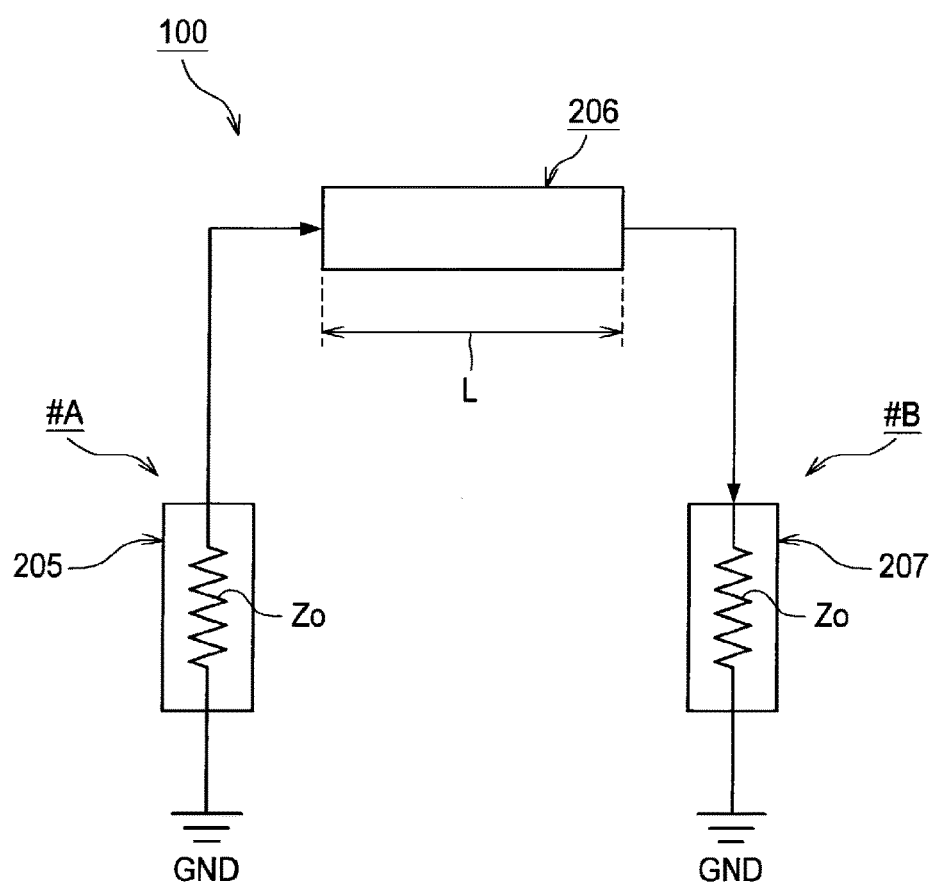
FIG. 5 is a simulation circuit diagram illustrating an example of a millimeter wave transmission in the millimeter wave transmission device 100.

Subsequently, two circuit boards, i.e., a circuit board 10 made of Teflon (registered trademark) resin and a circuit board 10 made of glass epoxy resin, are applied to the millimeter wave transmission device 100, and the magnitudes of the losses and reflection characteristic thereof are compared based on a simulation using Agilent Advanced Design System (ADS). FIG. 5 is a simulation circuit diagram illustrating an example of a millimeter wave transmission in the millimeter wave transmission device 100.

In the simulation as shown in FIG. 5, the magnitude of the loss of the transmission line 206 and the result of examination of the reflection characteristic are compared between a case where the transmission line 206 is made as a microstrip line having a thickness t of 18 μm, a length L of 100 mm, and a width W of 170 μm formed on a circuit board 10 made of glass epoxy resin having a thickness of 100 μm, and a case where the transmission line 206 is made as a microstrip line having the same thickness t, the same length L, and a width W of 170 μm+α formed on a circuit board 10 made of Teflon (registered trademark) resin having a thickness of 100 μm. In the simulation, the output impedance of the coupling circuit 205 of the electronic circuit #A is set at characteristic impedance Zo=50Ω, and the input impedance of the coupling circuit 207 of the electronic circuit #B is set at characteristic impedance Zo=50Ω, and the carrier frequency is increased from 1 GHz to 100 GHz by 1 GHz.

Figure 6:
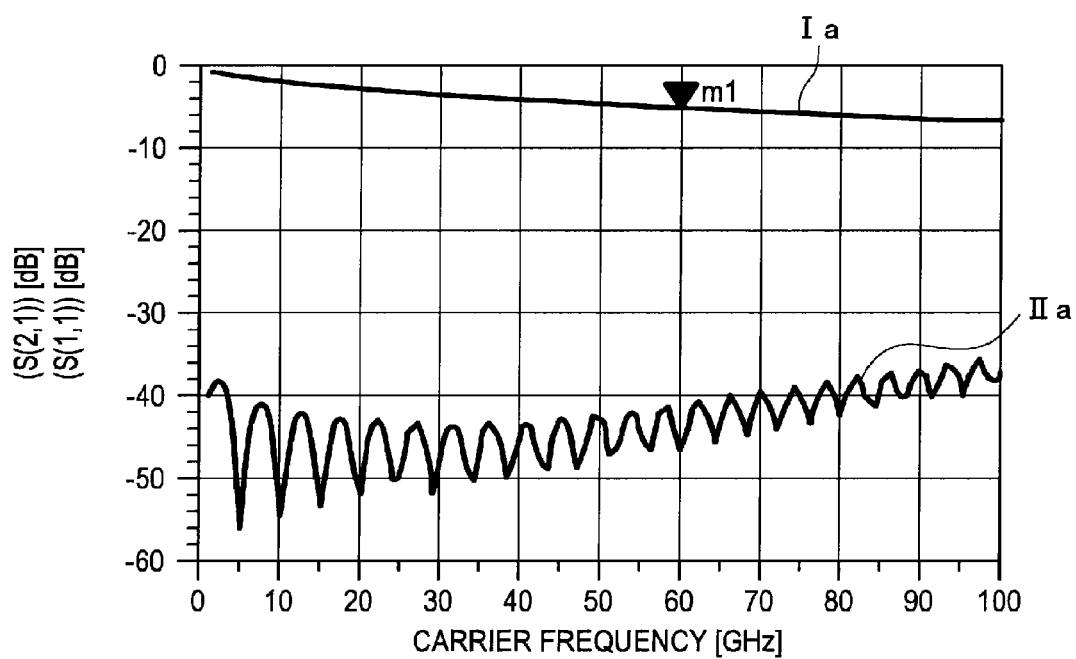
FIG. 6 is a frequency characteristic diagram illustrating an example of loss and an example of reflection of a transmission line 206 on the circuit board 10 made of Teflon (registered trademark) resin.

FIG. 6 is a frequency characteristic diagram illustrating an example of bandpass characteristic and an example of reflection characteristic of the transmission line 206 on the circuit board 10 made of Teflon (registered trademark) resin. The circuit board 10 made of Teflon (registered trademark) resin is configured such that the dielectric loss tangent δ is 0.001 and the transmission line 206 is made with the microstrip line. δ is the loss angle of the dielectric material. In FIG. 6, the vertical axis represents bandpass characteristic dB (S(2,1)) and reflection characteristic dB (S(1,1)). The horizontal axis represents a carrier frequency (freq, GHz). The unit of the scale is 5 GHz.

The example of bandpass characteristic Ia of the transmission line 206 shown in FIG. 6 is the bandpass characteristic dB (S(2,1)) of the electromagnetic wave S' based on the millimeter wave signal S from the electronic circuit #A to the electronic circuit #B on the circuit board 10 made of Teflon (registered trademark) resin. When the carrier frequency is increased from 1 GHz to 100 GHz by 1 GHz, the bandpass characteristic dB (S(2,1)) of the transmission line 206 on the circuit board 10 made of Teflon (registered trademark) resin indicates that the loss hardly exists. According to the simulation result, the bandpass gain (gain) of the bandpass characteristic dB (S(2,1)) at a carrier frequency of 60 GHz (2 Gbps) is −5.150 dB as shown by m1 in the figure.

The example of reflection characteristic IIa shown in FIG. 6 is the reflection characteristic dB(S(1,1)) of the electromagnetic wave S' based on the millimeter wave signal S reflected to the electronic circuit #A when the electronic circuit #B is seen from the electronic circuit #A on the circuit board 10 made of Teflon (registered trademark) resin. When the carrier frequency of the transmission line 206 on the circuit board 10 made of Teflon (registered trademark) resin is increased from 1 GHz to 100 GHz by 1 GHz, the example of reflection characteristic IIa appears to have a wave-shaped standing wave in the figure. As described above, the circuit board 10 made of Teflon (registered trademark) resin having a dielectric loss tangent δ of 0.001 has a small loss as shown by the example of bandpass characteristic Ia but is likely to cause the standing wave as shown in the example of reflection characteristic IIa.

Figure 7:
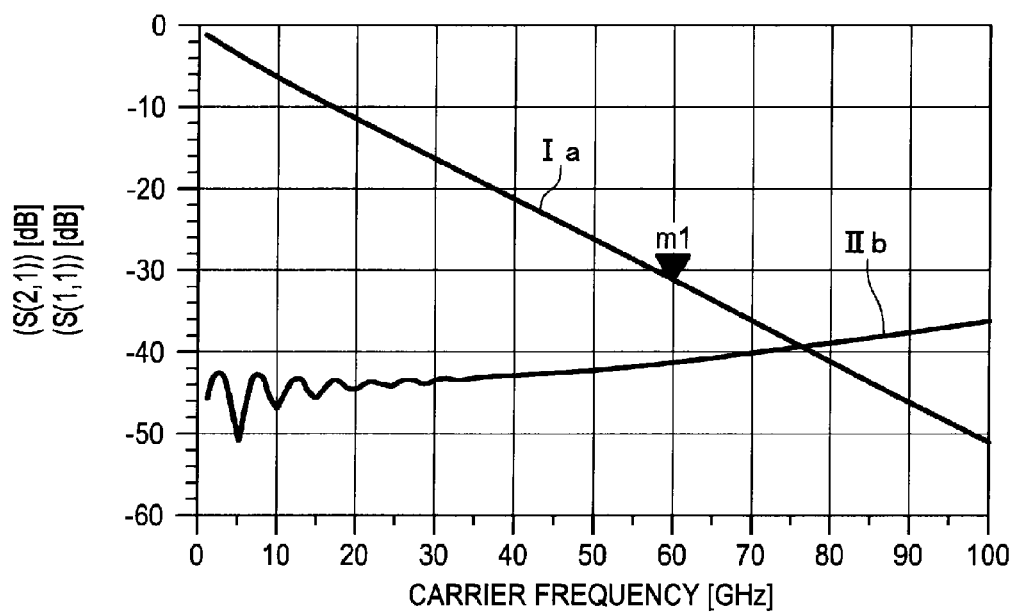
FIG. 7 is a frequency characteristic diagram illustrating an example of loss and an example of reflection of the transmission line 206 on the circuit board 10 made of glass epoxy resin.

FIG. 7 is a frequency characteristic diagram illustrating an example of bandpass characteristic and an example of reflection characteristic of the transmission line 206 on the circuit board 10 made of glass epoxy resin. The circuit board 10 made of glass epoxy resin used for an ordinary print circuit board is configured such that the dielectric loss tangent δ is, for example, 0.03, and the transmission line 206 is made with a microstrip line. δ is the loss angle of the dielectric material. In FIG. 7, the vertical axis also represents bandpass characteristic dB (S(2,1)) and reflection characteristic dB(S(1,1)). The horizontal axis represents a carrier frequency (freq, GHz). The unit of the scale is 10 GHz.

The example of bandpass characteristic Ib shown in FIG. 7 is the bandpass characteristic dB (S(2,1)) of the electromagnetic wave S' based on the millimeter wave signal S from the electronic circuit #A to the electronic circuit #B on the circuit board 10 made of glass epoxy resin. When the carrier frequency of the bandpass characteristic dB (S(2,1)) of the transmission line 206 on the circuit board 10 made of glass epoxy resin is increased from 1 GHz to 100 GHz by 1 GHz, the loss in this case is larger than the loss in the case of the circuit board 10 made of Teflon (registered trademark) resin. According to the simulation result, the bandpass gain (gain) at a carrier frequency of 60 GHz is −31.141 dB as shown by ml in the figure.

The example of reflection characteristic IIb shown in FIG. 7 is the reflection characteristic dB(S(1,1)) of the electromagnetic wave S' based on the millimeter wave signal S reflected to the electronic circuit #A when the electronic circuit #B is seen from the electronic circuit #A on the circuit board 10 made of glass epoxy resin. When the carrier frequency is increased from 1 GHz to 100 GHz by 1 GHz, the example of reflection characteristic IIb of the transmission line 206 on the circuit board 10 made of glass epoxy resin indicates that a reflected wave is attenuated and a standing wave is hardly generated in the figure. As described above, the circuit board 10 made of glass epoxy resin having a dielectric loss tangent δ of 0.03 is less likely to cause a standing wave as shown in the example of reflection characteristic IIb, and has a large loss as shown in the example of transmission loss characteristic Ib. Therefore, the circuit board 10 made of glass epoxy resin has not been used for signal transmission in the millimeter wave band in the past.

However, in the following case, a sufficient signal strength, compared to thermal noise, can be obtained to execute communication processing in the millimeter wave circuit board. The circuit board 10 has a large loss, i.e., a dielectric loss tangent of about 0.03, and the length L of the transmission line 206 is about 10 cm. The CMOS-IC device having the signal generation unit 21 for transmitting the millimeter wave signal and the CMOS-IC device having the signal generation unit 22 for receiving the millimeter wave signal are mounted on the circuit board 10.

On the other hand, it is assumed that the transmission line 206 has a BHz-transmission band, a Boltzmann constant k, a temperature T, and a noise power P due to thermal noise. In such case, the noise power P is kTB, and the noise power per 1 GHz is −84 dBm in an RMS value. The RMS value can be obtained from an equivalent noise current and a thermal noise voltage of a resistor device obtained from a function of a measurement frequency band width, a temperature, and a resistor. For example, when the amplifiers 204, 208 having low noise in 60 GHz band are made with the CMOS-IC devices, the amplifiers 204, 208 can easily achieve a noise factor of about 6 dB. When the signal generation unit 22 for receiving the millimeter wave signal is actually made, and a margin of 10 dB is set, there is a noise floor of −84 dBm+10 dB+6 dB=−68 dB.

It is easy to design the amplifiers 204, 208 with an output of 0 dBm at a carrier frequency of 60 GHz with the CMOS-IC devices. Therefore, even when the transmission loss of the transmission line 206 on the circuit board 10 made of glass epoxy resin as shown in FIG. 7 is 31 dB, the S/N ratio is (0 dBm−31 dB)−68 dB=37 dB, which is sufficient for communication when the length L of the transmission line 206 is about 10 cm.

When this output of 0 dBm is controlled to achieve the minimal S/N ratio, interference with peripheral circuits (regions) can be reduced to the minimum. In a case where the dielectric loss tangent δ is large, e.g., a case where the circuit board 10 made of glass epoxy resin is used, the millimeter wave electromagnetic wave S' propagating in the transmission line 206 formed on the circuit board 10 is attenuated by the circuit board. Therefore, interferences with other electronic components not related to the signal can be greatly reduced. In addition, the power consumption at the transmission side can also be reduced.

When the carrier frequency is increased, the transmission loss increases but the reflected wave is attenuated in this transmission line 206 having a large loss. Therefore, a standing wave caused by the reflected wave is less likely to cause adverse effects. In this example, the frequency converting circuit 203 performs frequency conversion on the input signal Sin into the millimeter wave signal S, and thereafter, the frequency converting circuit 209 performs frequency conversion on the millimeter wave signal amplified by the amplifier 208. Accordingly, a ratio of (signal band)/(center frequency) can be reduced. Therefore, it is easy to make the signal generation unit 21 for transmitting the millimeter wave signal and the signal generation unit 22 for receiving the millimeter wave signal.

Figure 8A:
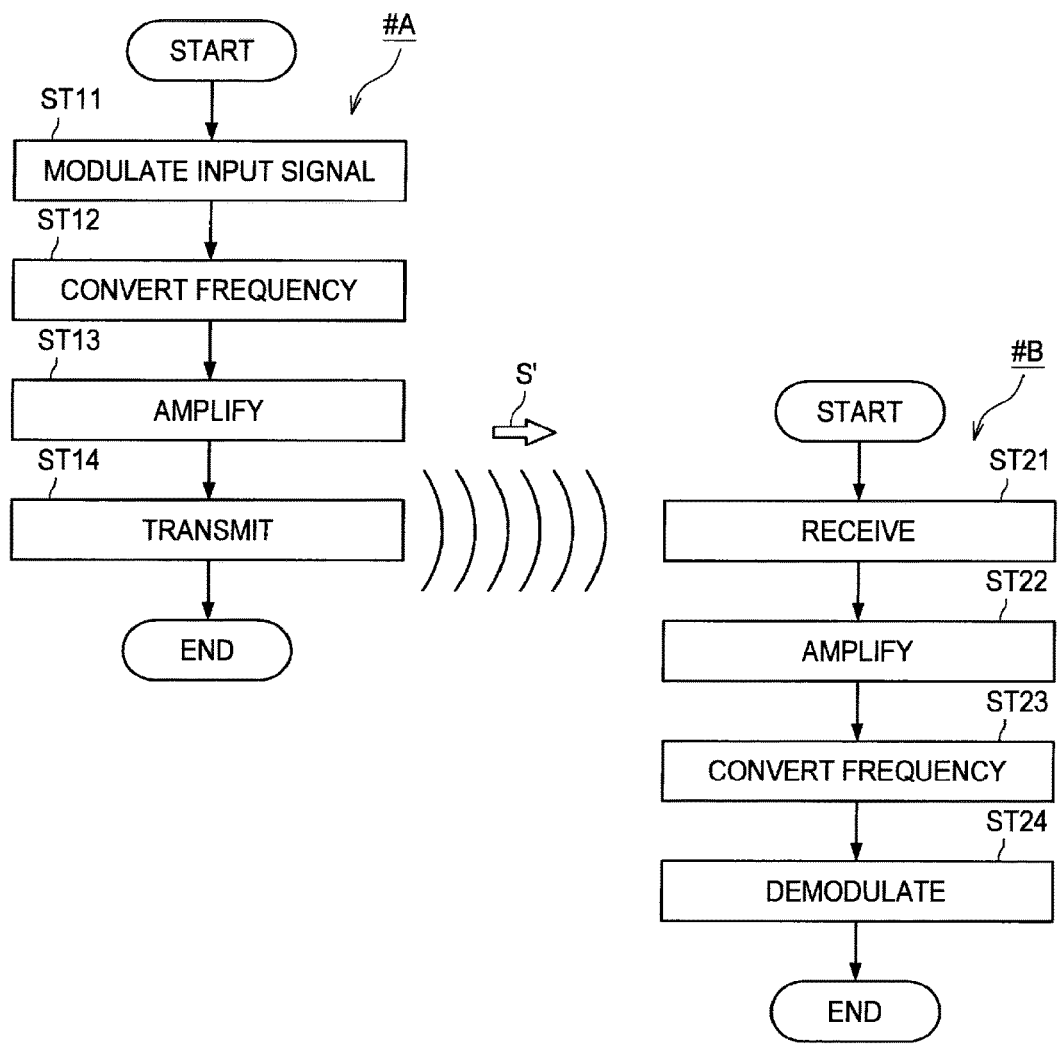
FIG. 8A is an operation flowchart illustrating an example of communication from an electronic component #A to an electronic component #B in the millimeter wave transmission device 100.

Subsequently, the millimeter wave transmission method will be explained. FIG. 8A is an operation flowchart illustrating an example of communication from the electronic component #A to the electronic component #B in the millimeter wave transmission device 100. In this example, the millimeter wave transmission device 100 for transmitting the millimeter wave to the circuit board 10 having the dielectric loss tangent δ (dielectric constant ∈) includes the electronic component #A and the electronic component #B, which are made of CMOS-IC devices, mounted in the region (α) on the circuit board 10 made of glass epoxy resin as shown in FIG. 2, wherein the electronic component #A and the electronic component #B are joined by the transmission line 206 having a large loss.

Using the above as the operation condition, in the electronic component #A of the millimeter wave transmission device 100, the modulating circuit 202 of the signal generation unit 21 performs phase modulation processing based on the input signal Sin in step ST11 of the flowchart shown in FIG. 8A in order to generate the millimeter wave signal S by processing the input signal Sin. The input signal Sin is provided to the terminal 201 from a lower signal processing circuit, not shown.

Subsequently, in step ST12, the frequency converting circuit 203 generates the millimeter wave signal S by performing frequency conversion on the input signal Sin phase-modulated by the modulating circuit 202. Thereafter, in step ST13, the amplifier 204 amplifies the millimeter wave signal S. Then, in step ST14, the coupling circuit 205 transmits the signal of the millimeter wave (millimeter wave having been subjected to the signal processing) amplified by the amplifier 204 to one end of the transmission line 206 defined on the circuit board 10 having the dielectric loss tangent δ. The electromagnetic wave S' based on the millimeter wave signal S propagates through the transmission line 206.

On the other hand, in the electronic component #B, the coupling circuit 207 receives the electromagnetic wave S' based on the millimeter wave signal S from the other end of the transmission line 206 on the circuit board 10 having the dielectric loss tangent δ in step ST21 of the flowchart shown in FIG. 8A in order to generate the output signal Sout by receiving the electromagnetic wave S' based on the millimeter wave signal S. Thereafter, in step ST22, the amplifier 208 amplifies the millimeter wave signal. Then, in step ST23, the frequency converting circuit 208 performs frequency conversion on the millimeter wave signal S amplified by the amplifier 208. Thereafter, in step ST24, the demodulating circuit 210 demodulates the output signal having been subjected to the frequency conversion. The demodulated output signal Sout is output from the terminal 211 to a host signal processing circuit, not shown.

As described above, according to the millimeter wave transmission device 100 and the millimeter wave transmission method of the first embodiment, MOS-IC devices for performing frequency conversion on the input signal Sin into the signal in the millimeter wave band are mounted on the circuit board 10 constituted by the tangible object made of a dielectric material, and in the millimeter wave transmission device 100, the signal generation unit 21 performs frequency conversion on the input signal Sin into the signal in the millimeter wave band, so that the electromagnetic wave S' based on the millimeter wave signal S is transmitted to the transmission line 206 on the circuit board 10 having a large loss in the millimeter wave band.

Preferably, the tangible object made of a dielectric material constituting the circuit board 10 does not have a small dielectric loss tangent δ but has a large dielectric loss tangent δ, so that the transmission line 206 has a large loss. As the carrier frequency increases, the transmission loss increases but the reflected wave is attenuated in the transmission line 206 having a large loss. Therefore, the signal can be transmitted at an extremely high speed via the circuit board 10 having the dielectric constant ∈ having a large loss. Moreover, when only a limited range of the circuit board 10 having the dielectric constant ∈ (in this example, the transmission line 206 made as the circuit board 10) is used as a transmission path, fast communication processing can be performed. The attenuation increases in regions other than the limited range of the circuit board 10 having the dielectric constant ∈, i.e., an example of tangible object made of a dielectric material, and this reduces interferences with locations of the circuit board 10 other than those for communication, i.e., regions other than the communication region of the circuit board 10 having the dielectric constant ∈. In addition, because the loss of the circuit board 10 is large, interferences with components other than the circuit board 10 are reduced. Therefore, the high-speed signal transmission system which causes lower degree of interferences and reflections can be achieved.

In particular, the mechanism of the first embodiment has a great deal of effect in that the signal transmission in the millimeter wave band can be achieved without any issue even when the system incorporates transmission/reception electronic components mounted on a circuit board made of glass epoxy resin and the like including a dielectric material having a not-so-small loss (dielectric loss tangent δ is medium to large) which can be easily obtained at low cost.

FIRST COMPARATIVE EXAMPLE

Figure 8B:
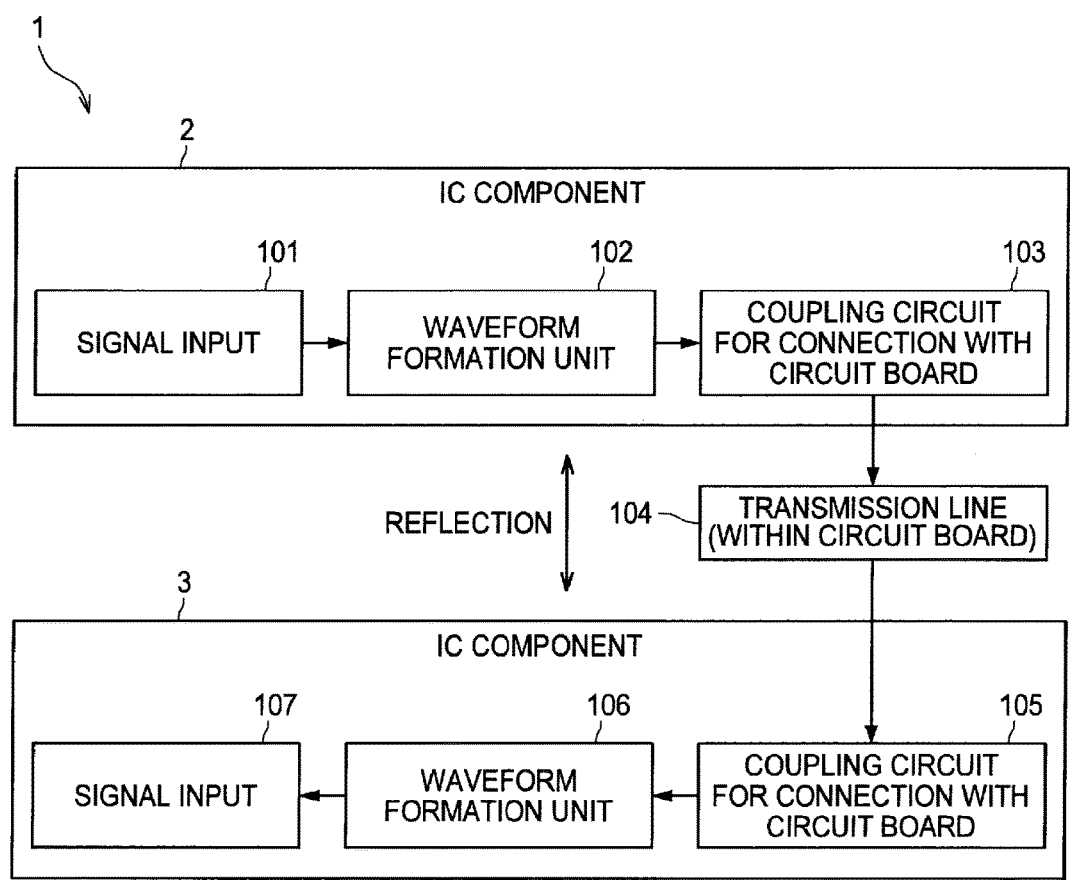
FIG. 8B is a block diagram illustrating an exemplary configuration of a high frequency transmission apparatus 1 according to a first comparative example.
Figure 8C:
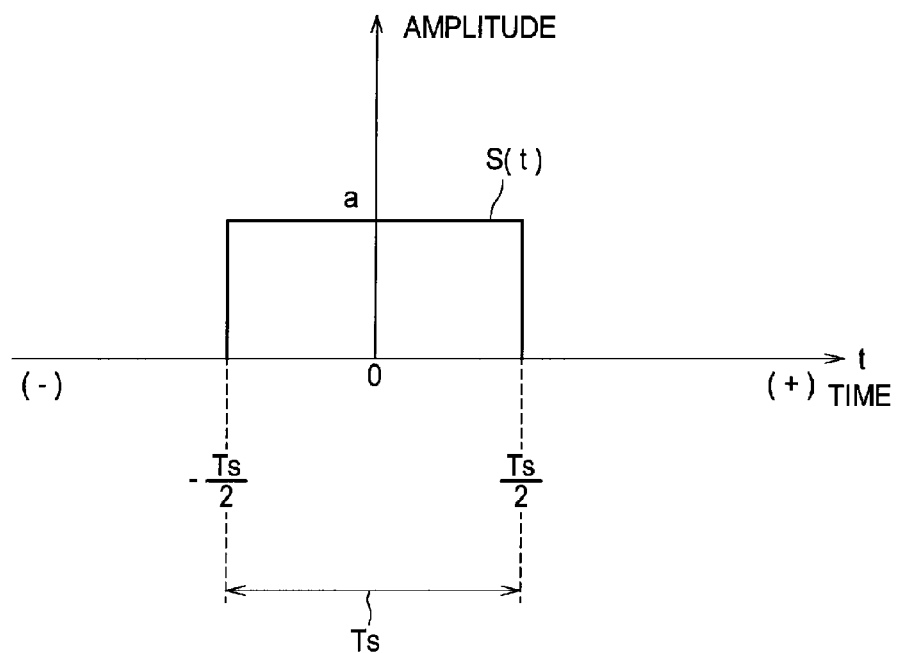
FIG. 8C is a waveform diagram illustrating an example of transmission of a high-speed baseband signal.
Figure 8D:
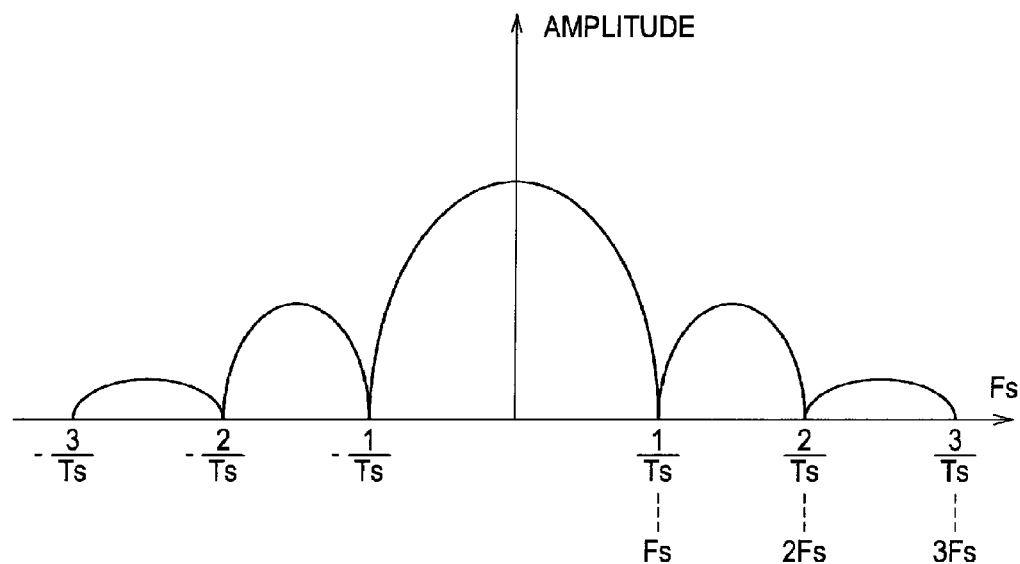
FIG. 8D is a baseband spectrum (frequency characteristics) of the high-speed baseband signal.

FIGS. 8B to 8D are diagrams illustrating a first comparative example corresponding to the first embodiment. In this case, FIG. 8B is a block diagram illustrating an exemplary configuration of a high-speed baseband signal transmission apparatus according to the first comparative example. FIGS. 8C and 8D are diagrams each illustrating an example of transmission of a high-speed baseband signal.

With the recent tremendous increase in the amount of information such as movie images and computer images, apparatuses transmitting baseband signals at a high speed are often used. These kinds of high-speed baseband signal transmission apparatuses need to transmit high-speed baseband signals such as millimeter waves without any error.

For example, in a high frequency transmission apparatus 1 according to the first comparative example shown in FIG. 8B, a signal transmission IC component 2 and a signal reception IC component 3 are mounted on a circuit board having a small dielectric material loss in order to reduce the transmission loss. The IC component 2 includes a signal input terminal 101, a waveform formation unit 102, and a coupling circuit 103 for coupling with the circuit board.

The IC component 3 includes a coupling circuit 105 for coupling with the circuit board, a waveform formation unit 106, and the signal output terminal 107. A transmission line 104 having a small loss is arranged between the coupling circuit 103 of the IC component 2 and the coupling circuit 105 of the IC component 3. For example, high-speed baseband signals for an enormous amount of information such as movie images and computer images are transmitted from the IC component 2 to the IC component 3.

The "transmission line 104 having a small loss" means that the dielectric loss tangent δ of the member forming the transmission line 104 (in this example, circuit board) is smaller than the dielectric loss tangent δ of the dielectric material constituting the circuit board 10 used in the first embodiment.

FIG. 8C illustrates a waveform diagram showing an example of transmission of a high-speed baseband signal.

FIG. 8D illustrates a baseband spectrum (frequency characteristics). In the exemplary waveform as shown in FIG. 8C, the horizontal axis represents a time t, and the vertical axis represents an amplitude a. In the figure, Ts represents a symbol section. Where a temporal waveform of the baseband signal is defined as S(t), the temporal waveform S(t) is represented by the following expression (1).

$$S(t) = \begin{cases} a, & \left(-\frac{Ts}{2} \le t \le +\frac{Ts}{2}\right) \\ 0 & \text{elsewhere} \end{cases} \quad \text{[Expression 1]}$$

The temporal waveform S(t) of the expression (1) is defined by the expression (2) using a Fourier transform pair.

$$\tilde{S}(f) = \int_{-\infty}^{\infty} x(t) e^{j2\pi ft} dt$$

$$x(t) = \int_{-\infty}^{\infty} \tilde{x}(l) e^{-j2\pi ft} dt \quad \text{[Expression 2]}$$

In the base spectrum shown in FIG. 8D, the horizontal axis represents a frequency t, and the vertical axis represents an amplitude. The frequency characteristic of the temporal waveform S(t) is represented by the expression (3).

$$\tilde{S}(f) = \frac{a}{\pi f} \sin(\pi f \cdot T_s) \quad \text{[Expression 3]}$$

In the figure, Fs represents a symbol frequency. The signal transmission IC component 2 transmits at least a signal of 0 Hz to (1/2)·(1/Ts) Hz to the IC component 3 so as to avoid intersymbol interference in the signal reception IC component 3 (Nyquist stability theorem). For example, when binary data are transmitted from the IC component 2 to the IC component 3 with a transmission data rate of 10 Gbps, the symbol frequency Fs is given as 1/Ts, and therefore, Fs is 10 GHz.

In the baseband signal transmission, a signal of 0 Hz to (1/2)·(10 GHz), i.e., 0 Hz to 5 GHz, is transmitted to avoid intersymbol interference. In this case, where the signal of 0 Hz has an infinite wavelength λ, and the light speed in vacuum c is 3×108 m/s, the wavelength λ of the signal of 5 GHz is given as c/Fs. Therefore, λ is 3×108/5×109=6 cm. The high frequency transmission apparatus 1 can accept a wide range of wavelength λ, and is configured to transmit a high-speed baseband signal.

As the signal processing speed on the circuit board increases, the following issues are expected when the high frequency transmission apparatus 1 according to the first comparative example and the signal transmission technique for millimeter wave band are applied to make a high-speed millimeter wave signal transmission system on the circuit board or in the circuit board so as to reduce the interference.

i. According to the high frequency transmission apparatus 1 of the first comparative example, the signal transmission IC component 2 and the signal reception IC component 3 should be mounted on the circuit board having a small dielectric material loss in order to reduce the transmission loss. Therefore, there is an issue in that the circuit board having a small dielectric material loss is peculiar and expensive.

ii. It appears that signals on circuit boards are transmitted at a higher speed than ever before. Accordingly, signals generated by the IC components 2 and the like on the circuit board are expected to interfere with each other. Therefore, it is becoming difficult to transmit high-speed baseband signals such as a millimeter wave from the IC component 2 to the IC component 3 without any error.

According to the example of transmission of binary data of 10 Gbps shown in FIGS. 8C and 8D, it is not easy, in terms of mechanical design and electric design, to reduce electric resonance and reflection and structural resonance in units of multiples of ½ wavelength, throughout the wavelength from the infinite wavelength (0 Hz) to 6 cm (5 GHz). In this issue, the higher the transmission data rate, the more difficult the design thereof. Therefore, it is difficult to design a circuit board processing a high-speed signal.

iii. As the amount of information such as movie images and computer images increases, the bandwidth of the baseband signal becomes wider. Therefore, there are issues not only in (1) spurious emission to the outside of the circuit board but also in (2) transmission error caused by interference between symbols at the reception side when there is a reflection and (3) transmission error caused by intrusive interference.

In general, the spurious emission in the baseband signal band is caused not only by a limitation of a noise floor due to thermal noise but also by various kinds of signal interference sources other than the transmission signal. Examples of primary causes of spurious emissions include interference caused by a clock signal of a CPU, interference with broadcast, communication, and the like, interference signal such as surge caused by a noise discharge of a motor, and reflection caused by impedance mismatch on a signal line (transmission line). When there are resonance and reflection, the resonance and the reflection are likely to cause radiation, which results in a serious issue of Electro-Magnetic Interference (EMI).

v. Further, when a new millimeter wave signal transmission apparatus according to a new intra-tangible object transmission method is made in view of a dielectric waveguide line as shown in PTL 1 and a wireless millimeter wave communication system as shown in PTL 2, it is difficult to achieve a high-speed communication processing in a limited range of a dielectric waveguide line and reduce interference with regions other than the limited range of the dielectric waveguide line, by simply combining a dielectric waveguide line having a small loss and a millimeter wave communication system having a transmission/reception function of a millimeter wave signal without devising any new idea.

vi. In a dielectric waveguide line in which transmission loss does not increase according to increase of a carrier frequency, a reflected wave tends to increase. When this reflected wave is reduced, the structure of the dielectric waveguide line becomes more complicated.

[Comparison Between First Comparative Example and First Embodiment]

FIG. 9 is a diagram illustrating effects of millimeter wave transmission of the millimeter wave transmission device 100 according to the first embodiment, as compared with the first comparative example. In this case, the high frequency transmission apparatus 1 according to the first comparative example does not transmit a high-speed data band signal. Instead, the high-speed baseband signal is frequency-converted into the millimeter wave signal S by the millimeter wave transmission device 100 according to the first embodiment and the millimeter wave signal S is transmitted. Advantages of this configuration will be hereinafter explained.

Figure 9A:
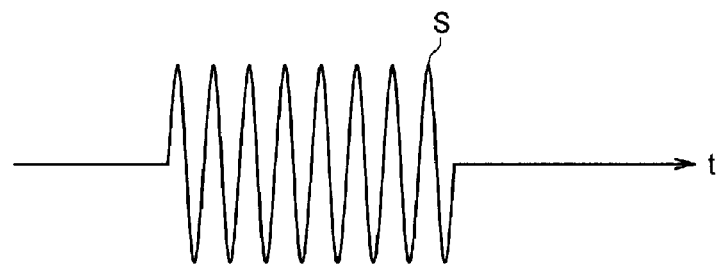
FIG. 9A is a waveform diagram illustrating an example of transmission of a signal S in a millimeter wave band after frequency conversion.
Figure 9B:
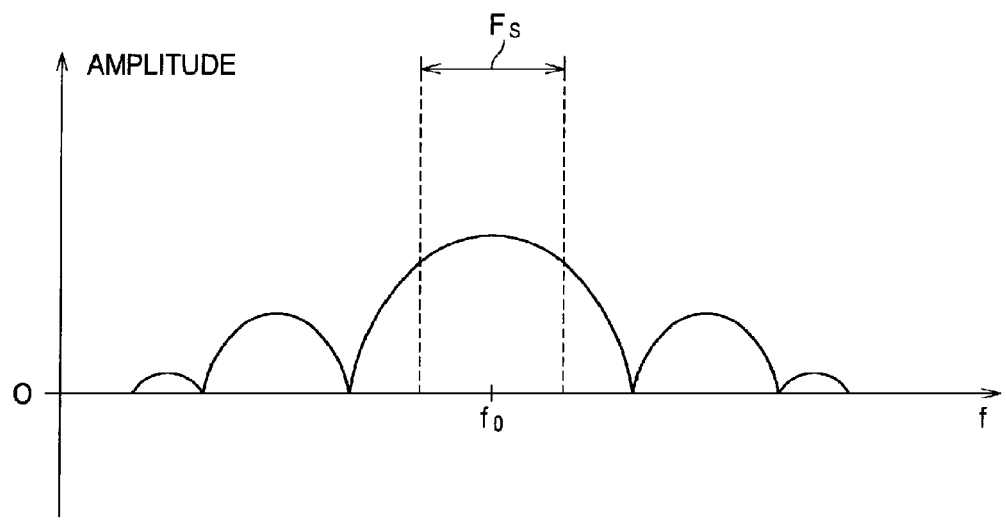
FIG. 9B is a spectrum (frequency characteristics) of the signal S in a millimeter wave band after frequency conversion.

FIG. 9A is a waveform diagram illustrating an example of transmission of the signal S in the millimeter wave band after the frequency conversion. FIG. 9B is a spectrum (frequency characteristics) of the signal S in the millimeter wave band.

In the exemplary waveform shown in FIG. 9A, the horizontal axis represents a time t, and the vertical axis represents an amplitude a. S represents a signal waveform in the millimeter wave band after the frequency conversion. In the spectrum of the signal S in the millimeter wave band shown in FIG. 9B, the horizontal axis represents a frequency t, and the vertical axis represents an amplitude. In the figure, Fs represents a symbol frequency. In the figure, Fs is 10 GHz.

In this example, the high frequency transmission apparatus 1 according to the first comparative example and the millimeter wave transmission device 100 according to the first embodiment are compared when exemplary transmission of binary data is carried out at a transmission data rate of 10 Gbps. As explained in FIG. 8D, according to the high frequency transmission apparatus 1, structures such as an antenna and electronics can be designed while attention is given to a wavelength λ from the infinite wavelength (0 Hz) to 6 cm (5 GHz) with the binary data serving as the baseband.

In contrast, in the millimeter wave transmission device 100 according to the first embodiment, binary data are frequency-converted into the millimeter wave band, and the millimeter wave signal is transmitted from the electronic component #A to the electronic component #B. For example, when a center frequency F0 is set at 60 GHz, a signal S ranging from a symbol frequency Fs of 55 GHz ((=60 GHz−(Fs/2)) to a symbol frequency Fs of 65 GHz (=60 GHz+(Fs/2)) is transmitted in order to perform transmission without any intersymbol interference according to Nyquist stability theorem.

Where the light speed in vacuum c is 3×108 m/s, and Fs is 55 GHz, the wavelength λ in vacuum is obtained as follows: c/Fs=3×108/55×109≈5.5 mm. When Fs is 65 GHz, it is obtained as follows: 3×108/65×109=4.6 mm. Therefore, according to the millimeter wave transmission device 100, structures such as an antenna and electronics can be designed with attention given to a wavelength λ from 4.6 mm to 5.5 mm. Therefore, it is easier to handle the millimeter wave transmission device 100 than the high frequency transmission apparatus 1.

As described above, according to the first embodiment, the millimeter wave transmission system can be structured between the electronic component #A and the electronic component #B. When the communication distance between the electronic component #A and the electronic component #B is short, the amplifier 208 at the reception side and the amplifier 204 at the providing side shown in FIG. 1 may be omitted.

Second Embodiment

Figure 10:
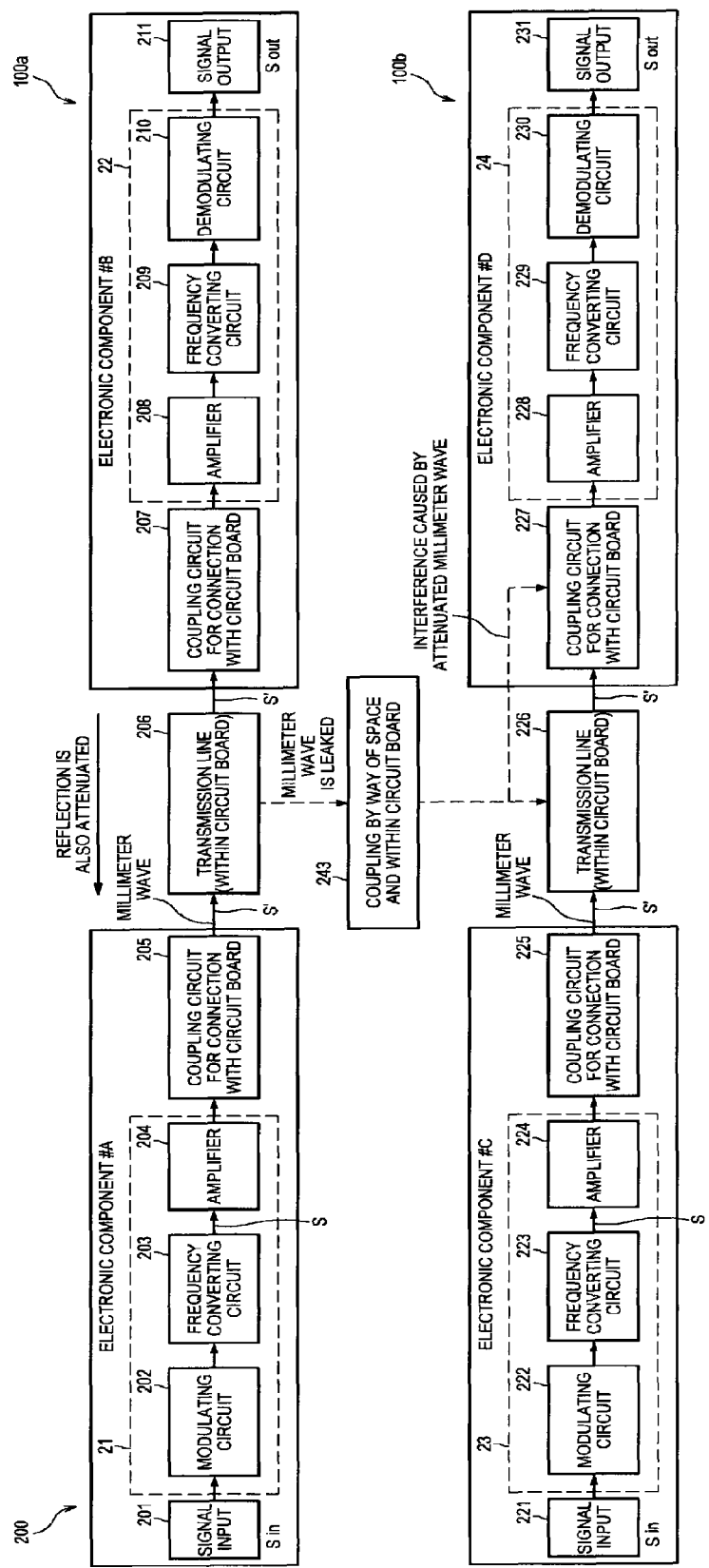
FIG. 10 is a block diagram illustrating an exemplary configuration of a millimeter wave transmission system 200 according to a second embodiment.

Subsequently, a millimeter wave transmission system 200 serving as the second embodiment will be explained with reference to FIGS. 10 to 12A. FIG. 10 is a block diagram illustrating an exemplary configuration of the millimeter wave transmission system 200 according to the second embodiment. The millimeter wave transmission system 200 shown in FIG. 10 includes a millimeter wave transmission device 100a constituting an example of a first millimeter wave transmission body and a millimeter wave transmission device 100b constituting an example of a second millimeter wave transmission body.

The millimeter wave transmission device 100a includes an electronic component #A and an electronic component #B. The explanation about the millimeter wave transmission device 100a is omitted since the millimeter wave transmission device 100 explained in the first embodiment is used. The millimeter wave transmission device 100b includes an electronic component #C and an electronic component #D. The millimeter wave transmission system 200 shown in FIG. 10 is configured as a system such that an electromagnetic wave S' based on the millimeter wave signal S is transmitted from the electronic component #A to the electronic component #B, and an electromagnetic wave S' based on the millimeter wave signal S is transmitted from the electronic component # C to the electronic component #D located at separate, independent locations on the same circuit board 10.

The millimeter wave transmission device 100b includes a third signal generation unit 23 and a signal input terminal 221 constituting the signal transmission electronic component #C, a coupling circuit 225 for coupling with the circuit board 10, a transmission line 226 using a tangible object made of a dielectric material (such as a circuit board), a coupling circuit 227 for coupling with the circuit board 10, a fourth signal generation unit 24 and a signal output terminal 231 constituting the signal reception electronic component #D.

The signal generation unit 23 and the signal generation unit 24 are respectively provided as the millimeter wave communication electronic components #A, #B constituted by CMOS-IC devices, i.e., examples of semiconductor integrated circuits. The electronic component #A and the electronic component #B are mounted on the circuit board 10 having the dielectric constant ∈. The electronic components #A, #B may not be necessarily arranged on the same surface of the same circuit board 10. Alternatively, the electronic components #A, #B may be arranged on surfaces different from each other (i.e., on the front surface and the back surface, respectively).

The third signal generation unit 23 connected to the signal input terminal 221 includes, for example, a modulating circuit 222, a frequency converting circuit 223, and an amplifier 224, in order to generate a millimeter wave signal S by processing an input signal Sin. The signal input terminal 221 is connected to the modulating circuit 222, so that the input signal Sin is modulated. Like the millimeter wave transmission device 100a, the modulating circuit 222 uses, for example, a phase modulating circuit. Alternatively, the modulating circuit 222 as well as the frequency converting circuit 223 may use a so-called direct conversion method.

The modulating circuit 222 is connected to the frequency converting circuit 223. Accordingly, the input signal Sin modulated by the modulating circuit 222 is converted into a frequency in a range of 30 GHz to 300 GHz, so that the millimeter wave signal S is generated. The frequency converting circuit 223 is connected to the amplifier 224. Accordingly, after the millimeter wave signal S is subjected to frequency conversion, the signal S is amplified.

The amplifier 224 is connected to the coupling circuit 225 constituting an example of a third signal coupling unit. The amplifier 224 transmits the millimeter wave signal generated by the signal generation unit 23 to an end of a tangible object (tangible object made of a dielectric material) having a predetermined dielectric constant ∈. The coupling circuit 225 is constituted by an antenna member having a predetermined length based on a wavelength λ of the millimeter wave signal S, i.e., about 600 μm, and is coupled to the tangible object having the dielectric constant ∈. In this embodiment, a region of the circuit board 10 having the dielectric constant ∈ is also used for the tangible object. The region of the circuit board 10 having the dielectric constant ∈ constitutes the transmission line 226. Accordingly, a millimeter wave electromagnetic wave S' propagates in the transmission line 226. When a dielectric loss tangent δ is large, the transmission line 226 has a relatively large loss, which also reduces the reflection. Therefore, a large dielectric loss tangent δ is preferable than a small dielectric loss tangent δ.

The transmission line 226 is connected to the coupling circuit 227 constituting an example of a fourth signal coupling unit. The transmission line 226 receives an electromagnetic wave S' based on the millimeter wave signal S from the other end of the transmission line 226. The coupling circuit 227 is constituted by an antenna member having a predetermined length based on the wavelength λ of the millimeter wave signal S, i.e., about 600 μm. Like the first embodiment, the antenna member is, for example, a probe antenna (dipole), a loop antenna, and a small aperture-coupled device (such as slot antenna).

The coupling circuit 227 is connected to the fourth signal generation unit 24. The fourth signal generation unit 24 processes the electromagnetic wave S' based on the millimeter wave signal S received by the coupling circuit 227. More particularly, the fourth signal generation unit 24 demodulates the electromagnetic wave S'. Thereby, the fourth signal generation unit 24 generates an output signal Sout corresponding to the input signal Sin to be transmitted and processed by the electronic component #C. The signal generation unit 24 includes, for example, an amplifier 228, a frequency converting circuit 229, and a demodulating circuit 230. Alternatively, the frequency converting circuit 229 as well as the demodulating circuit 230 may use a so-called direct conversion method. The coupling circuit 227 is connected to the amplifier 228, so that the amplifier 228 can amplify the received millimeter wave signal.

The amplifier 228 is connected to the frequency converting circuit 229. The frequency converting circuit 229 converts the frequency of the amplified millimeter wave signal S. The frequency converting circuit 229 is connected to the demodulating circuit 230. The demodulating circuit 230 demodulates the output signal having been subjected to the frequency conversion.

In this example, the signal generation unit 23 and the signal generation unit 24 are also respectively provided as the millimeter wave communication electronic components #C, #D constituted by CMOS-IC devices, i.e., examples of semiconductor integrated circuits. The electronic component #C and the electronic component #D as well as the electronic component #A and the electronic component #B constituting the millimeter wave transmission device 100a are mounted on the circuit board 10 having the dielectric constant ∈. The electronic components #C, #D may not be necessarily arranged on the same surface of the same circuit board 10. Alternatively, the electronic components #C, #D may be arranged on surfaces different from each other (i.e., on the front surface and the back surface, respectively).

Although not shown in the figure, the circuit board 10 may be arranged not only with the millimeter wave communication electronic components #A, #B, #C, #D but also with passive elements such as resistor devices, capacitor devices, and transformers, and active elements such as transistors and semiconductor integrated circuits, which are used for signal processing in a baseband region.

For example, electronic components (passive elements and active elements) used for signal processing in a baseband region can be mounted in a space between the electronic components #A, #B on the circuit board 10 regardless of the sizes of the components (see FIG. 12A explained below). Likewise, the transmission line 226 is formed within the circuit board 10 in such a manner that the transmission line 226 is formed between a third region of the circuit board 10 including the electronic component #C including the coupling circuit 225 constituting an example of the third signal coupling unit and the third signal generation unit 23 and a fourth region of the circuit board 10 including the electronic component #D including the coupling circuit 227 constituting an example of the fourth signal coupling unit and the fourth signal generation unit 24. Therefore, it is not necessary to consider the millimeter wave transmission therebetween on the circuit board 10. Therefore, for example, electronic components (passive elements and active elements) used for signal processing in a baseband region can be mounted in a space between the electronic components #C, #D on the circuit board 10 regardless of the sizes of the components (see FIG. 12A explained below).

As can be understood from the explanation above, the millimeter wave transmission system 200 according to the second embodiment includes the millimeter wave transmission device 100a and the millimeter wave transmission device 100b, which are mounted on the same circuit board 10. In this case, a space therebetween and a region of the circuit board 10 form a coupling medium 243 between the transmission line 206 of the millimeter wave transmission device 100a and the transmission line 226 of the millimeter wave transmission device 100b. Therefore, interference (communication interference) may occur between the millimeter wave transmission device 100a and the millimeter wave transmission device 100b.

However, when the dielectric loss tangent δ of the circuit board 10 is not small (i.e., large), a large loss in the circuit board 10 can reduce the leak of the millimeter wave from the transmission line 206 of the millimeter wave transmission device 100a via the coupling medium 243 to the transmission line 226 of the millimeter wave transmission device 100b. In this case, it is considered that the coupling state via the coupling medium 243 formed in the space therebetween is small. Therefore, when the dielectric loss tangent δ of the circuit board 10 is not small (i.e., large) in the second embodiment, it is possible to significantly reduce the interference caused by the millimeter wave.

In addition, according to the mechanism of the second embodiment, the millimeter wave transmission device 100a and the millimeter wave transmission device 100b mounted on the same circuit board 10 are arranged spaced apart by a certain distance, and it is not necessary to consider the millimeter wave transmission in a free section in the space therebetween. Therefore, for example, passive elements (such as resistor devices, capacitor devices, and transformers) and active elements (such as transistors and semiconductor integrated circuits), which are used for signal processing in a baseband region, can be mounted in the space between the millimeter wave transmission devices 100a, 100b regardless of the sizes of the components (see FIG. 12A explained below).

Figure 11:
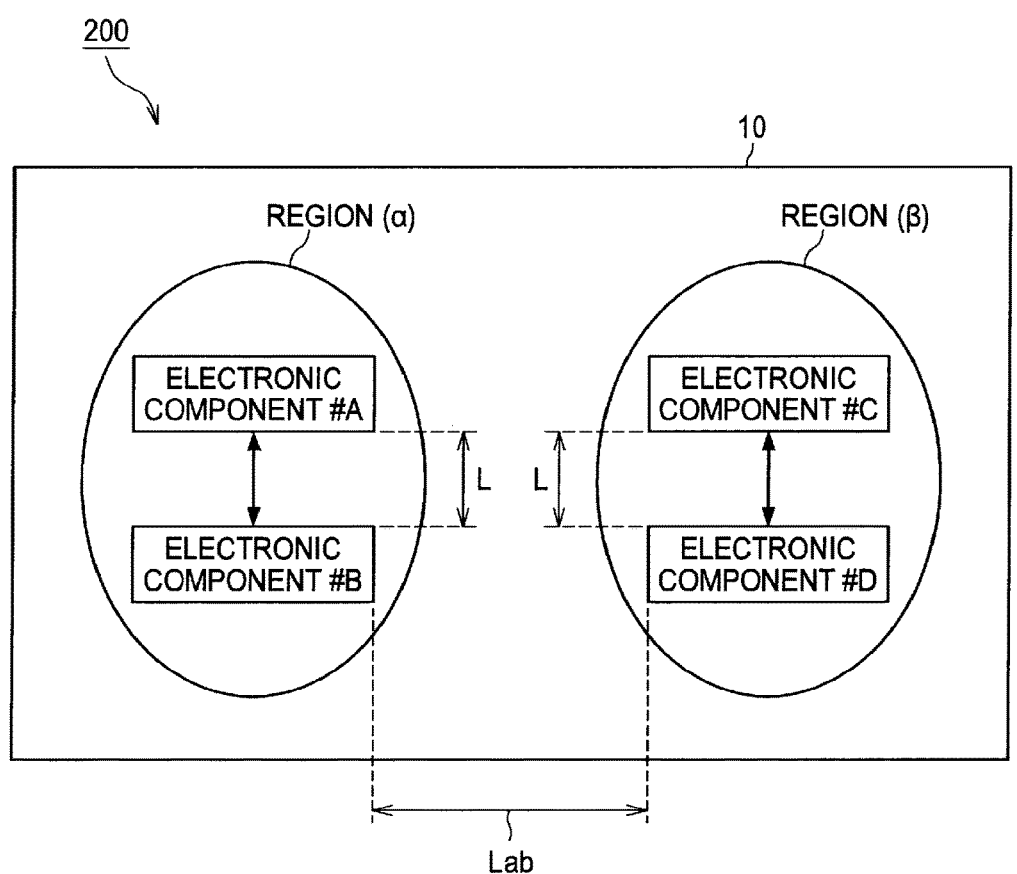
FIG. 11 is a top view illustrating an exemplary arrangement of four electronic components #A, #B, #C, #D in the millimeter wave transmission system 200.

FIG. 11 is a top view illustrating an exemplary arrangement of four electronic components #A, #B, #C, #D in the millimeter wave transmission system 200. Two regions (α) and (β) are allocated on the circuit board 10 shown in FIG. 11. In the region (α), the electronic component #A and the electronic component #B are arranged spaced apart in the longitudinal direction by a predetermined distance, i.e., about several millimeters to several dozen centimeters.

In the region (β) shown in the figure, the electronic component #C and the electronic component #D are arranged spaced apart in the longitudinal direction by a predetermined separating distance L, i.e., about several millimeters to several dozen centimeters. An arrangement gap Lab between the electronic component #A of the region (α) and the electronic component #C of the region (β) is set at a value about three times larger than the separating distance L in the longitudinal direction. The electronic component #A is arranged in the region (α), and the electronic component #C is arranged in the region (β) in a lateral direction thereto. Further, an arrangement gap between the electronic component #B of the region (α) and the electronic component #D of the region (β) is also set at a value about three times larger than the separating distance L in the longitudinal direction, and the electronic component #B and the electronic component #D are arranged in the lateral direction. As described above, when they are arranged spaced apart by the gap about three times larger than the separating distance L, even if the electromagnetic wave S' based on the millimeter wave signal S leaks from the line between the electronic components #A, #B to the line between the electronic components #C, #D, the leak can be attenuated while it propagates.

In the millimeter wave transmission system 200 as described above, it is possible to reduce the coupling state via the coupling medium 243 such as the inside of the circuit board 10 having a large loss and the space thereof. Compared with a circuit board having a small loss, it is possible to greatly improve isolation between the electronic components #A, #B and between the electronic components #C, #D during communication therebetween.

Although not shown in FIG. 11, electronic components (passive elements and active elements), used for signal processing in a baseband region, can be mounted between the electronic component #A of the region (α) and the electronic component #C of the region (β) as shown in FIG. 12A explained later.

FIG. 12A is a perspective view illustrating an exemplary implementation of transmission lines 206, 226 and the electronic components #A, #B, #C, #D in the millimeter wave transmission system 200. In the millimeter wave transmission device 100a shown in FIG. 12A, the signal transmission electronic component #A and the signal reception electronic component #B are mounted in the region (α), so that the millimeter wave signal is transmitted from the electronic component #A to the electronic component #B.

In this millimeter wave transmission device 100a, the electronic component #A includes a signal generation unit 21, a coupling circuit 205, and a signal input terminal 201 shown in FIG. 10, and the electronic component #B includes a coupling circuit 207, a signal generation unit 22, and a signal output terminal 211. The electronic component #A and the electronic component #B are mounted on the circuit board 10 having the dielectric constant ∈. In this example, a through hole fence portion 10b may also be arranged to define the region (α) (See FIG. 2A).

The transmission line 206 is arranged between the electronic component #A and the electronic component #B on the circuit board 10. As shown in FIG. 2A, the transmission line 206 is constituted by a transmission region I defined in the circuit board 10 made of glass epoxy resin and having a large loss, which includes the electronic component #A and the electronic component #B. Although not shown in FIG. 12A, for example, the transmission line 206 is defined by a plurality of through holes 10a penetrating the circuit board 10 in this example (see FIG. 2A). The above method for making the transmission line 206 is merely an example.

In this millimeter wave transmission device 100b, the electronic component #C includes a signal input terminal 221, a signal generation unit 23, and a coupling circuit 225 shown in FIG. 10, and the electronic component #D includes a coupling circuit 227, a signal generation unit 24, and a signal output terminal 231. Like the electronic component #A and the electronic component #B, the electronic component #C and the electronic component #D are mounted on the same circuit board 10 having the dielectric constant ∈. In this example, a through hole fence portion 10b may also be arranged to define the region (β) (See FIG. 2A).

The transmission line 226 is arranged between the electronic component #C and the electronic component #D on the circuit board 10. As shown in FIG. 2A, the transmission line 226 is constituted by a transmission region I defined in the circuit board 10 made of glass epoxy resin and having a large loss, which includes the electronic component #C and the electronic component #D mounted thereon. Although not shown in FIG. 12A, for example, the transmission line 226 is defined by a plurality of through holes 10a penetrating the circuit board 10 in this example (see FIG. 2A). The above method for making the transmission line 226 is merely an example.

Passive elements such as resistor devices 280, capacitor devices 282, and transformers 284 and active elements such as transistors 290 and semiconductor integrated circuits 292, which are used for signal processing in a baseband region, are mounted in the space between the region (α) including the millimeter wave transmission device 100a and the region (β) including the millimeter wave transmission device 100b mounted on the same circuit board 10.

As described above, according to the millimeter wave transmission system 200 of the second embodiment, the millimeter wave transmission device 100a and the millimeter wave transmission device 100b are arranged on the same circuit board 10 made of glass epoxy resin having a large loss. In the region (α), the electromagnetic wave S' based on the millimeter wave signal S is transmitted from the electronic component #A to the electronic component #B. In the region (β) located at separate, independent location on the same circuit board 10, the electromagnetic wave S' based on the millimeter wave signal S is transmitted from the electronic component #C to the electronic component #D.

Therefore, even when the setting of the carrier frequency from the electronic component #A to the electronic component #B in the region (α) and the setting of the carrier frequency from the electronic component #C to the electronic component #D in the region (β) are the same on the same circuit board 10 by making use of the loss of the circuit board 10, the issue of the communication interferences between the regions (α), (β) does not occur. Therefore, it is easy to reuse the carrier frequency.

SECOND COMPARATIVE EXAMPLE

Figure 12B:
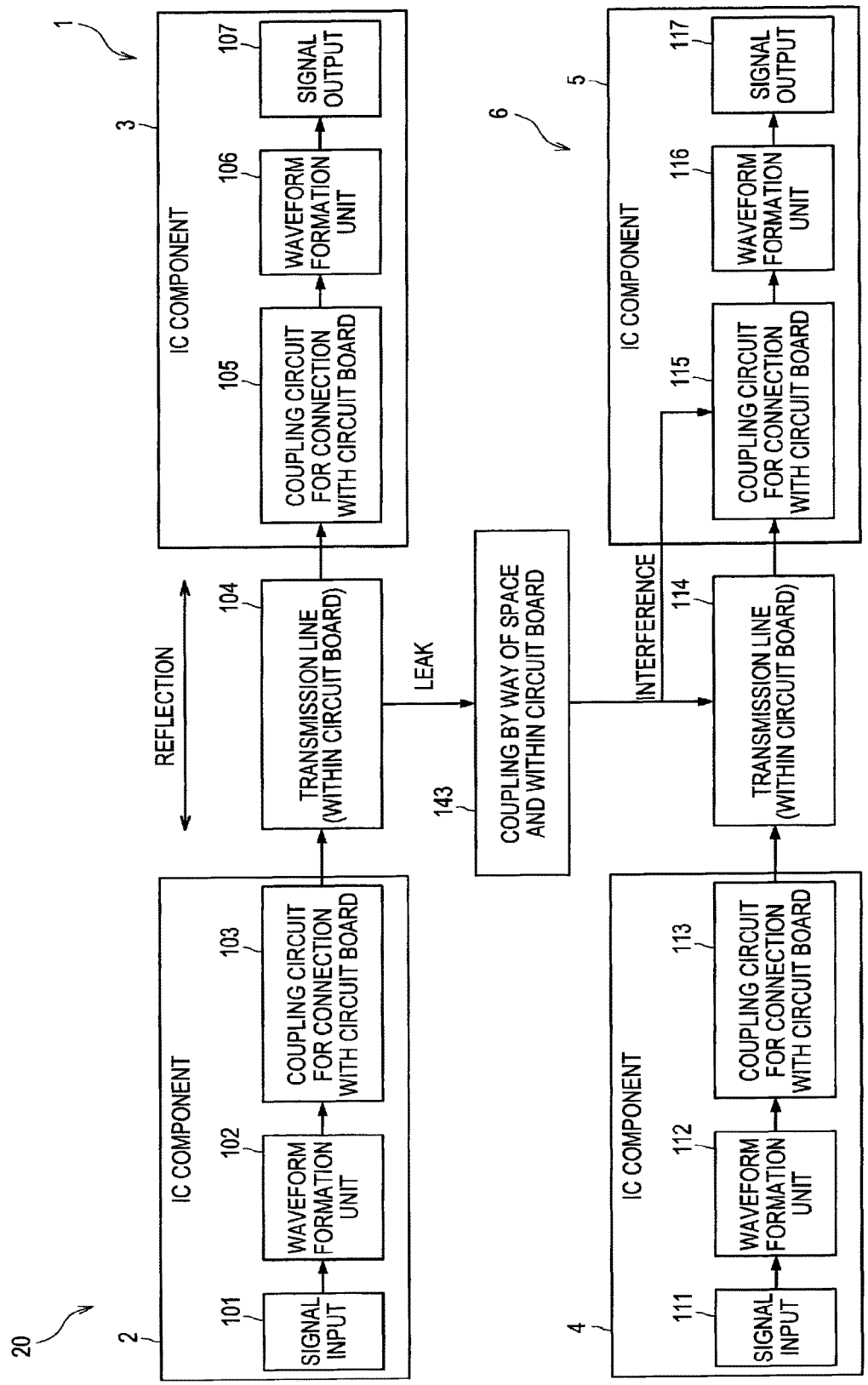
FIG. 12B is a block diagram illustrating an exemplary configuration of a high frequency signal transmission system 20 according to the second comparative example.

FIG. 12B is a figure illustrating a second comparative example corresponding to the second embodiment. FIG. 12B is a block diagram illustrating an exemplary configuration of a high-speed baseband signal transmission system according to the second comparative example.

A high frequency transmission system 20 according to the second comparative example includes a plurality of high frequency transmission apparatuses 1 according to the first comparative example shown in FIG. 8B on the same circuit board. In other words, the high frequency transmission system 20 according to the second comparative example includes the high frequency transmission apparatus 1 according to the first comparative example shown in FIG. 8B and another high frequency transmission apparatus 6 having the same functions as the high frequency transmission apparatus 1, wherein the high frequency transmission apparatus 1 and the high frequency transmission apparatus 6 are mounted on the same circuit board.

An IC component 4 includes a signal input terminal 111, a waveform formation unit 112, and a coupling circuit 113 for coupling with the circuit board. An IC component 5 includes a coupling circuit 115 for coupling with the circuit board, a waveform formation unit 116, and a signal output terminal 117. A transmission line 114 having a small loss is arranged between the coupling circuit 113 of the IC component 4 and the coupling circuit 115 of the IC component 5. For example, high-speed baseband signals for an enormous amount of information such as movie images and computer images are transmitted from the IC component 4 to the IC component 5 independently from the high frequency transmission apparatus 1.

The "transmission line 114 having a small loss" means that a dielectric loss tangent δ of the member forming the transmission line 114 (in this example, circuit board) is smaller than the dielectric loss tangent δ of the dielectric material constituting the circuit board 10 used in the first embodiment.

As can be understood from the explanation above, the high frequency transmission system 20 according to the second comparative example includes the high frequency transmission apparatus 1 and a high-speed baseband signal transmission apparatus 2, which are mounted on the same circuit board having a small loss. In this case, a space therebetween and a region of the circuit board having a small loss form a coupling medium 143 between the transmission line 104 of the high frequency transmission apparatus 1 and the transmission line 114 of the high-speed baseband signal transmission apparatus 2. Therefore, interference (communication interference) occurs between the high-speed baseband signal transmission apparatuses, when the plurality of high-speed baseband signal transmission apparatuses are mounted on the same circuit board having a small loss.

The transmission line 104 and the transmission line 114 are coupled via a free space and within the circuit board having a small loss. When a low frequency signal is transmitted, the loss of the free space is small, and the dielectric material loss makes little influence. A transmission loss in free space is proportional to a square of a frequency. However, on the side of the IC component 4, the IC component 5, and the like on the circuit board on which the transmission line 114 having a small loss is mounted, the transmission line 114 is easily affected by the interference caused by the transmission line 104, i.e., the interference caused by the signal transmitted from the IC component 2. Moreover, interference caused by a baseband signal having a low frequency is less likely to be attenuated, which is also a cause of transmission error. As described above, in the second comparative example, the high-speed baseband signal has issues of reflection, interference, a large fractional bandwidth (=necessary bandwidth/operation center frequency).

In contrast, the mechanism of the second embodiment is configured such that, preferably, the tangible object made of a dielectric material for making the circuit board 10 is not a material having a small dielectric loss tangent δ but is a material having a large dielectric loss tangent δ, so that the coupling medium 243 has a large loss. Therefore, even when the plurality of millimeter wave transmission devices 100 are mounted on the same circuit board, the high-speed signal transmission system which causes lower degree of interferences and reflections can be realized.

Third Embodiment

Subsequently, a millimeter wave transmission system 300 serving as the third embodiment will be explained with reference to FIGS. 13 to 15. Elements having the same names as those of the first and second embodiments have the same functions, and therefore, description thereabout is omitted.

FIG. 13 is a block diagram illustrating an exemplary configuration of the millimeter wave transmission system 300 according to the second embodiment. In this embodiment, a plurality of millimeter wave transmission devices 100 are arranged on the same circuit board, and are further coupled with a coupling medium transmitting a millimeter wave signal, so that an electromagnetic wave S' based on the millimeter wave signal S is propagated.

The millimeter wave transmission system 300 shown in FIG. 13 includes a millimeter wave transmission device 100c and a millimeter wave transmission device 100d which are arranged on the same plane of the circuit board 10, and includes a low-loss waveguide structure 341 constituting an example of a coupling medium, wherein the waveguide structure 341 is formed on a layer different from the circuit board 10 or the same layer. The millimeter wave transmission device 100c and the millimeter wave transmission device 100d are connected by a waveguide, for example (see FIG. 15). Members such as the millimeter wave transmission devices 100c, 100d and the waveguide connecting therebetween are arranged in the same electronic apparatus.

The "low-loss waveguide structure 341" means that the dielectric loss tangent δ of the member forming the waveguide formed with the waveguide structure 341 (including air when it is free space) is smaller than the dielectric loss tangent δ of the dielectric material constituting the circuit board 10 used in the third embodiment.

The millimeter wave transmission device 100c includes the electronic component #A and the electronic component #B on the circuit board 10 having the dielectric constant ∈. The signal transmission electronic component #A of the millimeter wave transmission device 100c includes a signal generation unit 25, a signal input terminal 301, and a coupling circuit 305 for coupling with the circuit board 10. On the circuit board 10, a transmission line 306 having a large loss is structured. The signal generation unit 25 includes a modulating circuit 302, a frequency converting circuit 303, and an amplifier 304.

The signal reception electronic component #B includes a coupling circuit 307 for coupling with the circuit board 10, a signal generation unit 26, and a signal output terminal 311. The signal generation unit 26 includes an amplifier 308, a frequency converting circuit 309, and a demodulating circuit 310. The signal generation unit 25 and the signal generation unit 26 are constituted by CMOS-IC devices, i.e., examples of semiconductor integrated circuits.

The millimeter wave transmission device 100d includes the electronic component #C and the electronic component #D on the circuit board 10 having a dielectric constant ∈. The signal transmission electronic component #C includes a signal input terminal 321, a signal generation unit 27, and a coupling circuit 325 for coupling with the circuit board 10. The signal generation unit 27 includes a modulating circuit 322, a frequency converting circuit 323, and an amplifier 324.

Preferably, the tangible object made of a dielectric material for making the circuit board 10 is not a material having a small dielectric loss tangent δ but is a material having a large dielectric loss tangent δ (such as glass epoxy resin), so that the transmission lines 306, 326 have large losses.

The signal reception electronic component #D includes a coupling circuit 327 for coupling with the circuit board 10, a signal generation unit 28, and a signal output terminal 331. The signal generation unit 28 includes an amplifier 328, a frequency converting circuit 329, and a demodulating circuit 330. The signal generation unit 27 and the signal generation unit 28 are constituted by CMOS-IC devices, i.e., examples of semiconductor integrated circuits.

The low-loss waveguide structure 341 is made with, e.g., a waveguide. The low-loss waveguide structure 341 is configured to connect between the coupling circuit 305 arranged at the side of the electronic component #A for coupling with the circuit board 10 and the coupling circuit 327 arranged at the side of the electronic component #D for coupling with the circuit board 10.

As described above, the millimeter wave transmission system 300 shown in FIG. 13 is configured as a system in which the electromagnetic wave S' based on the millimeter wave signal S is transmitted from the electronic component #A to the electronic component #B, and the electromagnetic wave S' based on the millimeter wave signal S is transmitted from the electronic component #C to the electronic component #D located at separate, independent locations on the same circuit board 10. Further, the electromagnetic wave S' based on the millimeter wave signal S can be transmitted from the electronic component #A to the electronic component #D via the low-loss waveguide structure 341.

Figure 14:
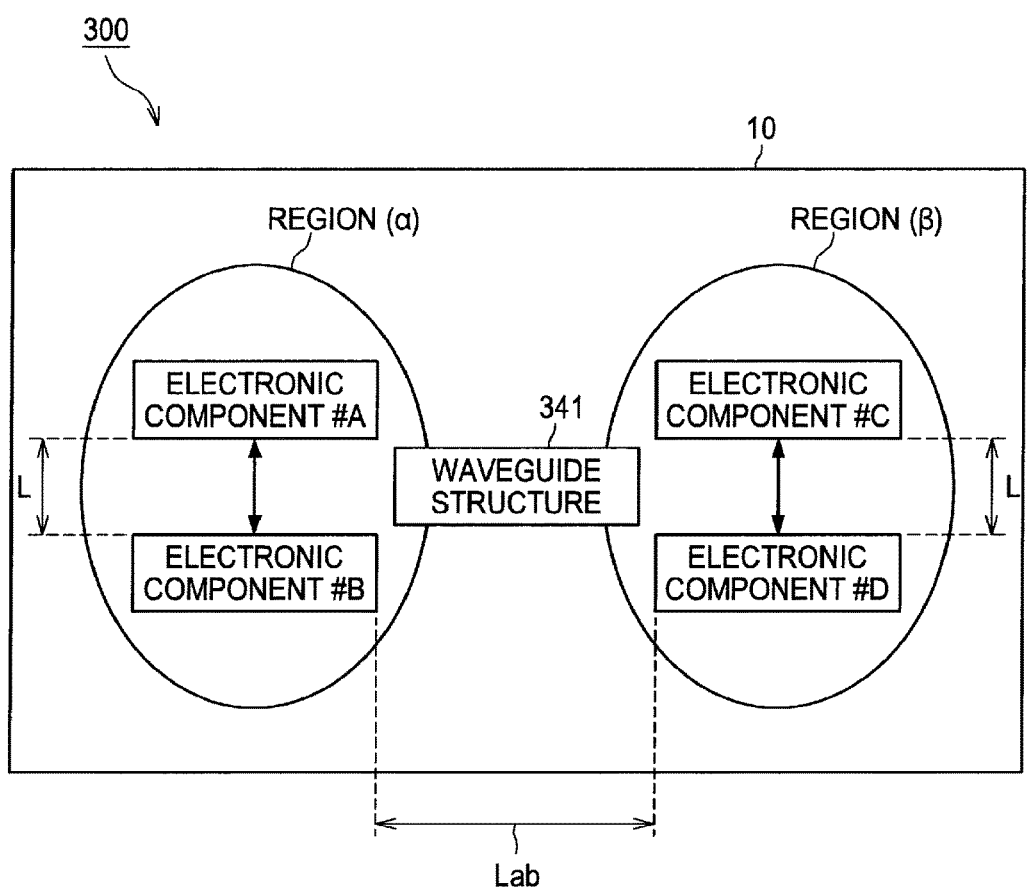
FIG. 14 is a top view illustrating an exemplary arrangement of a waveguide structure 341 and the four electronic components #A, #B, #C, #D in the millimeter wave transmission system 300.

FIG. 14 is a top view illustrating an exemplary arrangement of a waveguide structure 341 and the four electronic components #A, #B, #C, #D in the millimeter wave transmission system 300. Two regions (α) and (β) are allocated on the circuit board 10 having a large loss as shown in FIG. 14. Like the second embodiment, in the region (α), the electronic component #A and the electronic component #B are arranged spaced apart in the longitudinal direction by a predetermined distance, i.e., about several millimeters to several dozen centimeters.

Like the second embodiment, in the region (β) shown in the figure, the electronic component #C and the electronic component #D are arranged spaced apart in the longitudinal direction by a predetermined separating distance L, i.e., about several millimeters to several dozen centimeters. An arrangement gap Lab between the electronic component #A of the region (α) and the electronic component #C of the region (β) is set at a value about three times larger than the separating distance L in the longitudinal direction. The electronic component #A is arranged in the region (α), and the electronic component #C is arranged in the region (β) in a lateral direction thereto. Further, an arrangement gap between the electronic component #B of the region (α) and the electronic component #D of the region (β) is also set at a value about three times larger than the separating distance L in the longitudinal direction, and the electronic component #B and the electronic component #D are arranged in the lateral direction.

The waveguide structure 341 constitutes an example of the coupling medium, and is a layer different from the circuit board 10 having a large loss. Two regions (α) and (β) are arranged so that the waveguide links the two regions (α) and (β). The waveguide is a metal pipe or a conductive resin pipe having a space therein. The free space of the waveguide has a dielectric constant ∈0 to propagate the electromagnetic wave S' based on the millimeter wave signal S. ∈0 is a dielectric constant in vacuum. ∈0 is 8.854187817×10^(−12) (F/m). Preferably the waveguide portion of the waveguide structure 341 is made with a material having a smaller (different) loss than the material of the circuit board 10 having a large loss in the millimeter wave band. As described above, the millimeter wave transmission system 300 is configured as a system in which the electromagnetic wave S' based on the millimeter wave signal S can be transmitted from the electronic component #A of the region (α) to the electronic component #D of the region (β) via the low-loss waveguide structure 341. It is to be understood that the waveguide structure 341 may not be made of a hollow waveguide having a metal wall. Where the relative permittivity is ∈r, the waveguide structure 341 may be made of a dielectric material line having a dielectric constant ∈=∈0·∈r.

Figure 15:
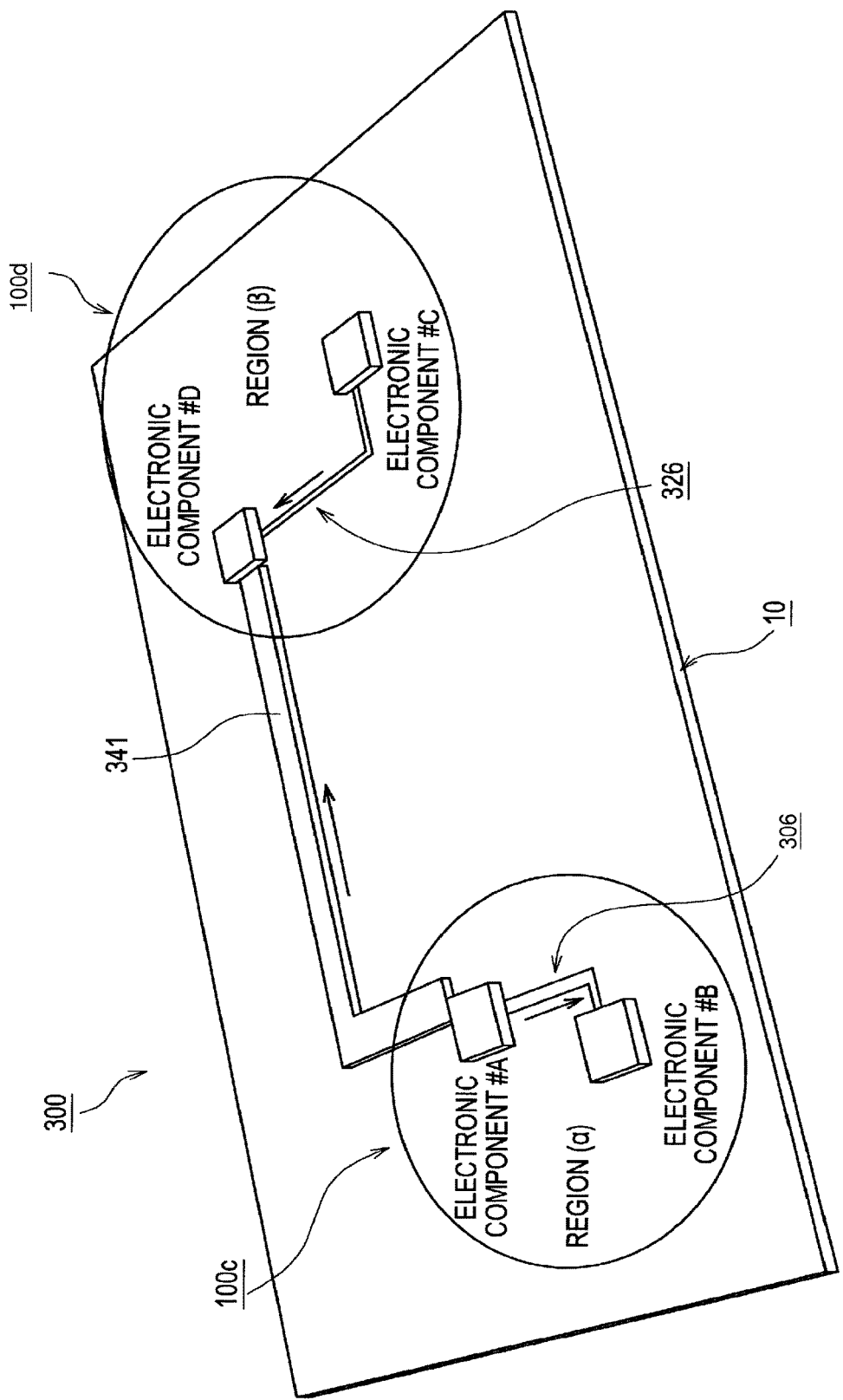
FIG. 15 is a perspective view illustrating an exemplary implementation of the waveguide structure 341, transmission lines 306, 326, and the electronic components #A, #B, #C, #D, in the millimeter wave transmission system 300.

FIG. 15 is a perspective view illustrating an exemplary implementation of the waveguide structure 341, the transmission lines 306, 326, and the electronic components #A, #B, #C, #D, in the millimeter wave transmission system 300. In the millimeter wave transmission system 300 shown in FIG. 15, the millimeter wave transmission device 100c includes the signal transmission electronic component #A and the signal reception electronic component #B mounted in the region (α), so that the millimeter wave signal is transmitted from the electronic component #A to the electronic component #B.

In this millimeter wave transmission device 100c, the electronic component #A includes a signal input terminal 301, a signal generation unit 25, and a coupling circuit 305 shown in FIG. 13, and the electronic component #B includes a coupling circuit 307, a signal generation unit 26, and a signal output terminal 311. The electronic component #A and the electronic component #B are mounted on the circuit board 10 having the dielectric constant ∈. Also in this example, through a hole fence portion 10b may be arranged to define the region (α) (See FIG. 2A).

The transmission line 306 is arranged between the electronic component #A and the electronic component #B on the circuit board 10. As shown in FIG. 2A, the transmission line 306 is constituted by a transmission region I defined in the circuit board 10 made of glass epoxy resin and having a large loss, which includes the electronic component #A and the electronic component #B mounted thereon. Although not shown in FIG. 15, the transmission line 306 is defined by a plurality of through holes 10a penetrating the circuit board 10 in this example (see FIG. 2A).

In the millimeter wave transmission device 100d, the electronic component #C includes a signal input terminal 321, a signal generation unit 27, and a coupling circuit 325 shown in FIG. 13, and the electronic component #D includes a coupling circuit 327, a signal generation unit 28, and a signal output terminal 331. Like the electronic component #A and the electronic component #B, the electronic component #C and the electronic component #D are mounted on the same circuit board 10 having the dielectric constant ∈. Also in this example, a through hole fence portion 10b may be arranged to define the region (β) (See FIG. 2A).

The transmission line 326 is arranged between the electronic component #C and the electronic component #D on the circuit board 10. As shown in FIG. 2A, the transmission line 326 is constituted by a transmission region I defined in the same circuit board 10 made of glass epoxy resin and having a large loss, which includes the electronic component #C and the electronic component #D mounted thereon. Although not shown in FIG. 15, for example, the transmission line 326 is defined by a plurality of through holes 10a penetrating the circuit board 10 in this example (see FIG. 2A). The through hole 10a may be a contact hole filled with conductive material for electrically connecting an upper conductive layer and a lower conductive layer. The contact hole filled with conductive material constitutes an example of a plurality of cylindrical conductive members for connecting conductive layers.

Further, the low-loss waveguide structure 341 is arranged between the electronic component #A and the electronic component #D on the circuit board 10.

As described above, according to the millimeter wave transmission system 300 of the third embodiment, the low-loss waveguide structure 341 is arranged between the electronic component #A of the region (α) and the electronic component #D of the region (β) shown in FIG. 15, and the electromagnetic wave S' based on the millimeter wave signal S is propagated through the waveguide structure 341 from the electronic component #A to the electronic component #D. Therefore, interference between the region (α) and the region (β) can be reduced. In addition, a high-speed millimeter wave signal S can be transmitted/received between the region (α) and the region (β).

Accordingly, when several points in the limited communication range are desired to be linked, the waveguide structure 341 having a small loss in the millimeter wave band is arranged at an upper portion of the circuit board 10, in the inside of the circuit board 10, or at a lower portion thereof, so that high-speed millimeter wave communication can be performed between a plurality of local points. When the waveguide structure 341 arranged at the upper portion or the lower portion of the circuit board 10 is configured as movable or variable type, control is performed to select which two of the electronic components #A, #B, #C, #D on the circuit board 10 are selected, and communication processing can be performed based on the selection of the destination of communication.

Fourth Embodiment

Figure 16:
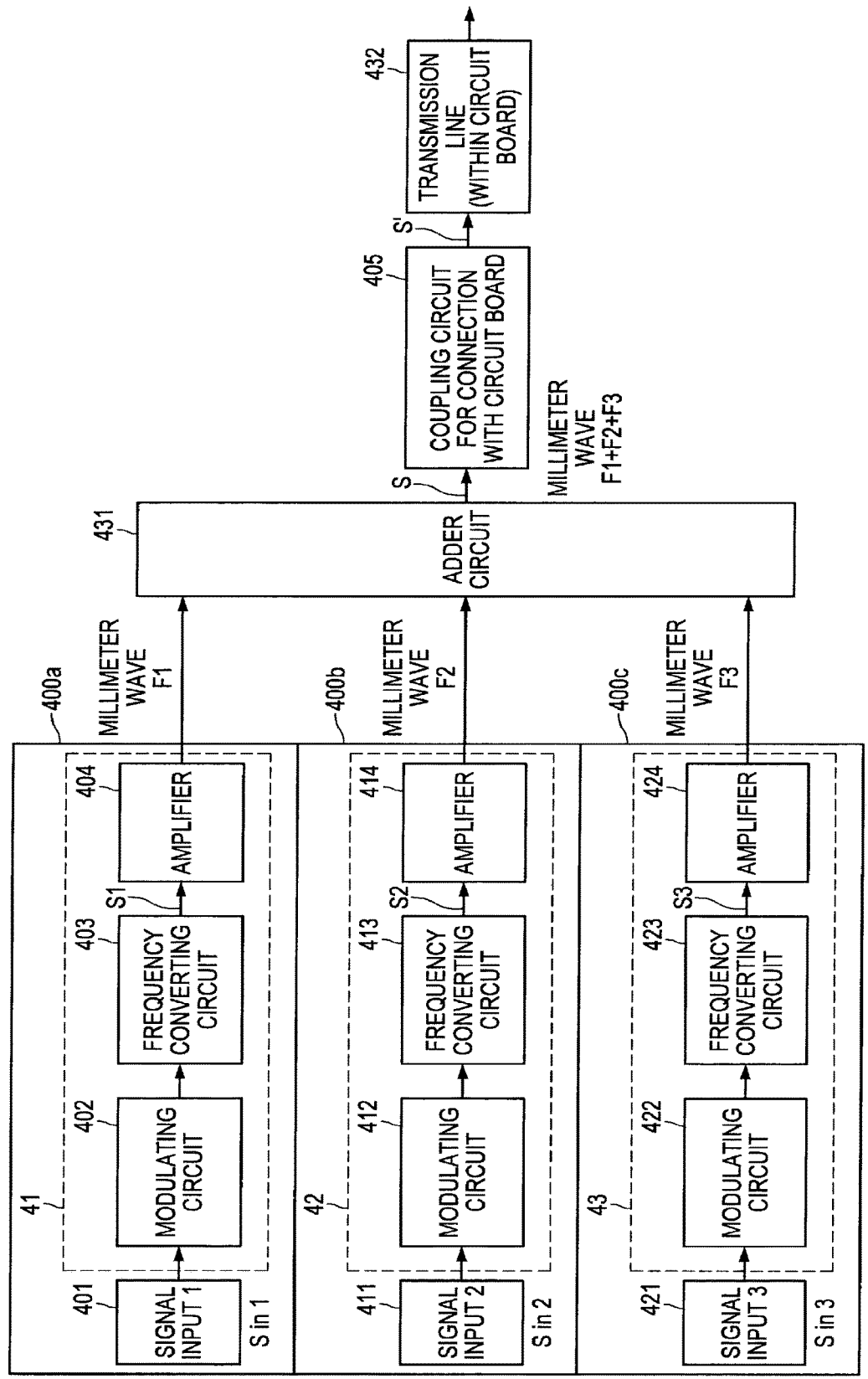
FIG. 16 is a block diagram illustrating an exemplary configuration of a millimeter wave transmission device 400 according to a fourth embodiment.

Subsequently, a millimeter wave transmission device 400 serving as the fourth embodiment will be explained with reference to FIGS. 16 and 17. FIG. 16 is a block diagram illustrating an exemplary configuration of the millimeter wave transmission device 400 according to the fourth embodiment. The signal multiplex-enabled millimeter wave transmission device 400 shown in FIG. 16 includes a plurality of, i.e., three, millimeter wave transmission devices 400a, 400b, 400c, an adder circuit 431, a coupling circuit 405 for coupling with the circuit board 10, and a transmission line 432. Millimeter wave signals S1, S2, S3 provided by the millimeter wave transmission devices 400a, 400b, 400c are added and output to the transmission line 432.

Preferably, the tangible object made of a dielectric material for making the circuit board 10 is not a material having a small dielectric loss tangent δ but is a material having a large dielectric loss tangent δ, so that the transmission line 432 has a large loss.

The millimeter wave transmission device 400a includes a terminal 401 for signal input 1 and a signal generation unit 41, so as to output a millimeter wave signal S1 in a frequency band F1 to the adder circuit 431. The signal generation unit 41 includes a modulating circuit 402, a frequency converting circuit 403, and an amplifier 404.

The modulating circuit 402 modulates the input signal Sin1, and outputs the modulated input signal Sin1 to the frequency converting circuit 403. Like the first to third embodiments, the modulating circuit 402 uses, for example, a phase modulating circuit. The modulating circuit 402 is connected to the frequency converting circuit 403. The input signal Sin1 modulated by the modulating circuit 402 is converted into a frequency in the range of the frequency band F1, so that the millimeter wave signal S1 is generated. The frequency converting circuit 403 is connected to the amplifier 404, so that the amplifier 404 amplifies the millimeter wave signal S1 having been subjected to the frequency conversion.

The millimeter wave transmission device 400b includes a terminal 411 for signal input 2 and a signal generation unit 42, so as to output a millimeter wave signal S2 in a frequency band F2, which is different from the frequency band F1, to the adder circuit 431. The signal generation unit 42 includes a modulating circuit 412, a frequency converting circuit 413, and an amplifier 414.

The modulating circuit 412 modulates the input signal Sin2, and outputs the modulated input signal Sin2 to the frequency converting circuit 413. Like the first to third embodiments, the modulating circuit 412 uses a phase modulating circuit and the like. The modulating circuit 412 is connected to the frequency converting circuit 413. The input signal Sin2 modulated by the modulating circuit 412 is converted into a frequency in the range of the frequency band F2, so that the millimeter wave signal S2 is generated. The frequency converting circuit 413 is connected to the amplifier 414, so that the amplifier 414 amplifies the millimeter wave signal S2 having been subjected to the frequency conversion.

The millimeter wave transmission device 400c includes a terminal 421 for signal input 3 and a signal generation unit 43, so as to output a millimeter wave signal S3 in a frequency band F3, which is different from the frequency bands F1, F2, to the adder circuit 431. The signal generation unit 43 includes a modulating circuit 422, a frequency converting circuit 423, and an amplifier 424.

The modulating circuit 422 modulates the input signal Sin3, and outputs the modulated input signal Sin3 to the frequency converting circuit 423. Like the first to third embodiments, the modulating circuit 422 uses a phase modulating circuit and the like. The modulating circuit 422 is connected to the frequency converting circuit 423. The input signal Sin3 modulated by the modulating circuit 422 is converted into a frequency in the range of the frequency band F3, so that the millimeter wave signal S3 is generated. The frequency converting circuit 423 is connected to the amplifier 424, so that the amplifier 424 amplifies the millimeter wave signal S3 having been subjected to the frequency conversion.

The above three amplifiers 404, 414, 424 are connected to the adder circuit 431, which performs frequency multiplex processing on the millimeter wave signal S1 of the frequency band F1, the millimeter wave signal S2 of the frequency band F2, and the millimeter wave signal S3 of the frequency band F3. The adder circuit 431 is connected to the coupling circuit 405 for coupling with the circuit board 10, so that an electromagnetic wave S' based on the millimeter wave signal S=S1+S2+S3 of the frequency bands F1+F2+F3 having been subjected to frequency multiplex processing is transmitted to the transmission line 432. The coupling circuit 405 is arranged on the transmission line 432, which propagates the electromagnetic wave S' of the frequency bands F1+F2+F3 based on the millimeter wave signal S. The transmission line 432 is arranged in the circuit board 10.

Preferably, the tangible object made of a dielectric material for making the circuit board 10 is not a material having a small dielectric loss tangent δ but is a material having a large dielectric loss tangent δ, so that the transmission line 432 has a large loss.

Figure 17:
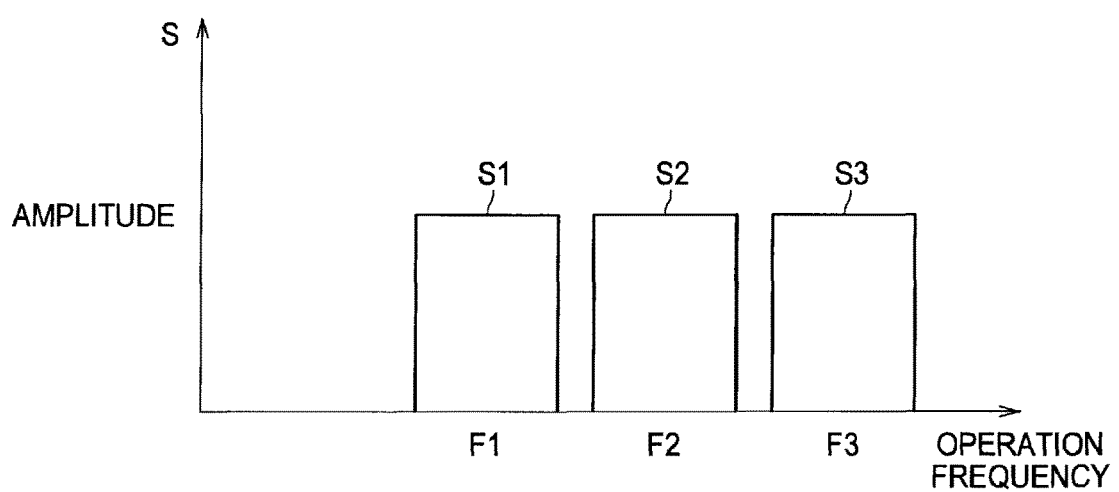
FIG. 17 is a graph chart illustrating an example of a frequency band in the millimeter wave transmission device 400.

FIG. 17 is a graph chart illustrating an example of a frequency band in the millimeter wave transmission device 400. In the graph chart shown in FIG. 17, the vertical axis represents an amplitude of the millimeter wave signal S. The horizontal axis represents a carrier frequency in GHz. F1, F2, F3 are frequency bands. The millimeter wave signal S1 of the frequency band F1 is generated by the frequency converting circuit 403. Thereafter, it is output from the amplifier 404 of the millimeter wave transmission device 400a to the adder circuit 431.

The millimeter wave signal S2 of the frequency band F2 is generated by the frequency converting circuit 413. Thereafter, it is output from the amplifier 414 of the millimeter wave transmission device 400b to the adder circuit 431. The millimeter wave signal S3 of the frequency band F3 is generated by the frequency converting circuit 423. Thereafter, it is output from the amplifier 424 of the millimeter wave transmission device 400c to the adder circuit 431.

As described above, according to the millimeter wave transmission device 400 of the fourth embodiment, the millimeter wave transmission device 400a is arranged with the frequency converting circuit 403, the millimeter wave transmission device 400b is arranged with the frequency converting circuit 413, and the millimeter wave transmission device 400c is arranged with the frequency converting circuit 423. The adder circuit 431 performs frequency multiplex processing on the millimeter wave signal S1 of the frequency band F1, the millimeter wave signal S2 of the frequency band F2, and the millimeter wave signal S3 of the frequency band F3.

Therefore, frequency multiplex communication processing can be executed between the signal transmission millimeter wave transmission device 400 and the signal reception millimeter wave transmission device. It is to be understood that a signal reception millimeter wave transmission device for receiving an electromagnetic wave S' based on a bandpass-type millimeter wave signal S=S1+S2+S3 is arranged with a frequency separating circuit. When the signal reception millimeter wave transmission device receives the bandpass-type electromagnetic wave S' based on the millimeter wave signal S, the signal reception millimeter wave transmission device can easily obtain the bandpass-type millimeter wave signal S=S1+S2+S3 by arranging the coupling circuit on the circuit board 10 for coupling with the circuit board 10 without any DC connection. Moreover, the transmission speed of the same transmission line 432 can be improved. Therefore, the signal multiplex-enabled millimeter wave transmission system can be structured.

Fifth Embodiment

Figure 18:
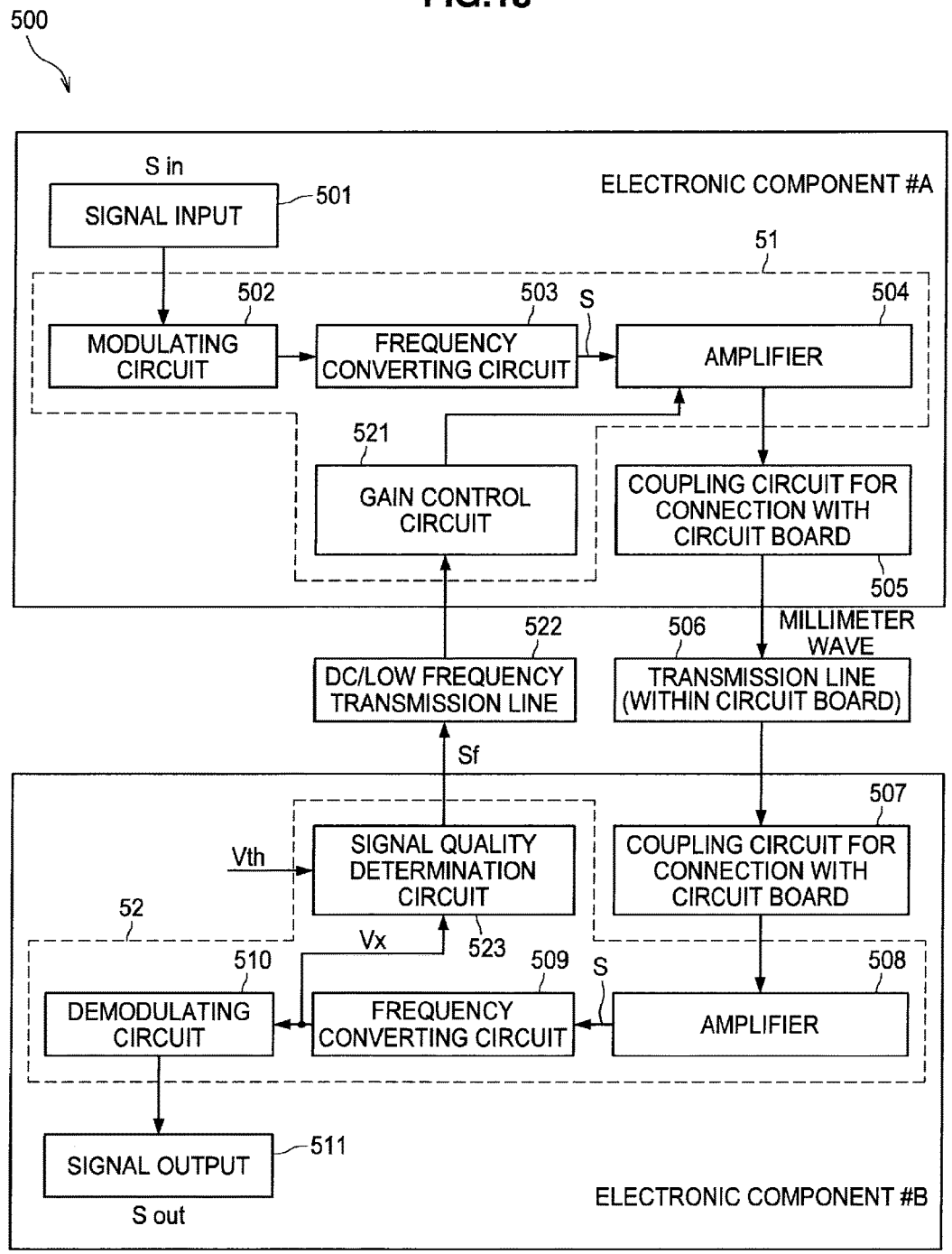
FIG. 18 is a block diagram illustrating an exemplary configuration of a millimeter wave transmission device 500 according to a fifth embodiment.
Figure 19:
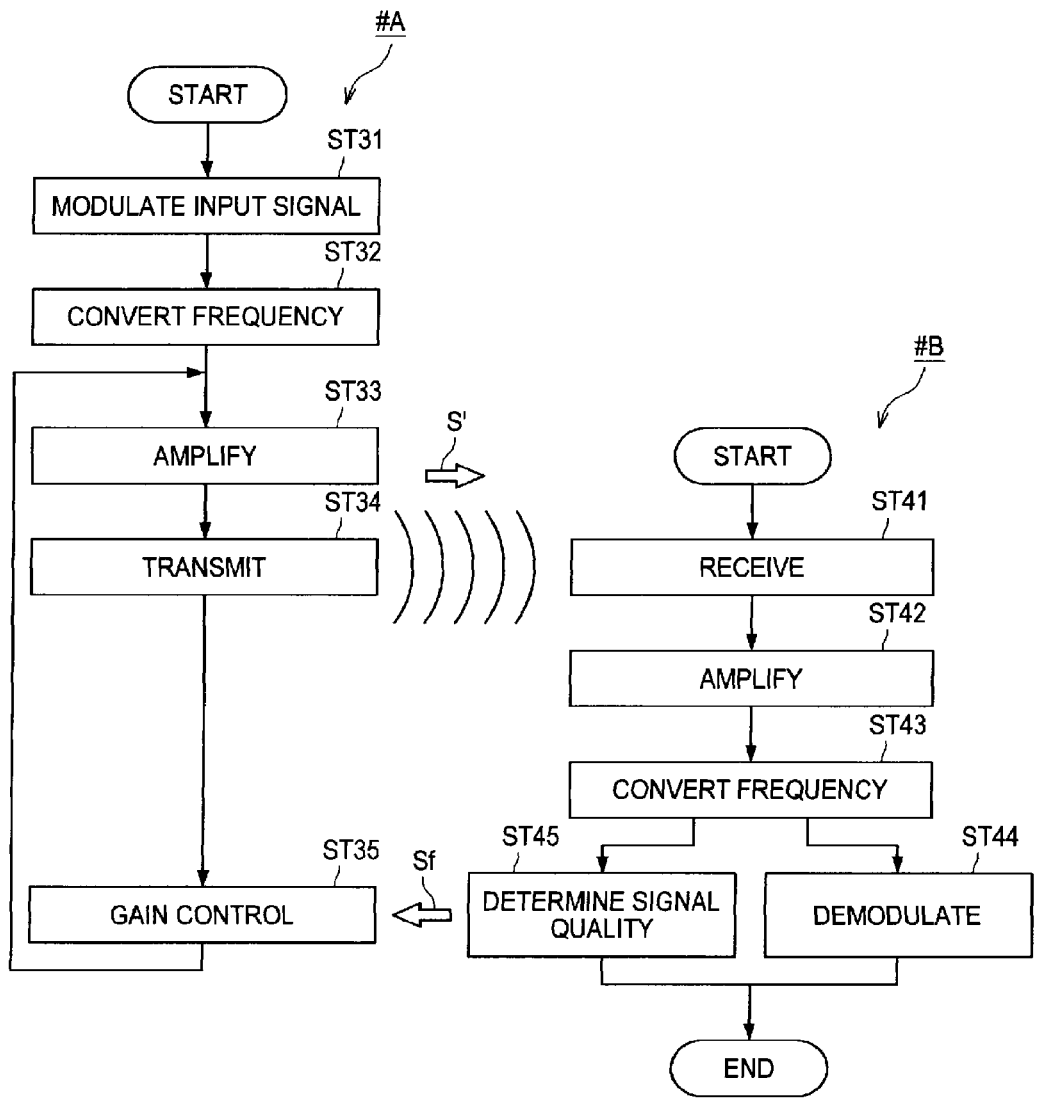
FIG. 19 is an operation flowchart illustrating an example of gain control in the millimeter wave transmission device 500.

Subsequently, a millimeter wave transmission device 500 serving as the fifth embodiment will be explained with reference to FIGS. 18 and 19. FIG. 18 is a block diagram illustrating an exemplary configuration of the millimeter wave transmission device 500 according to the fifth embodiment. In this embodiment, a feed back path is arranged between a signal transmission electronic component #A and a signal reception electronic component #B which execute communication processing, so that the gain of an amplifier 504 can be controlled.

The millimeter wave transmission device 500 shown in FIG. 18 includes electronic components #A, #B, a transmission line 506, and a DC/low frequency transmission line 522 (which is denoted as DC/low frequency transmission line in the figure).

Preferably, the tangible object made of a dielectric material for making the circuit board 10 is not a material having a small dielectric loss tangent δ but is a material having a large dielectric loss tangent δ, so that the transmission line 506 has a large loss.

The electronic component #A includes a signal input terminal 501, a signal generation unit 51, a coupling circuit 505, and a gain control circuit 521. The signal generation unit 51 is connected to the signal input terminal 501. The signal generation unit 51 includes, for example, a modulating circuit 502, a frequency converting circuit 503, an amplifier 504, and a gain control circuit 521 in order to process an input signal Sin and generate a millimeter wave signal S. The terminal 501 is connected to the modulating circuit 502, so that the input signal Sin is modulated. Like the first to fourth embodiments, the modulating circuit 502 uses a phase modulating circuit.

The modulating circuit 502 is connected to the frequency converting circuit 503, which performs frequency conversion on the input signal Sin modulated by the modulating circuit 502 to generate a millimeter wave signal S. The frequency converting circuit 503 is connected to the amplifier 504, so that the amplifier 504 amplifies the millimeter wave signal S1 having been subjected to the frequency conversion.

The amplifier 504 is connected to the coupling circuit 505, which transmits the millimeter wave signal generated by the signal generation unit 51 to an end of a tangible object (tangible object made of a dielectric material) having a predetermined dielectric constant ∈. The coupling circuit 505 is constituted by an antenna member having a predetermined length based on a wavelength λ of the millimeter wave signal S, i.e., about 600 μm, and is coupled to the circuit board 10 having the dielectric constant ∈. In this example, the circuit board 10 also makes the transmission line 506 having a large loss. The millimeter wave electromagnetic wave S' propagates in the transmission line 506.

The electronic component #B includes a coupling circuit 507, a signal generation unit 52, a signal output terminal 511, and a signal quality determination circuit 523. The transmission line 506 is coupled with the coupling circuit 507, which receives the electromagnetic wave S' based on the millimeter wave signal S from the other end of the transmission line 506. The coupling circuit 507 is constituted by an antenna member having a predetermined length based on a wavelength λ of the millimeter wave signal S, i.e., about 600 μm. Like the first and second embodiments, the antenna member is, for example, a probe antenna (dipole), a loop antenna, and a small aperture-coupled device (such as slot antenna).

The coupling circuit 507 is connected to the signal generation unit 52, which generates an output signal Sout by processing the millimeter wave signal based on the electromagnetic wave S' received by the coupling circuit 507. The signal generation unit 52 includes, for example, an amplifier 508, a frequency converting circuit 509, a demodulating circuit 510, and a signal quality determination circuit 523.

The coupling circuit 507 is connected to the amplifier 508. The amplifier 508 amplifies the received millimeter wave signal.

The amplifier 508 is connected to the frequency converting circuit 509. The frequency converting circuit 509 performs frequency conversion on the amplified millimeter wave signal S. The frequency converting circuit 509 is connected to the demodulating circuit 510. The demodulating circuit 510 demodulates the output signal having been subjected to the frequency conversion.

In terms of principle, examples of signals monitored by the signal quality determination circuit 523 are considered to include a first example: an output signal of the demodulating circuit 510 (output signal Sout given to the terminal 511), a second example: a signal being processed by the demodulating circuit 510, and a third example: an output signal of the frequency converting circuit 509. The configuration of the signal quality determination circuit 523 is prepared accordingly. For example, in the second example, the demodulating circuit includes not only functional blocks for demodulation processing but also function blocks for amplitude determination, gain control, and the like. The control operation of the signal quality determination circuit 523 corresponds thereto. In the explanation below, the third example is employed for the sake of ease of understanding and explanation.

The frequency converting circuit 509 is connected to the signal quality determination circuit 523. The signal quality determination circuit 523 monitors the output signal having been subjected to the frequency conversion to determine the signal quality. For example, the signal quality determination circuit 523 compares an output level Vx of an output signal having been subjected to the frequency conversion and a threshold value level Vth serving as a reference for determination. When the output level Vx is determined to be equal to or less than the threshold value level Vth, the signal quality determination circuit 523 outputs a quality determination signal Sf (information) so as to increase the current gain. When the output level Vx is determined to be more than the threshold value level Vth, the signal quality determination circuit 523 outputs a quality determination signal Sf so as to reduce the current gain.

The signal quality determination circuit 523 is connected to the transmission line 522 capable of handling a direct current or low frequency, so that the quality determination signal Sf output from the signal quality determination circuit 523 is given to the side of the electronic component #A as a feedback. The transmission line 522 capable of handling a direct current or low frequency is made of an ordinary print circuit board. This is because the quality determination signal Sf does not need to be given as a feedback from the electronic component #B to the electronic component #A in real time at high speed, but is necessary regularly or irregularly when the signal input level of the side of the electronic component #B is adjusted. Therefore, an ordinary print circuit board capable of handling a direct current or low frequency signal can be used.

The transmission line 522 capable of handling a direct current or low frequency is connected to the gain control circuit 521. The gain control circuit 521 controls the gain of the amplifier 504 based on the quality determination signal Sf transmitted via the transmission line 522. For example, when the quality determination signal Sf is information for increasing the current gain, the gain control circuit 521 adjusts a bias current so as to increase the gain of the amplifier 504. On the other hand, when the quality determination signal Sf is information for decreasing the current gain, the gain control circuit 521 adjusts the bias current so as to decrease the gain of the amplifier 504.

The above signal generation unit 51, the signal generation unit 52, the gain control circuit 521, and the signal quality determination circuit 523 are constituted by CMOS-IC devices, i.e., examples of semiconductor integrated circuits. The electronic component #A, the electronic component #B, and the like are mounted on the circuit board 10 having the dielectric constant ∈.

Subsequently, an example of operation performed by the millimeter wave transmission device 500 will be explained. FIG. 19 is an operation flowchart illustrating an example of gain control in the millimeter wave transmission device 500. In this embodiment, an example will be explained where the signal reception electronic component #B responds information such as reception level and reception error, which is carried by a direct current or a low frequency, to the signal transmission electronic component #A via the transmission line 522, so that the gain control circuit 521 optimizes the output level of the amplifier 504.

The electronic component #A of the millimeter wave transmission device 500 adopts the above as the gain control conditions. In order to generate the millimeter wave signal S by processing the input signal Sin, the modulating circuit 502 of the signal generation unit 51 executes phase modulation processing based on the input signal Sin in step ST31 of the operation flowchart shown in FIG. 19. The input signal Sin is provided from a lower signal processing circuit, not shown, to the terminal 201.

Subsequently, in step ST32, the frequency converting circuit 503 performs frequency conversion on the signal phase-modulated by the modulating circuit 502. Thereafter, in step ST33, the amplifier 504 amplifies the millimeter wave signal S. Then, in step ST34, the coupling circuit 505 transmits the signal of the millimeter wave (millimeter wave having been subjected to the signal processing) amplified by the amplifier 504 to one end of the transmission line 506 defined on the circuit board 10 having the dielectric loss tangent δ. The electromagnetic wave S' based on the millimeter wave signal S propagates through the transmission line 506.

On the other hand, in the electronic component #B, the coupling circuit 507 receives the electromagnetic wave S' based on the millimeter wave signal S from the other end of the transmission line 506 on the circuit board 10 having the dielectric loss tangent δ in step ST41 of the flowchart shown in FIG. 19B in order to generate the output signal Sout by receiving the electromagnetic wave S' based on the millimeter wave signal S. Thereafter, in step ST42, the amplifier 508 amplifies the millimeter wave signal. Then, in step ST43, the frequency converting circuit 509 performs frequency conversion on the millimeter wave signal S amplified by the amplifier 508. Thereafter, in step ST44, the demodulating circuit 510 demodulates the output signal having been subjected to the frequency conversion. The demodulated output signal Sout is output from the terminal 511 to a host signal processing circuit, not shown.

At the same time, in step ST45, the signal quality determination circuit 523 monitors the output signal provided by the frequency converting circuit 509 to determine the signal quality. For example, the signal quality determination circuit 523 compares an output level Vx of the signal having been subjected to the frequency conversion and a threshold value level Vth serving as a reference for determination. When the output level Vx is determined to be equal to or less than the threshold value level Vth, the signal quality determination circuit 523 provides a quality determination signal Sf (information) to the gain control circuit 521 via the transmission line 522 so as to increase the current gain. When the output level Vx is determined to be more than the threshold value level Vth, the signal quality determination circuit 523 provides a quality determination signal Sf to the gain control circuit 521 via the transmission line 522 so as to reduce the current gain.

In the electronic component #A having received the quality determination signal Sf, the gain control circuit 521 controls the gain of the amplifier 504 based on the quality determination signal Sf transmitted via the transmission line 522 in step ST35. For example, when the quality determination signal Sf is information for increasing the current gain, the gain control circuit 521 returns back to step ST33 to adjust a bias current so as to increase the gain of the amplifier 504. On the other hand, when the quality determination signal Sf is information for decreasing the current gain, the gain control circuit 521 adjusts the bias current so as to decrease the gain of the amplifier 504. Therefore the output signal of the amplifier 504 is maintained at an appropriate level at which the signal quality between the electronic components #A, #B is good, and interference with other electronic components is suppressed.

As described above, according to the millimeter wave transmission device 500 of the fifth embodiment, the electronic component #A includes the gain control circuit 521, and the electronic component #B includes the signal quality determination circuit 523. The signal quality determination circuit 523 responds information such as reception level and reception error, which is carried by a direct current or a low frequency, to the signal transmission electronic component #A from the signal reception electronic component #B via the transmission line 522 (feedback path), so that the gain control circuit 521 controls the output level of the amplifier 504.

With this gain control, interference with communication between local regions such as other electronic components can be controlled. Therefore, the quality of connection between the electronic component #A and the electronic component #B is maintained at a preferable level, and interference with communication of other electronic components can be reduced to the minimum level. In addition to the above effects, communication power can be adjusted to an optimum level, and accordingly, communication range can be controlled. Further, the amplifier 504 may be treated as an output enable switch.

In the above explanation, at the signal transmission signal generation unit 51, the gain control circuit 521 controls the amplifier 508 to perform the gain control. However, the mechanism of the gain control is not limited to this example. For example, in the millimeter wave transmission device 500, a switchable attenuator may be arranged before the signal reception signal generation unit 52, or a gain control circuit for changing (adjusting) the sensitivity of reception input by means of bias change (adjustment) of the amplifier 508 may be arranged in the electronic component #B as a functional unit for adjusting input of the signal generation unit 52. The millimeter wave transmission device 500 may be structured by combining an input adjustment (gain control at the reception side) of the signal generation unit 52 and a gain control (gain control at the transmission side) at the signal transmission signal generation unit 51. It is to be understood that a multifunctional millimeter wave transmission system may be structured by combining millimeter wave transmission devices 100, 400, 500 and millimeter wave transmission systems 200, 300.

According to a wireless millimeter wave communication system described in Patent Literature 2, an adjustment can be performed to propagate the millimeter wave signal (signal wave) emitted by the antenna of the millimeter wave transmission means to the antenna of the millimeter wave reception means with a high reproducibility. In a case where a baseband signal such as millimeter wave is transmitted at high speed, a reflected wave may be one of the causes of transmission error.

In contrast, in the fifth embodiment, the basic portion of the millimeter wave transmission uses the same mechanism as the first embodiment. The fifth embodiment achieves the same effects as the first embodiment with regard to the millimeter wave transmission of the transmission target signal (Sin). Therefore, the issues of transmission error caused by reflected wave can be alleviated or solved.

Sixth Embodiment

Figure 20:
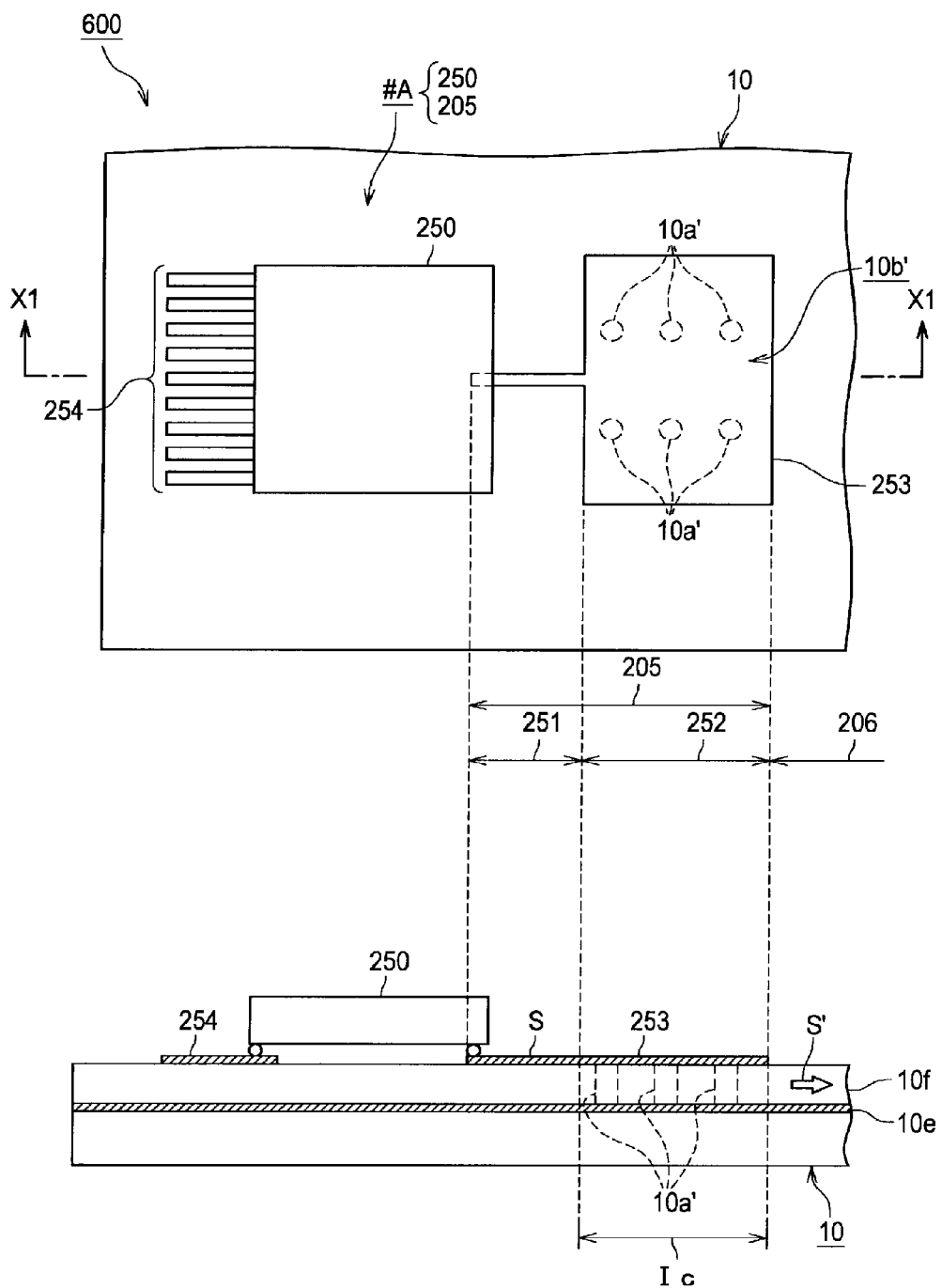
FIG. 20 includes a top view illustrating an exemplary configuration (part I) of a millimeter wave transmission device 600 according to a sixth embodiment and a cross sectional view taken along arrow line X1-X.

Subsequently, a millimeter wave transmission device 600 serving as the sixth embodiment will be explained with reference to FIGS. 20 and 22. FIG. 20 includes a top view (an upper figure of FIG. 20) illustrating an exemplary configuration (part I) of the millimeter wave transmission device 600 according to the sixth embodiment and a cross sectional view (a lower figure of FIG. 20) taken along arrow line X1-X. In this embodiment, a coupling circuit 205 of the millimeter wave transmission device 600 includes a microstrip line 251 and a waveguide structure 252 instead of the antenna member 11 as shown in FIG. 2B.

The millimeter wave transmission device 600 shown FIG. 20 includes a CMOS chip 250, a microstrip line 251, and a waveguide top panel portion 253, which are arranged on a circuit board 10. The CMOS chip 250 is a semiconductor transistor circuit which integrates the signal generation unit 21 including the modulating circuit 202, the frequency converting circuit 203, and the amplifier 204 shown in FIG. 1. The coupling circuit 205 and the CMOS chip 250 constitute an electronic component #A.

In the lower figure of FIG. 20, a conductive ground layer 10e is arranged on all over the circuit board 10. An insulating dielectric material layer 10f constituting a transmission line 206 having a large loss is arranged on the ground layer 10e. The dielectric material layer 10f is made of glass epoxy resin (FR4) whose dielectric constant is 4.9 and whose dielectric loss tangent is 0.025. A conducting microstrip line 251, a waveguide top panel portion 253, and a wiring pattern 254 are arranged on the dielectric material layer 10f. The wiring pattern 254 is made of a copper foil and the like, and is connected to a plurality of electrodes of the CMOS chip 250. For example, the wiring pattern 254 and the CMOS chip 250 are bonded with bump electrodes by flip chip method.

The coupling circuit 205 of the millimeter wave transmission device 600 includes the microstrip line 251 and the waveguide structure 252. The microstrip line 251 is constituted by a copper foil and the like and is arranged on the circuit board 10. The microstrip line 251 directly connects the waveguide top panel portion 253 and the amplifier 204 of the electronic component #A shown in FIG. 1. The microstrip line 251 is configured to transmit an electromagnetic wave S' based on a millimeter wave signal S to the waveguide structure 252. The output terminal of the amplifier 204 and the microstrip line 251 are bonded with bump electrodes by flip chip method. The method is not limited thereto. Other methods may also be used. For example, they may be bonded with wires.

According to the waveguide structure 252 of this example, the wave guide includes a top panel portion projection region Ic of the ground layer 10e, the waveguide top panel portion 253, and contact holes 10a'. The contact holes 10a' electrically connect the top panel portion projection region Ic and the waveguide top panel portion 253. For example, the contact holes 10a' are arranged in two rows in a comb form, so as to define the travelling direction of the electromagnetic wave S'. The travelling direction of the electromagnetic wave S' is defined by the two rows of contact holes 10a' (hereinafter referred to as a contact hole fence portion 10b'). In other words, the four sides of the waveguide are electrically shielded by the top panel portion projection region Ic of the ground layer 10e, the waveguide top panel portion 253, and the right and left contact holes 10a' and 10a'. Thus, the waveguide structure 252 filled with dielectric material therein can be employed.

Therefore, the microstrip line 251 and the waveguide structure 252 can be directly connected, and the electromagnetic wave S' based on the millimeter wave signal S can be transmitted to the dielectric material layer 10f. The portion of the dielectric material layer 10f on the circuit board 10 in which the waveguide top panel portion 253 is not arranged serves as a dielectric material transmission path that constitutes the transmission line 206 having a large loss. The waveguide structure 252 significantly alleviates the issues of spurious emission and transmission error associated with broadcast and wireless communication apparatuses explained in the first embodiment.

Figure 21:
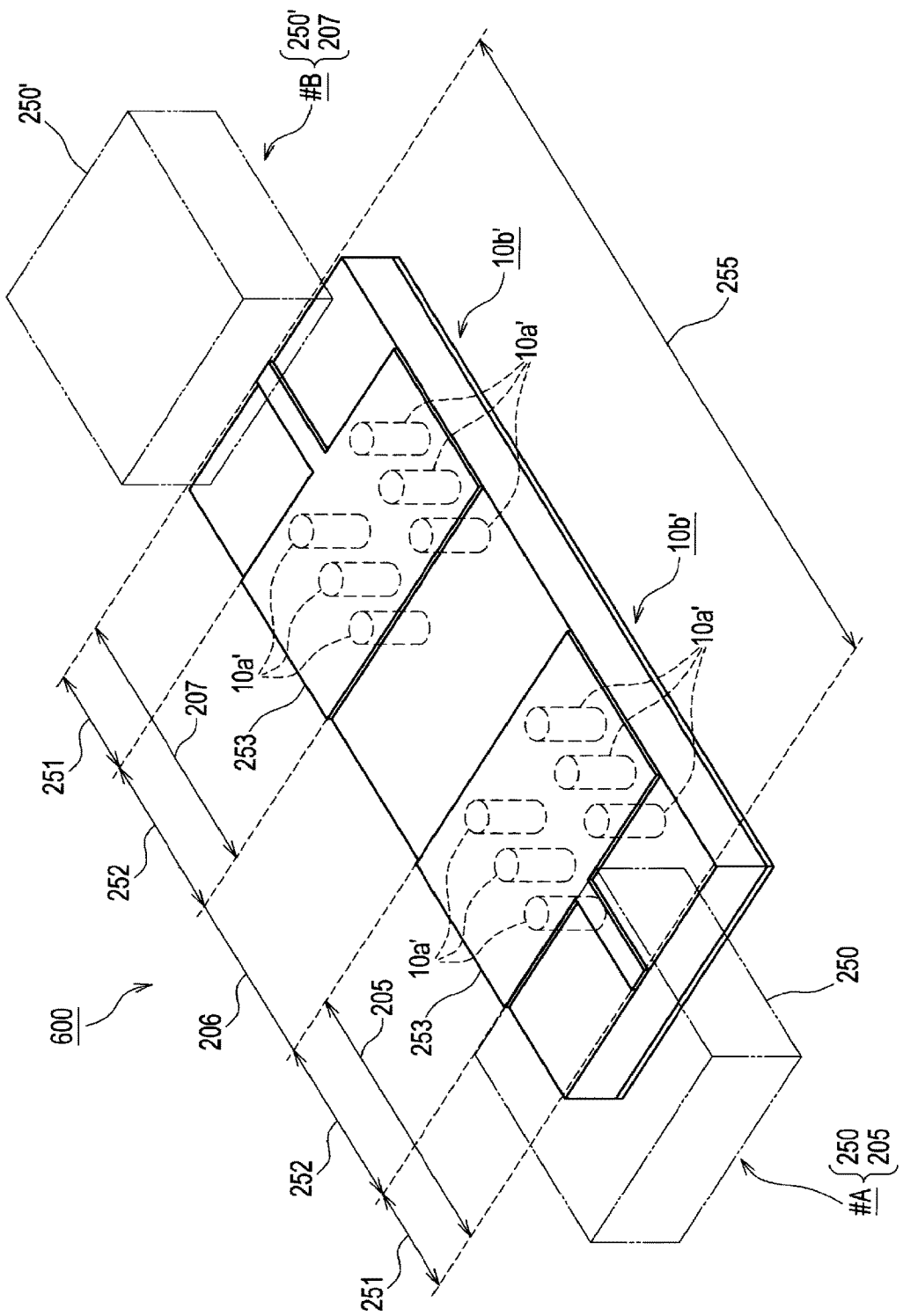
FIG. 21 is a perspective view illustrating an exemplary configuration (part II) of the millimeter wave transmission device 600.

FIG. 21 is a perspective view illustrating an exemplary configuration (part II) of the millimeter wave transmission device 600. The millimeter wave transmission device 600 shown in FIG. 21 is a perspective view illustrating an example of a millimeter wave transmission in which the electronic component #A and the electronic component #B are connected with the transmission line 206 having a large loss. In this example, the structure of the above-explained coupling circuit 205 is applied to a coupling circuit 207 at the side of the electronic component #B.

The coupling circuit 207 of the millimeter wave transmission device 600 includes a microstrip line 251 and a waveguide structure 252 instead of the antenna member 11 shown in FIG. 2B. The microstrip line 251 is constituted by a copper foil and the like and is arranged on the circuit board 10. The microstrip line 251 directly connects the waveguide top panel portion 253 and the amplifier 208 of the electronic component #B shown in FIG. 1. The microstrip line 251 is configured to receive the millimeter wave signal S based on the electromagnetic wave S' from the waveguide structure 252.

As described above, the simple high-pass filter device 255 can be structured on the circuit board 10 with the coupling circuit 205 including the microstrip line 251 and the waveguide structure 252 at the side of the electronic component #A, the transmission line 206, and the coupling circuit 207 including the microstrip line 251 and the waveguide structure 252 at the side of the electronic component #B. The high-pass filter device 255 electrically connects the two electronic components #A, #B.

Figure 22:
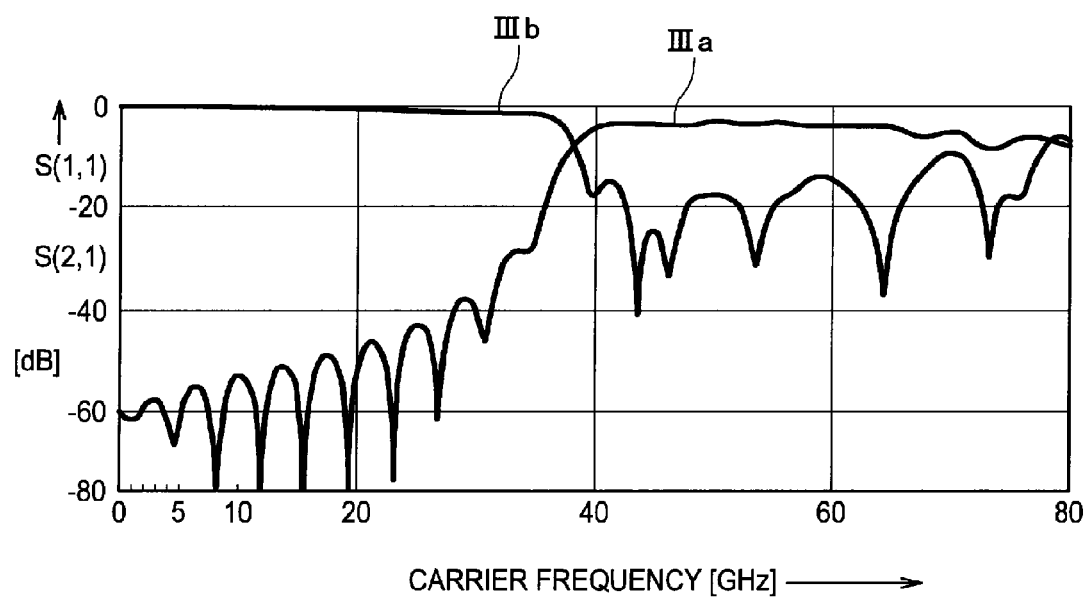
FIG. 22 is a frequency characteristic diagram illustrating an example of reflection characteristic and an example of bandpass characteristic of a high-pass filter device 255 of the millimeter wave transmission device 600.

FIG. 22 is a frequency characteristic diagram illustrating an example of reflection characteristic and an example of bandpass characteristic of the high-pass filter device 255 of the millimeter wave transmission device 600. In FIG. 22, the vertical axis represents bandpass characteristic S (2,1) dB and reflection characteristic S (1,1) dB of the high-pass filter device 255. The horizontal axis represents carrier frequency (GHz). The unit of the scale is 1 GHz. In the figure, IIIa represents an example of bandpass characteristic of the high-pass filter device 255. In this example of bandpass characteristic, each of the coupling circuits 205, 207 of the millimeter wave transmission device 600 includes the microstrip line 251 and the waveguide structure 252, and the transmission line 206 is constituted by the dielectric material layer 10f.

The bandpass characteristic S (2,1) dB of the high-pass filter device 255 is bandpass characteristic of the electromagnetic wave S' based on the millimeter wave signal S transmitted from a CMOS chip 250 at the side of the electronic component #A to a CMOS chip 250' at the side of the electronic component #B via the high-pass filter device 255 (FR4) whose dielectric constant is 4.9 and whose dielectric loss tangent δ is 0.025. The bandpass characteristic S (2,1) dB represents a case where the carrier frequency is increased from 0 GHz to 80 GHz by 1 GHz. According to this simulation result, video data based on the millimeter wave signal S have a bandpass loss of about 4.0 dB between the electronic components #A, #B when the carrier frequency is in the range of 40.0 GHz to 75 GHz.

In the figure, IIIb represents an example of reflection characteristic of the high-pass filter device 255. The reflection characteristic S (1,1) dB of the high-pass filter device 255 is reflection characteristic of the electromagnetic wave S' based on the millimeter wave signal S transmitted from the CMOS chip 250 at the side of the electronic component #A to the CMOS chip 250' at the side of the electronic component #B via the high-pass filter device 255 whose dielectric constant is 4.9 and whose dielectric loss tangent δ is 0.025.

The reflection characteristic S (1,1) dB represents a case where the carrier frequency is increased from 10 GHz to 80 GHz by 1 GHz. According to this simulation result, the reflection loss of 40 dB or more is achieved. Further, the reflection loss is 10 dB or more when the carrier frequency is in the range of 40.0 GHz to 75 GHz.

As the carrier frequency increases, the transmission loss increases but the reflected wave decreases in the high-pass filter device 255 having such a large loss. Therefore, the high-pass filter device 255 reduces adverse effect of a standing wave caused by the reflected wave. In this example, the frequency converting circuit 203 performs frequency conversion to convert the input signal Sin into the millimeter wave signal S, and the frequency converting circuit 209 performs frequency conversion to convert the millimeter wave signal amplified by the amplifier 208, so that the ratio of (signal band)/(center frequency) can be reduced. Therefore, it is easy to make the signal generation unit 21 for transmitting the millimeter wave signal and the signal generation unit 22 for receiving the millimeter wave signal.

As described above, according to the millimeter wave transmission device 600 of the sixth embodiment, each of the coupling circuit 205 at the side of the electronic component #A and the coupling circuit 207 at the side of the electronic component #B includes the microstrip line 251 and the waveguide structure 252 instead of the antenna member 11 shown in FIG. 2B.

Therefore, the simple high-pass filter device 255 can be structured on the circuit board 10 with the coupling circuit 205 including the microstrip line 251 and the waveguide structure 252 at the side of the electronic component #A, the transmission line 206, and the coupling circuit 207 including the microstrip line 251 and the waveguide structure 252 at the side of the electronic component #B. As the carrier frequency increases, the transmission loss increases but the reflected wave decreases in the high-pass filter device 255. Therefore, the high-pass filter device 255 reduces adverse effect of a standing wave caused by the reflected wave.

Seventh Embodiment

Figure 23:
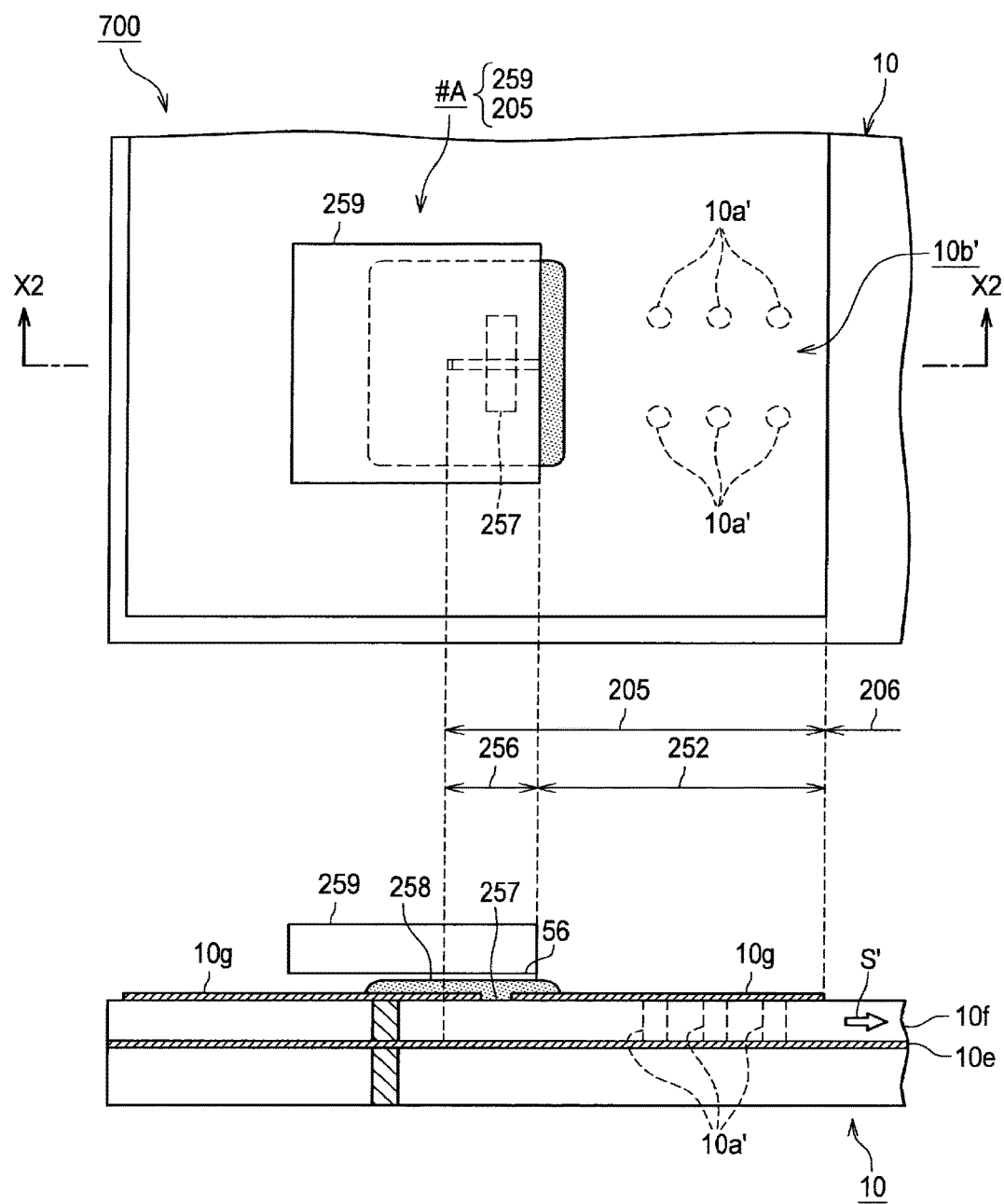
FIG. 23 includes a top view illustrating an exemplary configuration of a millimeter wave transmission device 700 according to a seventh embodiment and a cross sectional view taken along arrow line X2-X2.

FIG. 23 includes a top view (an upper figure of FIG. 23) illustrating an exemplary configuration of a millimeter wave transmission device 700 according to the seventh embodiment and a cross sectional view (a lower figure of FIG. 23) taken along arrow line X2-X2. In this embodiment, a coupling circuit 205 of the millimeter wave transmission device 700 includes an upper ground layer 10g, an antenna structure 256, a slot hole 257 and a waveguide structure 252, instead of the microstrip line 251 shown in FIG. 21.

The millimeter wave transmission device 700 shown in the upper diagram of FIG. 23 includes a lower ground layer 10e, an upper ground layer 10g, a waveguide structure 252, and a CMOS chip 259, which are arranged on a circuit board 10. The CMOS chip 259 is a semiconductor transistor circuit which integrates the signal generation unit 21 including the modulating circuit 202, the frequency converting circuit 203, and the amplifier 204 shown in FIG. 1. The coupling circuit 205 and the CMOS chip 259 constitute an electronic component #A'.

The CMOS chip 259 is different from the CMOS chip 250 explained in the sixth embodiment in that the CMOS chip 259 has the antenna structure 256. The antenna structure 256 is constituted by an antenna member 56 having a length of λ/2 where the wavelength of the carrier frequency is λ. The antenna member 56 is made on a predetermined surface of the CMOS chip 259 in an exposed manner.

In the lower figure of FIG. 23, a conductive interlayer ground layer 10e is arranged on all over the circuit board 10. An insulating dielectric material layer 10f constituting a transmission line 206 having a large loss is arranged on the ground layer 10e. The dielectric material layer 10f is made of glass epoxy resin (FR4) whose dielectric constant is 4.9 and whose dielectric loss tangent is 0.025. A conducting upper ground layer 10g is arranged on the dielectric material layer 10f.

A slot hole 257 constituted by an opening portion having a predetermined width and a predetermined length is arranged in the upper ground layer 10g. The CMOS chip 259 is adhered to the upper ground layer 10g with an adhesive 258 and is fixed to the circuit board 10 such that the antenna member 56 is perpendicular to the slot hole 257.

The coupling circuit 205 of the millimeter wave transmission device 700 includes the antenna member 56, the slot hole 257 formed in the upper ground layer 10g, and the waveguide structure 252. The interlayer ground layer 10e and the upper ground layer 10g are constituted by a copper foil and the like and is arranged on the circuit board 10. The interlayer ground layer 10e and the upper ground layer 10g are configured to transmit the electromagnetic wave S' based on the millimeter wave signal S to the waveguide structure 252 via the slot hole 257 from the antenna member 56 connected to the amplifier 204 (see FIG. 1) of the electronic component #A'. The output terminal of the amplifier 204 and the antenna member 56 are bonded with wires, for example.

According to the waveguide structure 252 of this example, the waveguide includes the interlayer ground layer 10e, the upper ground layer 10g, and the contact holes 10a'. The contact holes 10a' electrically connect the interlayer ground layer 10e and the upper ground layer 10g. Like the sixth embodiment, the contact holes 10a' are arranged in two rows in a comb form, so as to define the travelling direction of the electromagnetic wave S'. The travelling direction of the electromagnetic wave S' is defined by the two rows of contact holes 10a' (hereinafter referred to as a contact hole fence portion 10b').

In other words, like the sixth embodiment, the four sides of the waveguide are electrically shielded by the interlayer ground layer 10e, the upper ground layer 10g, and the right and left contact holes 10a' and 10a'. Thus, the waveguide structure 252 filled with dielectric material therein can be employed. The portion of the dielectric material layer 10f on the circuit board 10 in which the upper ground layer 10g is not arranged serves as a dielectric material transmission path that constitutes the transmission line 206 having a large loss.

As described above, according to the millimeter wave transmission device 700 of the seventh embodiment, the coupling circuit 205 at the side of the electronic component #A includes the upper ground layer 10g, the antenna structure 256, the slot hole 257, and the waveguide structure 252, instead of the microstrip line 251 shown in FIG. 21.

Therefore, the waveguide structure 252 can be spatially connected via the slot hole 257 to the antenna member 56 connected to the amplifier 204 (see FIG. 1) of the electronic component #A'. Therefore, the electromagnetic wave S' based on the millimeter wave signal S can be transmitted to the dielectric material layer 10f. Like the sixth embodiment, the waveguide structure 252 significantly alleviates the issues of spurious emission and transmission error associated with broadcast and wireless communication apparatuses.

Eighth Embodiment

Figure 24:
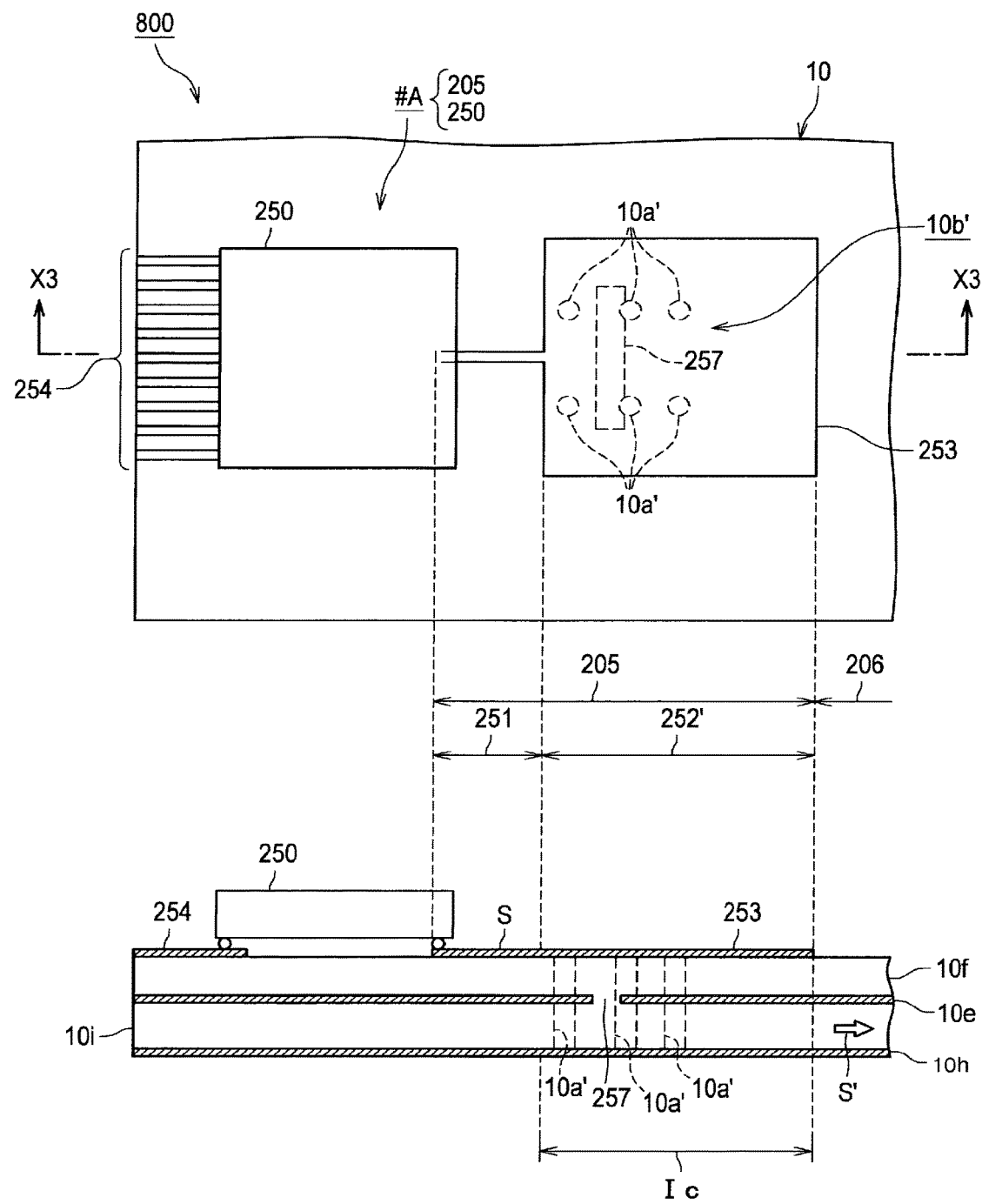
FIG. 24 includes a top view illustrating an exemplary configuration (part I) of a millimeter wave transmission device 800 according to an eighth embodiment and a cross sectional view taken along arrow line X3-X3.

Subsequently, a millimeter wave transmission device 800 serving as the eighth embodiment will be explained with reference to FIGS. 24 to 29. FIG. 24 includes a top view (an upper figure of FIG. 24) illustrating an exemplary configuration (part I) of the millimeter wave transmission device 800 according to the eighth embodiment and a cross sectional view (a lower figure of FIG. 24) taken along arrow line X3-X3. In this embodiment, coupling circuits 205, 207 have a multi-layer structure, so that an electromagnetic wave S' can be propagated in the thickness direction of the circuit board 10 via a slot hole 257.

The millimeter wave transmission device 800 shown in the upper figure of FIG. 24 includes an interlayer ground layer 10e, a CMOS chip 250, a microstrip line 251, and a waveguide top panel portion 253, which are arranged on a circuit board 10. Like the sixth embodiment, the CMOS chip 250 is a semiconductor transistor circuit which integrates the signal generation unit 21 including the modulating circuit 202, the frequency converting circuit 203, and the amplifier 204 shown in FIG. 1. The coupling circuit 205 and the CMOS chip 250 constitute an electronic component #A.

In the lower figure of FIG. 24, a conductive interlayer ground layer 10e is arranged on all over the circuit board 10. An insulating dielectric material layer 10f constituting a transmission line 206 having a large loss is arranged on the interlayer ground layer 10e. A conductive lower ground layer 10h is arranged on the lower surface of the circuit board 10. An insulating dielectric material layer 10i is interposed between the interlayer ground layer 10e and the lower ground layer 10h. Each of the dielectric material layers 10f, 10i is made of glass epoxy resin (FR4) whose dielectric constant is 4.9 and whose dielectric loss tangent is 0.025.

A conductive microstrip line 251, a waveguide top panel portion 253, and a wiring pattern 254 are arranged on the dielectric material layer 10f. The wiring pattern 254 is constituted by a copper foil, and is connected to a plurality of electrodes of the CMOS chip 250. Like the sixth embodiment, the wiring pattern 254 and the CMOS chip 250 are bonded with bump electrodes by flip chip method.

The coupling circuit 205 of the millimeter wave transmission device 800 includes the microstrip line 251, a waveguide structure 252' and the slot hole 257. Like the sixth embodiment, the microstrip line 251 is constituted by a copper foil and the like and is arranged on the circuit board 10. The microstrip line 251 directly connects the waveguide top panel portion 253 and the amplifier 204 of the electronic component #A shown in FIG. 1. The microstrip line 251 is configured to transmit an electromagnetic wave S' based on a millimeter wave signal S to the waveguide structure 252'. The output terminal of the amplifier 204 and the microstrip line 251 are bonded with bump electrodes by flip chip method. The method is not limited thereto. Other methods may also be used. For example, they may be bonded with wires.

In the waveguide structure 252' of this example, a top panel portion projection region Ic of the inter-layer ground layer 10e, a top panel portion projection region Ic of the lower ground layer 10h, and the waveguide top panel portion 253 are constituted by a two-layer wave guide connected via contact holes 10a'. The contact holes 10a' electrically connect the waveguide top panel portion 253 with the top panel portion projection region Ic of the interlayer ground layer 10e and the top panel portion projection region Ic of the lower ground layer 10h. For example, the contact holes 10a' are arranged in two rows in a comb form, so as to define the travelling direction of the electromagnetic wave S'.

A two-layer structure including an upper layer and a lower layer is defined by the contact holes 10a' arranged in two rows (contact hole fence portion 10b'). In other words, the seven or eight sides of the waveguide are electrically shielded by the top panel portion projection region Ic of the interlayer ground layer 10e, the top panel portion projection region Ic of the lower ground layer 10h, the waveguide top panel portion 253, and the right and left contact holes 10a' and 10a'. Thus, the waveguide structure 252' filled with dielectric material therein can be employed.

In this example, the slot hole 257 is formed at a predetermined position of the interlayer ground layer 10e, so as to guide the electromagnetic wave S' from the upper dielectric material layer 10f to the lower dielectric material layer 10i or from the lower dielectric material layer 10i to the upper dielectric material layer 10f. Therefore, the microstrip line 251 and the waveguide structure 252' can be directly connected, and the electromagnetic wave S' based on the millimeter wave signal S can be transmitted to the dielectric material layer 10f. Moreover, the coupling circuit 205 has a two-layer structure, and the electromagnetic wave S' can be guided to lower dielectric material layer 10i (in the direction of the thickness of the circuit board 10) via the slot hole 257.

The portion of the dielectric material layer 10f on the circuit board 10 in which the waveguide top panel portion 253 is not arranged and the dielectric material layer 10i between the interlayer ground layer 10e and the lower ground layer 10h serve as a dielectric material transmission path that constitutes the transmission line 206 having a large loss. The waveguide structure 252' significantly alleviates the issues of spurious emission and transmission error explained in the first embodiment.

Figure 25:
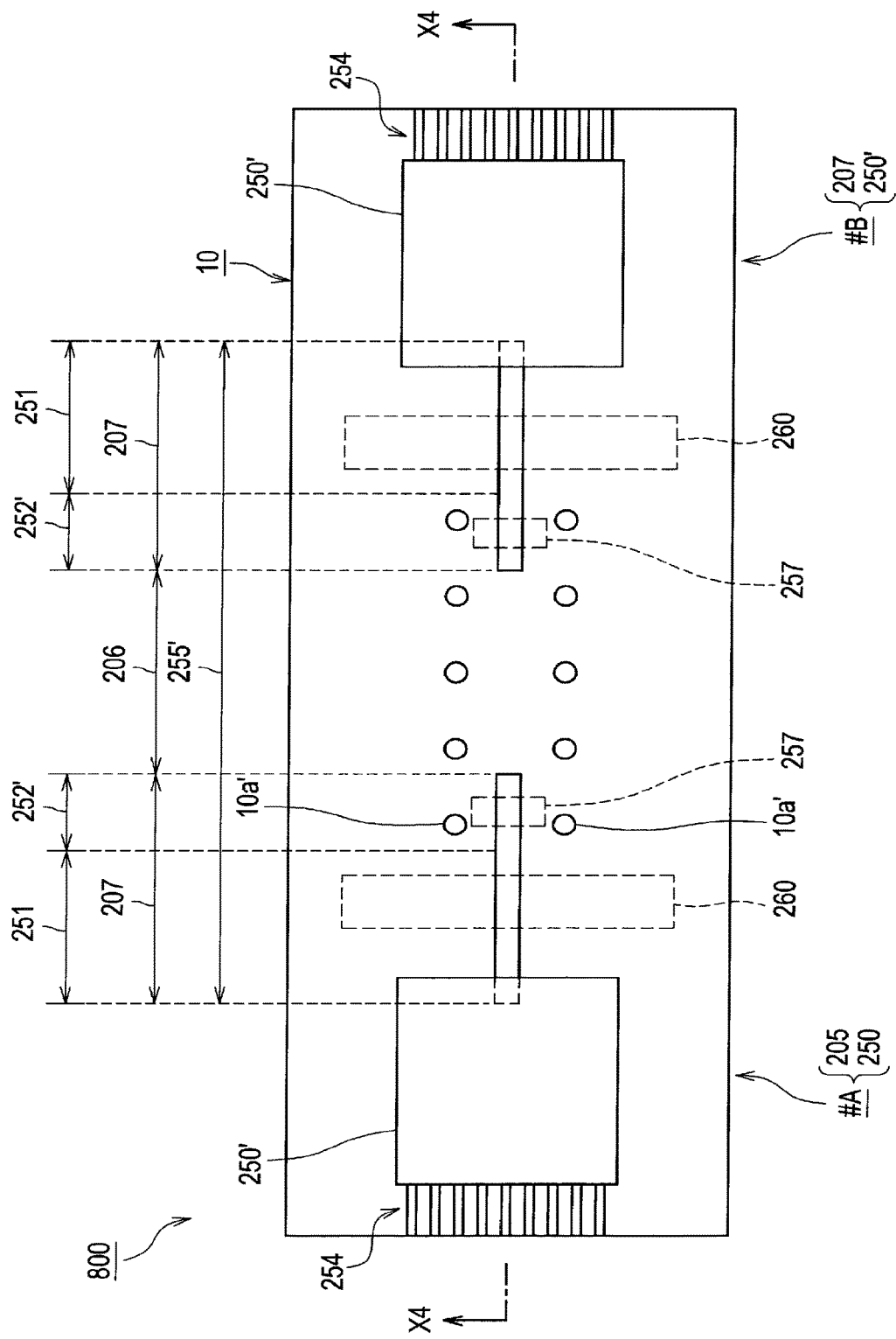
FIG. 25 is a top view illustrating an exemplary configuration (part II) of the millimeter wave transmission device 800.

FIG. 25 is a top view illustrating an exemplary configuration (part II) of the millimeter wave transmission device 800. FIG. 26 is a cross sectional view taken along arrow line X4-X4 for illustrating an exemplary configuration (part III) of the millimeter wave transmission device 800.

In this embodiment, two electronic components #A, #B are arranged on one surface of the circuit board 10, and two electronic components #C, #D are arranged on the other surface thereof. The four electronic components #1 to #4 are connected by the multi-layer coupling circuits 205, 207 and the transmission line 206 having a large loss. The electromagnetic wave S' is propagated to the lower dielectric material layer 10*i* via the slot hole 257 of the interlayer ground layer at the side of the electronic component #A. Further, the electromagnetic wave S' is propagated to the original upper dielectric material layer 10*f* via the slot hole 257 of the interlayer ground layer at the side of the electronic component #D. In this example, the waveguide top panel portion 253 is omitted.

In the millimeter wave transmission device 800 shown in FIG. 25, the multi-layer coupling circuit 205 at the side of the electronic component #A shown in FIG. 24 is applied not only to the coupling circuit 205 at the side of the electronic component #C but also to the coupling circuit 207 at the side of the electronic components #B, #D.

The coupling circuit 207 at the side of the electronic component #B of the millimeter wave transmission device 800 includes the microstrip line 251 and the waveguide structure 252' instead of the antenna member 11 shown in FIG. 2B. The microstrip line 251 is constituted by a copper foil and the like and arranged on the circuit board 10. The microstrip line 251 directly connects the waveguide top panel portion 253 and the amplifier 208 (see FIG. 10) of the electronic component #B shown in FIG. 1. The microstrip line 251 is configured to receive the millimeter wave signal S based on the electromagnetic wave S' from the waveguide structure 252.

The coupling circuit 205 at the side of the electronic component #C of the millimeter wave transmission device 800 includes the microstrip line 251 and the waveguide structure 252' as shown in FIG. 26. The microstrip line 251 is constituted by a copper foil and the like and arranged under the circuit board 10. For example, the microstrip line 251 is directly connected to the amplifier 224 (see FIG. 10) of the electronic component #C shown in FIG. 10. The microstrip line 251 is configured to transmit the electromagnetic wave S' based on the millimeter wave signal S from the waveguide structure 252'.

The coupling circuit 207 at the side of the electronic component #D of the millimeter wave transmission device 800 includes the microstrip line 251 and the waveguide structure 252' as shown in FIG. 26. The microstrip line 251 is constituted by a copper foil and the like and arranged under the circuit board 10. For example, the microstrip line 251 is directly connected to the amplifier 228 (see FIG. 10) of the electronic component #D shown in FIG. 10. The microstrip line 251 is configured to receive the millimeter wave signal S based on the electromagnetic wave S' from the waveguide structure 252'.

As described above, a multi-layer high-pass filter device 255' includes the coupling circuit 205 constituted by the waveguide structure 252' and the microstrip line 251 at the side of the electronic component #A, the transmission line 206 made with the upper dielectric material layer 10*f*, the coupling circuit 207 constituted by the waveguide structure 252' and the microstrip line 251 at the side of the electronic component #B, the coupling circuit 205 constituted by the waveguide structure 252' and the microstrip line 251 at the side of the electronic component #C, the transmission line 206 made with the upper dielectric material layer 10*i*, the coupling circuit 207 constituted by the waveguide structure 252' and the microstrip line 251 at the side of the electronic component #D, the slot hole 257 formed in the interlayer ground layer 10*e* at the side of the electronic components #A, #C, and the slot hole 257 formed in the interlayer ground layer 10*e* at the side of the electronic components #B, #D.

In the multi-layer high-pass filter device 255', the electromagnetic wave S' is propagated to the lower dielectric material layer 10*i* via the slot hole 257 of the interlayer ground layer at the side of the electronic component #A. Further, the electromagnetic wave S' is propagated to the original upper dielectric material layer 10*f* via the slot hole 257 of the interlayer ground layer at the side of the electronic component #D.

Reflection prevention slot holes 260 shown in FIG. 25 are formed in the interlayer ground layer 10*e* as shown in FIG. 26. In this example, the reflection prevention slot holes 260 are arranged on the outside of the slot hole 257 at the side of the electronic components #A, #C and the outside of the slot hole 257 at the side of the electronic components #B, #D. Like the slot hole 257, the slot hole 260 has a rectangular shape, and the slot hole 260 has a longer width and a longer length than the slot hole 257. The slot hole 260 is configured to prevent diffusion (reflection) of the electromagnetic wave S' propagated to the upper dielectric material layer 10*f* and the electromagnetic wave S' propagated to the lower dielectric material layer 10*i*.

FIGS. 27 and 28 are cross sectional views illustrating an exemplary propagation (part I and part II) of the electromagnetic wave S' in the high-pass filter device 255'. In this example, the electromagnetic wave S' is propagated from the electronic component #A to a different port (electronic components #B, #C, #D and the like) according to a carrier frequency.

Figure 27A:
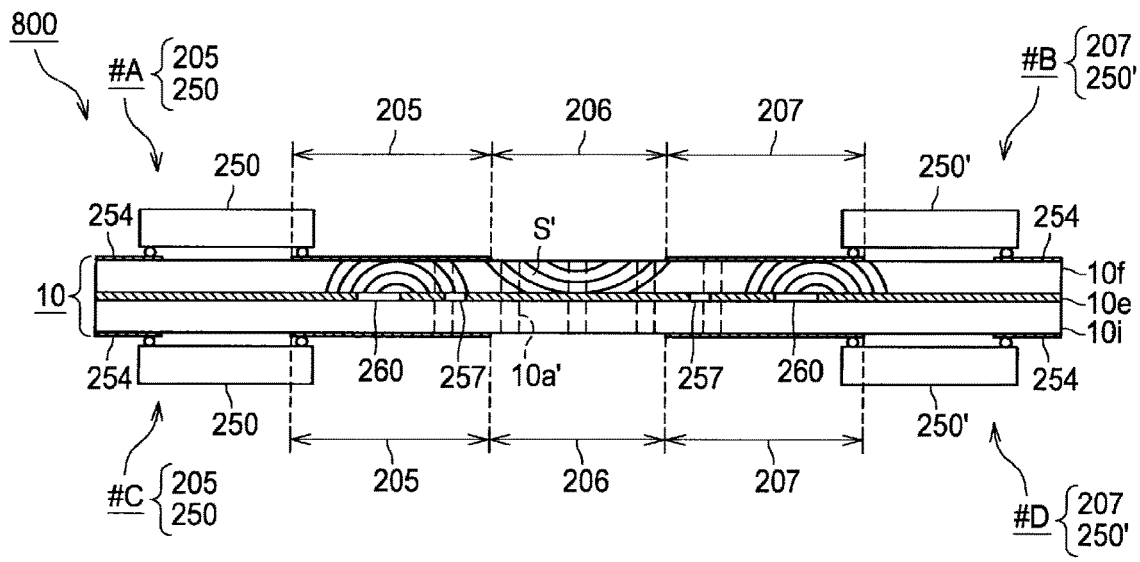
FIG. 27A is a cross sectional view illustrating an exemplary propagation (part I) of an electromagnetic wave S' in a high-pass filter device 255'.

In the high-pass filter device 255' shown in FIG. 27A, when the carrier frequency is 40 GHz, the electromagnetic wave S' is propagated from the electronic component #A to the electronic component #B. When the millimeter wave signal flows in the microstrip line 251 constituting the coupling circuit 205 at the side of the electronic component #A, the electromagnetic wave S' based on this millimeter wave signal is propagated from the waveguide structure 252' to the transmission line 206 constituted by the upper dielectric material layer 10*f*.

In the coupling circuit 207 at the side of the electronic component #B, the waveguide structure 252' receives the electromagnetic wave S', which is to be propagated to the upper layer transmission line 206, and the millimeter wave signal based on the electromagnetic wave S' flows to the microstrip line 251. The millimeter wave signal is input from the microstrip line 251 to the amplifier 208 (see FIG. 10) at the side of the electronic component #B.

Figure 27B:
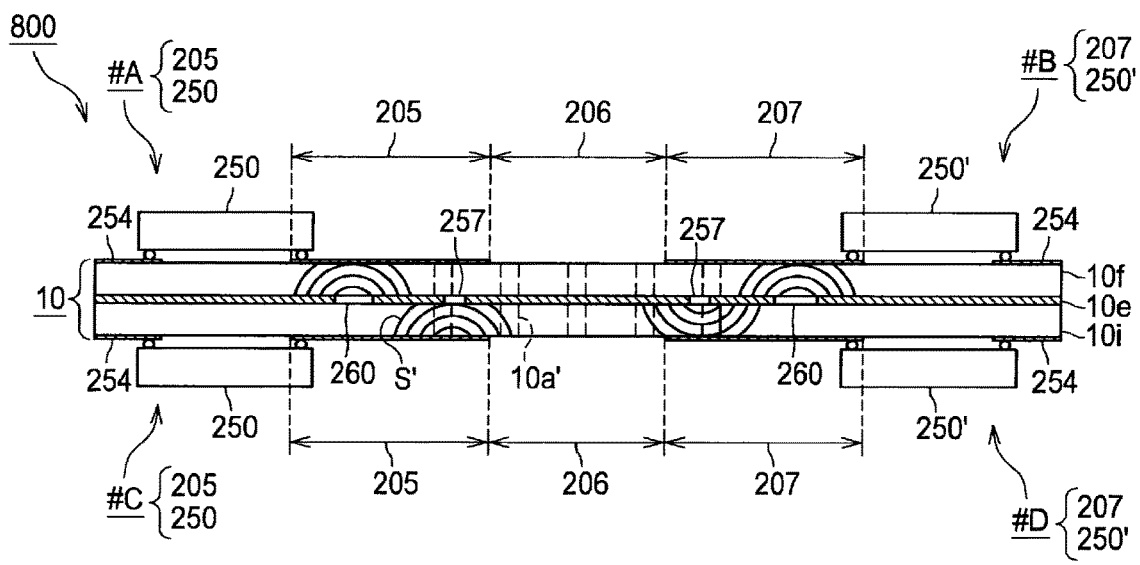
FIG. 27B is a cross sectional view illustrating the exemplary propagation (part I) of the electromagnetic wave S' in the high-pass filter device 255'.

In the high-pass filter device 255' shown in FIG. 27B, when the carrier frequency is 60 GHz, the electromagnetic wave S' is propagated from the electronic component #A to the electronic component #B via the slot hole 257 formed in the interlayer ground layer 10*e* at the side of the electronic components #A, #C and the slot hole 257 formed in the interlayer ground layer 10*e* at the side of the electronic components #B, #D.

When the millimeter wave signal flows in the microstrip line 251 constituting the coupling circuit 205 at the side of the electronic component #A, the electromagnetic wave S' based on the signal S is propagated from the waveguide structure 252' to the transmission line 206 constituted by the lower dielectric material layer 10*i* via the slot hole 257 at the side of the electronic components #A, #C.

In the coupling circuit 207 at the side of the electronic component #B, the waveguide structure 252' receives the electromagnetic wave S', which is to be propagated to the lower layer transmission line 206, via the slot hole 257 at the side of the electronic components #B, #D, and the millimeter wave signal based on the electromagnetic wave S' flows to the microstrip line 251. The millimeter wave signal is input from the microstrip line 251 to the amplifier 208 (see FIG. 10) at the side of the electronic component #B.

As described above, when the carrier frequencies such as 40 GHz and 60 GHz are selected in the multi-layer high-pass filter device 255', the electromagnetic wave S' is propagated to the lower dielectric material layer 10i via the slot hole 257 at the side of the electronic components #A, #C. Further, the electromagnetic wave S' can be propagated to the original upper dielectric material layer 10f via the slot hole 257 of the interlayer ground layer at the side of the electronic components #B, #D.

Figure 28A:
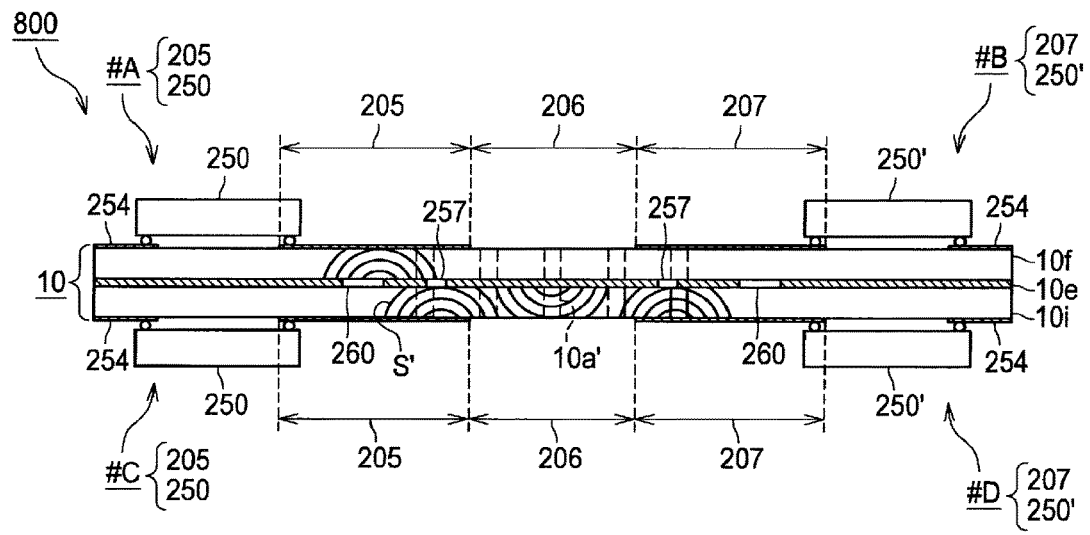
FIG. 28A is a cross sectional view illustrating an exemplary propagation (part II) of the electromagnetic wave S' in the high-pass filter device 255'.

In the high-pass filter device 255' shown in FIG. 28A, when a predetermined carrier frequency fx (20 GHz<fx<80 GHz) is selected, the electromagnetic wave S' is propagated from the electronic component #A to the electronic component #D. When the millimeter wave signal flows in the microstrip line 251 constituting the coupling circuit 205 at the side of the electronic component #A, the electromagnetic wave S' based on this millimeter wave signal is propagated from the waveguide structure 252' to the transmission line 206 constituted by the lower dielectric material layer 10i via the slot hole 257 at the side of the electronic components #A, #C.

In the coupling circuit 207 at the side of the electronic component #D, the waveguide structure 252' receives the electromagnetic wave S', which is to be propagated to the lower layer transmission line 206, and the millimeter wave signal based on the electromagnetic wave S' flows to the microstrip line 251. The millimeter wave signal is input from the microstrip line 251 to the amplifier 228 (see FIG. 10) at the side of the electronic component #D.

Figure 28B:
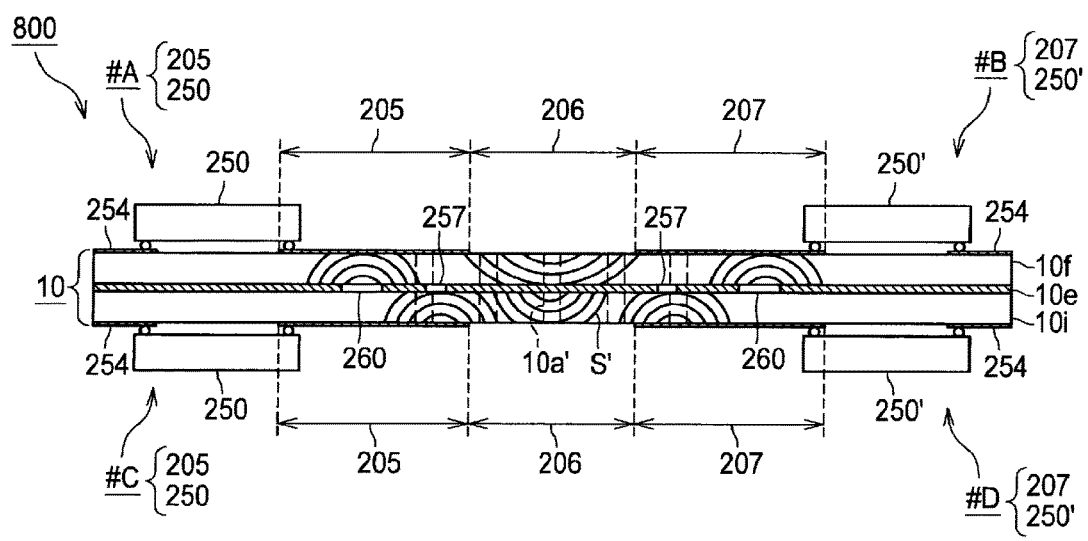
FIG. 28B is a cross sectional view illustrating the exemplary propagation (part II) of the electromagnetic wave S' in the high-pass filter device 255'.

When a predetermined carrier frequency fx (20 GHz<fx<80 GHz) is selected in the multi-layer high-pass filter device 255' shown in FIG. 28B, the electromagnetic wave S' is successively propagated from the electronic component #A to the electronic components #B, #D and further from the electronic component #C to the electronic components #B, #D. When the millimeter wave signal flows in the microstrip line 251 constituting the coupling circuit 205 at the side of the electronic component #A, the electromagnetic wave S' based on this millimeter wave signal is propagated from the waveguide structure 252' to the transmission line 206 constituted by the upper dielectric material layer 10f, and is propagated from the waveguide structure 252' to the transmission line 206 constituted by the lower dielectric material layer 10i via the slot hole 257 at the side of the electronic components #A, #C.

In the coupling circuit 207 at the side of the electronic component #B, the waveguide structure 252' receives the electromagnetic wave S', which is to be propagated to the upper layer transmission line 206, and the millimeter wave signal based on the electromagnetic wave S' flows to the microstrip line 251. The millimeter wave signal is input from the microstrip line 251 to the amplifier 208 (see FIG. 10) at the side of the electronic component #B.

In the coupling circuit 207 at the side of the electronic component #D, the waveguide structure 252' receives the electromagnetic wave S', which is to be propagated to the lower layer transmission line 206, and the millimeter wave signal based on the electromagnetic wave S' flows to the microstrip line 251. The millimeter wave signal is input from the microstrip line 251 to the amplifier 228 (see FIG. 10) at the side of the electronic component #D.

When the millimeter wave signal flows in the microstrip line 251 in the coupling circuit 205 at the side of the electronic component #C, the electromagnetic wave S' based on this millimeter wave signal is propagated from the waveguide structure 252' to the transmission line 206 constituted by the lower dielectric material layer 10i, and is propagated from the waveguide structure 252' to the transmission line 206 constituted by the upper dielectric material layer 10f via the slot hole 257 at the side of the electronic components #B, #D. Therefore, the millimeter wave signal flowing in the upper layer microstrip line 251 is input to the amplifier 208 at the side of the electronic component #B, and the millimeter wave signal flowing in the lower layer microstrip line 251 is input to the amplifier 228 at the side of the electronic component #D (see FIG. 10).

Figure 29:
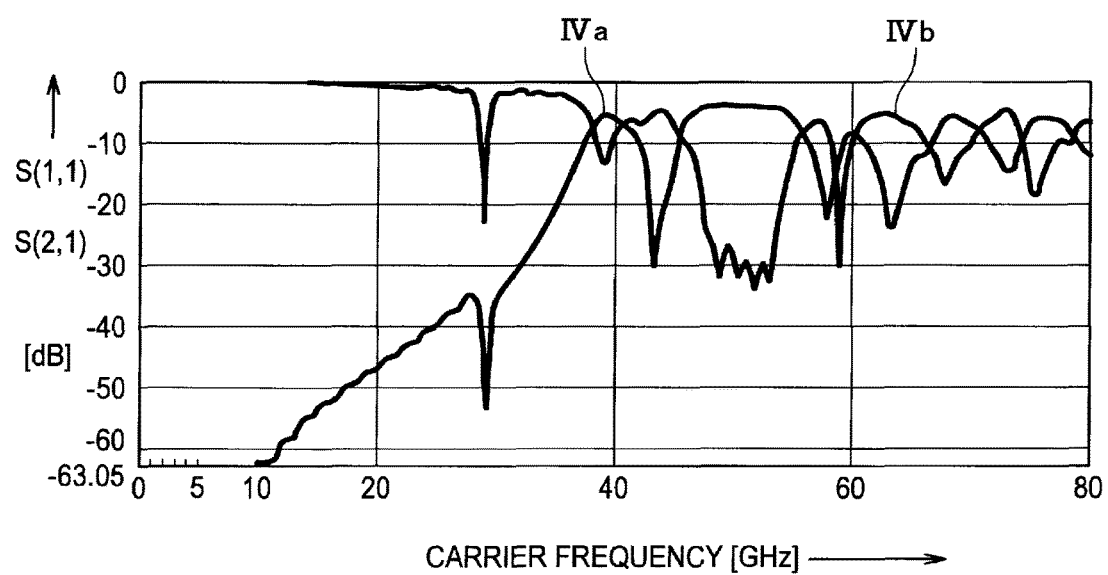
FIG. 29 is a frequency characteristic diagram illustrating an example of reflection characteristic and an example of bandpass characteristic of the high-pass filter device 255' of the millimeter wave transmission device 800.

FIG. 29 is a frequency characteristic diagram illustrating an example of reflection characteristic and an example of bandpass characteristic of the high-pass filter device 255' of the millimeter wave transmission device 800. In FIG. 29, the vertical axis represents bandpass characteristic S (2,1) dB and reflection characteristic S (1,1) dB of the high-pass filter device 255'. The horizontal axis represents carrier frequency (GHz). The unit of the scale is 1 GHz. In the figure, IVa represents an example of bandpass characteristic of the high-pass filter device 255'. In this example of bandpass characteristic, the coupling circuits 205, 207 of the millimeter wave transmission device 800 are respectively constituted by the microstrip line 251 and the waveguide structure 252', the upper layer transmission line 206 is constituted by the dielectric material layer 10f, and the lower layer transmission line 206 is constituted by the dielectric material layer 10i.

The bandpass characteristic S (2,1) dB of the high-pass filter device 255' is bandpass characteristic of the millimeter wave signal transmitted from a CMOS chip 250 at the side of the electronic component #A to a CMOS chip 250' at the side of the electronic component #B (#D) via the high-pass filter device 255' (FR4) whose dielectric constant is 4.9 and whose dielectric loss tangent δ is 0.025. The bandpass characteristic S (2,1) dB represents a case where the carrier frequency is increased from 0 GHz to 80 GHz by 1 GHz. According to this simulation result, video data based on the millimeter wave signal have a bandpass loss of about 4.0 dB between the electronic components #A, #B (#D) when the carrier frequency is in the range of 44.0 GHz to 56 GHz.

In the figure, IVb represents an example of reflection characteristic of the high-pass filter device 255'. The reflection characteristic S (1,1) dB of the high-pass filter device 255' is reflection characteristic of the millimeter wave signal transmitted from the CMOS chip 250 at the side of the electronic component #A to the CMOS chip 250' at the side of the electronic component #B (#D) via the high-pass filter device 255' whose dielectric constant is 4.9 and whose dielectric loss tangent δ is 0.025.

The reflection characteristic S (1,1) dB represents a case where the carrier frequency is increased from 0 GHz to 80 GHz by 1 GHz. According to this simulation result, the reflection loss of 35 dB or more is achieved. Further, the reflection loss is 5 dB or more when the carrier frequency is in the range of 40.0 GHz to 60 GHz.

As the carrier frequency increases, the transmission loss increases but the reflected wave decreases in the high-pass filter device 255' having such a large loss. Therefore, the high-pass filter device 255' can reduce adverse effect of a standing wave caused by the reflected wave. In this example, the frequency converting circuit 203 performs frequency conversion to convert the input signal Sin into the millimeter wave signal S, and the frequency converting circuit 209 performs frequency conversion to convert the millimeter wave signal amplified by the amplifier 208, so that the ratio of (signal band)/(center frequency) can be reduced. Therefore, it is easy to make the signal generation unit 21 for transmitting the millimeter wave signal and the signal generation unit 22 for receiving the millimeter wave signal.

In the millimeter wave transmission device 800 according to the eighth embodiment, the coupling circuit 205 at the side of the electronic components #A, #C and the coupling circuit 207 at the side of the electronic components #B, #D have a multi-layer structure. The slot hole 257 is formed in the interlayer ground layer 10*e*, and is configured to guide the electromagnetic wave S' from the upper dielectric material layer 10*f* to the lower dielectric material layer 10*i* or from the lower dielectric material layer 10*i* to the upper dielectric material layer 10*f*.

Therefore, the upper layer microstrip line 251 and the waveguide structure 252' can be directly connected. The electromagnetic wave S' based on the millimeter wave signal S can be transmitted to the dielectric material layer 10*f*. The lower layer microstrip line 251 and the waveguide structure 252' can be directly connected. The electromagnetic wave S' based on the millimeter wave signal S can be transmitted to the dielectric material layer 10*i*. In addition, the coupling circuit 205 has the two-layer structure. The electromagnetic wave S' can be transmitted to the lower dielectric material layer 10*i* (in the direction of the thickness of the circuit board 10) via the slot hole 257. The electromagnetic wave S' can be propagated to the upper dielectric material layer 10*f* (in the direction of the thickness of the circuit board 10) via the slot hole 257.

The preferred embodiments of the present invention have been described above with reference to the accompanying drawings, whilst the present invention is not limited to the above examples, of course. A person skilled in the art may find various alternations and modifications within the scope of the appended claims, and it should be understood that they will naturally come under the technical scope of the present invention.

The invention set forth in claims is not limited by the above embodiments. All of the combinations of the features explained in the embodiments are not absolutely necessary for the solution means of the invention. The above embodiments include various stages of the invention, from which various kinds of inventions can be extracted using an appropriate combination of a plurality of disclosed constituent elements. Even when some of the constituent elements are deleted from all the constituent elements of the embodiments, a constitution from which some of the constituent elements are deleted may be extracted as the invention as long as the effects can be obtained.

In the mechanism of the embodiments, for example, members at the transmission side and the reception side relating to the millimeter wave transmission are mounted on the same circuit board, and the circuit board is configured to be also used as the tangible object serving as the millimeter wave transmission path. Since the electromagnetic wave between the transmission and the reception based on the millimeter wave signal is transmitted while being shielded within the circuit board, the signal in the millimeter wave band can be transmitted within the electronic apparatus with a lower degree of interference and without any inconvenience.

This is particularly effective when the dielectric loss tangent of the dielectric material constituting the circuit board also used as the tangible object serving as the millimeter wave transmission path is relatively large.

In other words, according to the millimeter wave transmission device and the millimeter wave transmission method explained in the embodiments, the millimeter wave signal provided from one end of the tangible object made of the dielectric material (tangible object having the predetermined dielectric constant $\in$) is received from the other end of the tangible object, and the millimeter wave signal is processed to generate the output signal.

In the tangible object having a large loss and having a relatively large dielectric loss tangent of the dielectric material, the transmission loss increases but the reflected wave is attenuated as the carrier frequency increases. Therefore, an extremely high-speed signal can be transmitted via the tangible object made of the dielectric material having a large loss. In addition, high-speed communication processing can be achieved with only the limited range of the tangible object. In ranges other than the limited range of the tangible object made of the dielectric material, the attenuation is large, which can greatly reduce interference with those outside of the tangible object.

According to the millimeter wave transmission system explained in the above embodiments, the millimeter wave transmission device and the millimeter wave transmission method explained in the above embodiments are arranged, and the millimeter wave signal provided from one end of the tangible object made of the dielectric material (tangible object having the predetermined dielectric constant) is received from the other end of the tangible object, and the millimeter wave signal is processed to generate the output signal.

According to this configuration, in the tangible object having a large loss, the transmission loss increases but the reflected wave is attenuated as the carrier frequency increases. Therefore, an extremely high-speed signal can be transmitted via the tangible object made of the dielectric material having a large loss. In addition, a high-speed baseband signal and the like can be transmitted, and therefore, high-speed bidirectional communication processing can be achieved with only the limited range of the tangible object. In ranges other than the limited range of the tangible object made of the dielectric material, the attenuation is large, which can greatly reduce interference with those outside of the tangible object.

In the embodiments, the tangible object (tangible object made of the dielectric material) having the predetermined dielectric constant $\in$ has been explained about the circuit board 10 made of glass epoxy resin. However, the tangible object made of a dielectric material is not limited thereto. The inventors of the present application have confirmed that tangible objects made of dielectric material such as a light-gathering sheet and a conducting/insulating sheet made of acrylic and polyethylene resin, an acrylic stick and an acrylic plate, a ballpoint pen in which an ink containing tube and a ballpoint pen body (tube) is made of polyethylene synthetic resin such as polyethylene and polyethylene terephthalate also function as the transmission line for the millimeter wave. The dielectric loss tangent $\delta$ of the acrylic and polyethylene resin is generally close to a dielectric loss tangent $\delta$ of glass epoxy resin. Therefore, the circuit board 10 explained in the embodiments is not limited to glass epoxy resin, and may be acrylic and polyethylene resin.

In the explanation of the above embodiments, the dielectric loss tangent $\delta$ in the used frequency band is considered to be two levels of magnitudes, i.e., a dielectric loss tangent δ of about 0.001 or less and a dielectric loss tangent δ of about 0.01 or more. However, the above levels are merely examples. An example of a dielectric material having a dielectric loss tangent δ in between these two levels, i.e., a tangent δ of about 0.01 to 0.001, includes a BT resin (tan δ is about 0.004) (see the document 1 below). The dielectric material having a tangent δ of about 0.01 to 0.001 is referred to as having "a moderate loss". For example, a material having "a moderate loss" using the BT resin has characteristic in between the material having "large loss" and the material having "small loss" explained in the above embodiments.

Reference document 1: "high frequency BT resin glass cloth base copper-clad lamination", [online], [searched on Sep. 2, 2009], the Internet <URL:http://www.tripleone.net/ENG/img_business/1_2_LX67.pdf>

It should be noted that linearlity is not necessary for the transmission lines 206, 226 and the like. An electromagnetic wave is known to be propagated even in transmission lines 206, 226 bent 90 degrees (for example, see FIGS. 12A, 15 and the like).

The mechanism of the present embodiment is extremely suitable for an apparatus in a millimeter wave circuit board, a millimeter wave transmission method, a millimeter wave transmission system, and the like, for transmitting a millimeter wave signal whose carrier frequency is 30 GHz to 300 GHz at a high speed to carry movie images, computer images, and the like.

As can be understood from the explanation about the embodiments, an aspect of the present embodiment enables execution of high-speed communication processing in the limited range of the tangible object made of the dielectric material, and reduces interference with ranges other than the limited range of the tangible object.

The mechanisms of the millimeter wave tangible object transmission device, the millimeter wave transmission method, and the millimeter wave transmission system according to the embodiments are applied to, for example, apparatuses and systems for transmitting a millimeter wave signal whose carrier frequency is 30 GHz to 300 GHz at a high speed to carry movie images, computer images, and the like. The millimeter wave signal transmitted from one end of the tangible object made of the dielectric material is received from the other end of the tangible object, and the millimeter wave signal is processed to generate the output signal. The signal can be transmitted at a high speed via the tangible object, and interference with regions outside of the tangible object is reduced.

REFERENCE SIGNS LIST 10 circuit board made of glass epoxy resin
11, 12 antenna member
21-28 signal generation unit
100, 400, 500, 600, 700, 800 the millimeter wave transmission device
201, 221, 301, 421, 401, 421, 501 signal input terminal
202, 222, 302, 322, 402, 412, 422, 502 modulating circuit
203, 223, 303, 323, 403, 413, 423, 503 frequency converting circuit
204, 304, 404, 504 amplifier
205, 207, 227, 305, 307, 327, 405, 407, 505 the coupling circuit for coupling with the circuit board
206, 226, 306, 326, 406, 432, 506 transmission line
208, 228, 308, 328, 404, 408, 414, 424, 508 amplifier
209, 223, 309, 323, 403, 409, 413, 423 frequency converting circuit
210, 230, 310, 330, 410, 510 demodulating circuit
211, 311, 411, 511 signal output terminal
250, 250', 259 CMOS chip
251 microstrip line
252, 252' waveguide structure
253 waveguide top panel portion
254 wiring pattern
255, 255' high-pass filter device
256 antenna structure
256' antenna member
257, 260 slot hole
341 waveguide structure
431 adder circuit
200, 300 millimeter wave transmission systems

The invention claimed is:

1. A millimeter wave transmission device comprising: a circuit board comprising a base made of a dielectric material and a wiring layer with a conductive portion on a major surface of the base, the circuit board including a millimeter wave transmission path structure in the base that provides a millimeter wave transmission path;
   a first unit on the wiring layer at a first end of the millimeter wave transmission path, the first unit comprised of a modulating circuit, and a first coupling circuit, and a first frequency converting unit between the modulating circuit and the first signal coupling circuit; and
   a second unit on the wiring layer at a second end of the millimeter wave transmission path, the second unit comprising a demodulating unit, a second coupling circuit, and a second frequency converting circuit between the demodulating unit and the second signal coupling circuit wherein,
   each of the first and second coupling circuits is in millimeter wave communication with the millimeter wave transmission path.

2. The millimeter wave transmission device according to claim 1,
   wherein each of the first signal coupling circuit and the second signal coupling circuit includes an antenna.

3. The millimeter wave transmission device according to claim 2, wherein the antenna member of the second signal coupling circuit can receive an electromagnetic wave based on a millimeter wave signal transmitted within the millimeter waver transmission path by the antenna of the first signal coupling circuit.

4. The millimeter wave transmission device according to claim 2, comprising:
   a first electronic component including the first unit; and
   a second electronic component including the second signal coupling unit,
   wherein the first electronic component and the second electronic component are mounted on the same circuit board.

5. The millimeter wave transmission device according to claim 2, wherein an electronic component used for signal processing in baseband region of the input signal and the output signal is mounted on the circuit board between a first region of the circuit board including the first signal generation unit and the first signal coupling unit and a second region of the circuit board including the second signal generation unit and the second signal coupling unit.

6. The millimeter wave transmission device according to claim 1, wherein the first unit includes a modulating circuit for modulating the input signal and a first frequency converting circuit for performing frequency conversion on the signal modulated by the modulating circuit and generating the millimeter wave signal, and the second signal generation unit includes a second frequency converting circuit for performing frequency conversion on the millimeter wave signal and a demodulating circuit for demodulating the signal output from the second frequency converting circuit and generating the output signal.

7. The millimeter wave transmission device according to claim 6, wherein each of the first unit and the second unit has an amplifier for amplifying a millimeter wave signal.

8. The millimeter wave transmission device according to claim 7, further comprising:
   a signal quality determination circuit for determining a signal quality by monitoring the output signal provided by the demodulating circuit;
   a direct current or low frequency transmission line for transmitting a quality determination signal output from the signal quality determination circuit; and
   a gain control circuit for controlling a gain of the amplifier of the second unit based on the quality determination signal transmitted via the direct current or low frequency transmission line.

9. The millimeter wave transmission device according to claim 1, wherein a millimeter wave signal transmitted via the millimeter wave transmission path is shielded within the millimeter waver transmission path.

10. The millimeter wave transmission device according to claim 9, wherein the millimeter waver transmission path structure includes a plurality of hollow cylindrical opening portions penetrating through the circuit board or a plurality of cylindrical conductive members connecting conductive portions on opposite surfaces of the base.

11. The millimeter wave transmission device according to claim 1, wherein dielectric materials is a glass epoxy resin, an acrylic resin, a polyethylene resin, or a combination of them.

12. A millimeter wave transmission method, using the millimeter wave transmission device of claim 1, wherein the millimeter wave transmission method comprises the steps of:
   causing the first unit to generate the millimeter wave signal by performing frequency conversion on t4ae-an input signal to be transmitted;
   transmitting the millimeter wave signal to the second end of the millimeter wave transmission path,
   receiving the millimeter wave signal with the second unit; and causing the unit to demodulate the received millimeter wave signal and generating an output signal corresponding to the input signal.

13. The millimeter wave transmission method according to claim 12, wherein when the millimeter wave signal is generated, the method includes the steps of:
   modulating the input signal; and
   performing frequency conversion on the modulated signal, and when the output signal is generated, the method includes the steps of:
   performing frequency conversion on the received millimeter wave signal; and
   demodulating the signal having been subjected to the frequency conversion, and generating the output signal.

14. A millimeter wave transmission system comprising:
   a circuit board comprising a base made of a dielectric material and a wiring layer with a conductive portion on a major surface of the base, the circuit board including a first millimeter wave transmission path structure in the base that provides a first millimeter wave transmission path, the circuit board including a second millimeter wave transmission path structure in the base that provides a second millimeter wave transmission path;
   a first millimeter wave transmission body on the wiring layer, the first millimeter wave transmission body including a first signal generation unit for generating a millimeter wave signal by performing frequency conversion on a first input signal to be transmitted, a second signal generation unit for demodulating the received millimeter wave signal and generating a first output signal corresponding to the first input signal to be transmitted, the first signal generation unit and the second signal generation unit located at opposite ends of the first millimeter wave transmission path;
   a second millimeter wave transmission body on the wiring layer, the second millimeter wave transmission body including a third signal generation unit for generating a millimeter wave signal by performing frequency conversion on a second input signal to be transmitted, a fourth signal generation unit for demodulating the received millimeter wave signal and generating a second output signal corresponding to the second input signal to be transmitted, the third signal generation unit and the fourth signal generation unit located on opposite ends of the second millimeter wave transmission path; and
   a coupling medium in the circuit board connecting the first and second millimeter wave transmission paths so that an electromagnetic wave can propagate between them.

15. The millimeter wave transmission system according to claim 14, wherein:
   the coupling medium is in the circuit board base.

16. The millimeter wave transmission system according to claim 14, wherein the coupling medium includes a dielectric material different from that of the base of the circuit board.

17. The millimeter wave transmission system according to claim 14, wherein the coupling medium is constituted by a waveguide structure for propagating the electromagnetic wave.

18. The millimeter wave transmission system according to claim 14, comprising:
   a plurality of first millimeter wave transmission bodies; and
   an adder circuit for adding millimeter wave signals generated by the plurality of first millimeter wave transmission bodies.

19. The millimeter wave transmission system according to claim 14, wherein:
   an electronic component used for signal processing in a baseband region of the input signal and the output signal is mounted on the circuit board between a first region of the circuit board including the first millimeter wave transmission body and a second region of the circuit board including the second millimeter wave transmission body.

* * * * *